(12) United States Patent
Fukuzumi et al.

(10) Patent No.: US 11,744,075 B2
(45) Date of Patent: *Aug. 29, 2023

(54) SEMICONDUCTOR MEMORY DEVICE AND METHOD FOR MANUFACTURING THE SAME

(71) Applicant: Kioxia Corporation, Minato-ku (JP)

(72) Inventors: Yoshiaki Fukuzumi, Yokkaichi (JP); Shinya Arai, Yokkaichi (JP); Masaki Tsuji, Yokkaichi (JP); Hideaki Aochi, Yokkaichi (JP); Hiroyasu Tanaka, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/672,819

(22) Filed: Feb. 16, 2022

(65) Prior Publication Data

US 2022/0173124 A1 Jun. 2, 2022

Related U.S. Application Data

(63) Continuation of application No. 17/335,214, filed on Jun. 1, 2021, now Pat. No. 11,296,114, which is a
(Continued)

(30) Foreign Application Priority Data

Feb. 6, 2014 (JP) .................................. 2014-021747

(51) Int. Cl.
*H10B 43/27* (2023.01)
*H01L 29/66* (2006.01)
(Continued)

(52) U.S. Cl.
CPC ....... *H10B 43/27* (2023.02); *H01L 29/42344* (2013.01); *H01L 29/66833* (2013.01);
(Continued)

(58) Field of Classification Search
CPC ......... H01L 27/11582; H01L 27/11565; H01L 27/11575; H01L 29/42344;
(Continued)

(56) References Cited

U.S. PATENT DOCUMENTS 7,821,058 B2 10/2010 Kidoh et al.
7,936,004 B2 5/2011 Kito et al.
(Continued)

FOREIGN PATENT DOCUMENTS

| CN | 102037557 A | 4/2011 |
|---|---|---|
| TW | 201027720 A1 | 7/2010 |
| TW | 201442082 A | 11/2014 |

OTHER PUBLICATIONS

Combined Taiwanese Office Action and Search Report dated May 10, 2016 in Patent Application No. 104104135 (with English language translation and English translation of categories of cited documents).

*Primary Examiner* — Allison Bernstein
(74) *Attorney, Agent, or Firm* — Oblon, McClelland, Maier & Neustadt, L.L.P.

(57) ABSTRACT

A semiconductor memory device includes a connecting member including a semiconductor material, a first electrode film, a first insulating film, a stacked body and three or more semiconductor pillars. The stacked body includes second electrode films and second insulating films that alternately stacked. The semiconductor pillars are arrayed along two or more directions, extend in a stacking direction, pierce through the stacked body and the first insulating film, and are connected to the connecting member. The device includes a third insulating film provided between the semiconductor pillars and the stacked body and between the connecting member and the first electrode film. A charge
(Continued)

storage layer is provided at least between one of the second electrode films and the third insulating film.

20 Claims, 35 Drawing Sheets

Related U.S. Application Data continuation of application No. 16/918,005, filed on Jul. 1, 2020, now Pat. No. 11,063,064, which is a continuation of application No. 16/596,892, filed on Oct. 9, 2019, now Pat. No. 10,741,583, which is a continuation of application No. 16/138,619, filed on Sep. 21, 2018, now Pat. No. 10,497,717, which is a continuation of application No. 15/345,790, filed on Nov. 8, 2016, now Pat. No. 10,115,733, which is a continuation of application No. 14/614,588, filed on Feb. 5, 2015, now Pat. No. 9,520,407.

(51) Int. Cl.
*H01L 29/792* (2006.01)
*H10B 43/10* (2023.01)
*H10B 43/50* (2023.01)
*H01L 29/423* (2006.01)

(52) U.S. Cl.
CPC ......... *H01L 29/7926* (2013.01); *H10B 43/10* (2023.02); *H10B 43/50* (2023.02)

(58) Field of Classification Search
CPC ........... H01L 29/66833; H01L 29/7926; H01L 27/11563; H01L 27/11578; H01L 27/1158; H10B 43/27; H10B 43/10; H10B 43/50
See application file for complete search history.

(56) References Cited

U.S. PATENT DOCUMENTS

| | | | |
|---|---|---|---|
| 7,982,261 | B2 | 7/2011 | Kidoh |
| 7,983,084 | B2 | 7/2011 | Tokiwa |
| 8,198,670 | B2 | 6/2012 | Aoyama |
| 8,551,838 | B2 | 10/2013 | Kito et al. |
| 8,644,046 | B2 | 2/2014 | Seol et al. |
| 11,482,537 | B2 * | 10/2022 | Tsuji ................ H01L 27/11578 |
| 2010/0207195 | A1 | 8/2010 | Fukuzumi et al. |
| 2011/0002172 | A1 | 1/2011 | Kito |
| 2011/0220987 | A1 | 9/2011 | Tanaka et al. |
| 2011/0249498 | A1 | 10/2011 | Tokiwa et al. |
| 2011/0284947 | A1 | 11/2011 | Kito et al. |
| 2011/0316069 | A1 | 12/2011 | Tanaka et al. |
| 2012/0008400 | A1 | 1/2012 | Fukuzumi et al. |
| 2013/0003433 | A1 | 1/2013 | Hishida et al. |
| 2013/0062681 | A1 | 3/2013 | Fujiki et al. |
| 2013/0062683 | A1 | 3/2013 | Fukuzumi et al. |
| 2013/0113080 | A1 | 5/2013 | Hioka et al. |
| 2013/0126961 | A1 | 5/2013 | Fukuzumi et al. |
| 2015/0206896 | A1 | 7/2015 | Chen |
| 2016/0064406 | A1 | 3/2016 | Natori |
| 2016/0071873 | A1 | 3/2016 | Tsuji |
| 2016/0071879 | A1 | 3/2016 | Seol et al. |

* cited by examiner

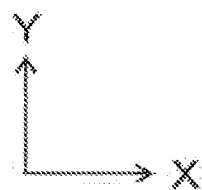
FIG. 3A
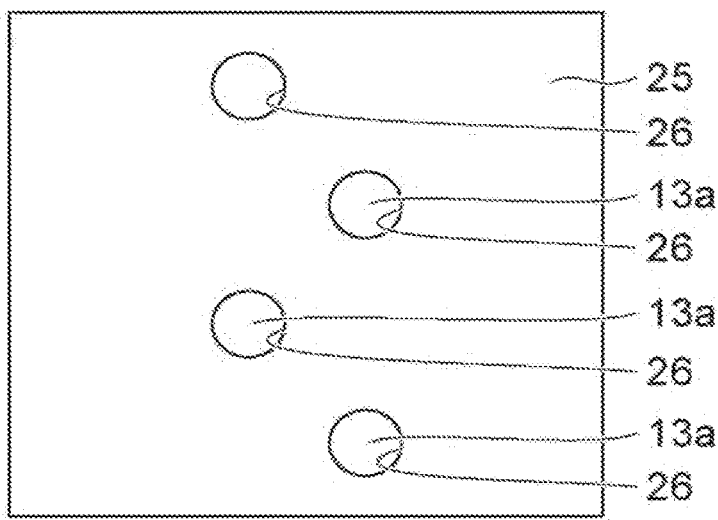
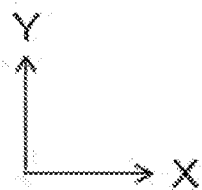
FIG. 3B
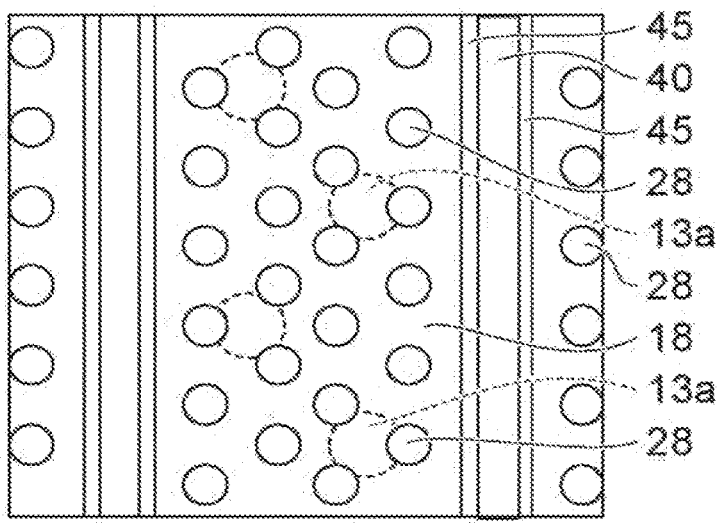
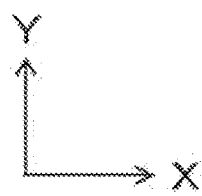
FIG. 3C
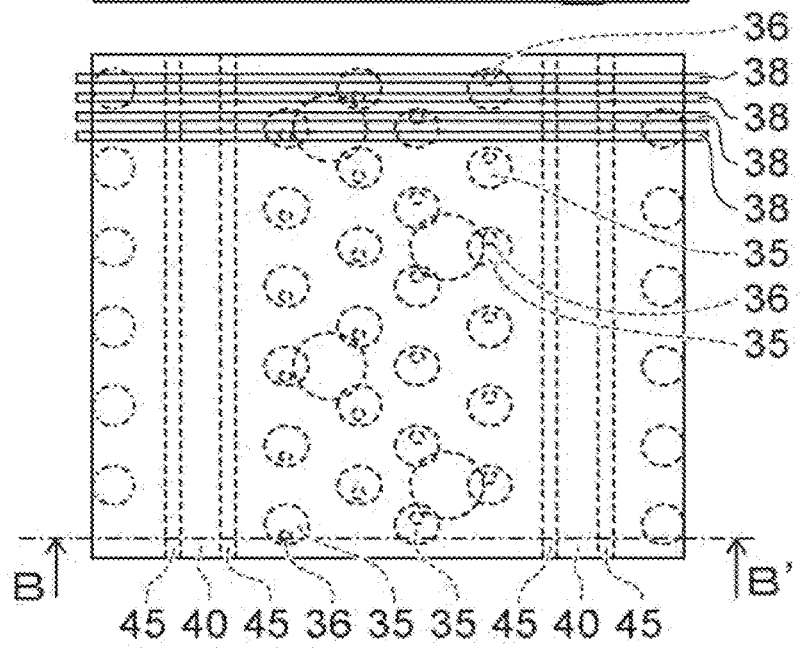

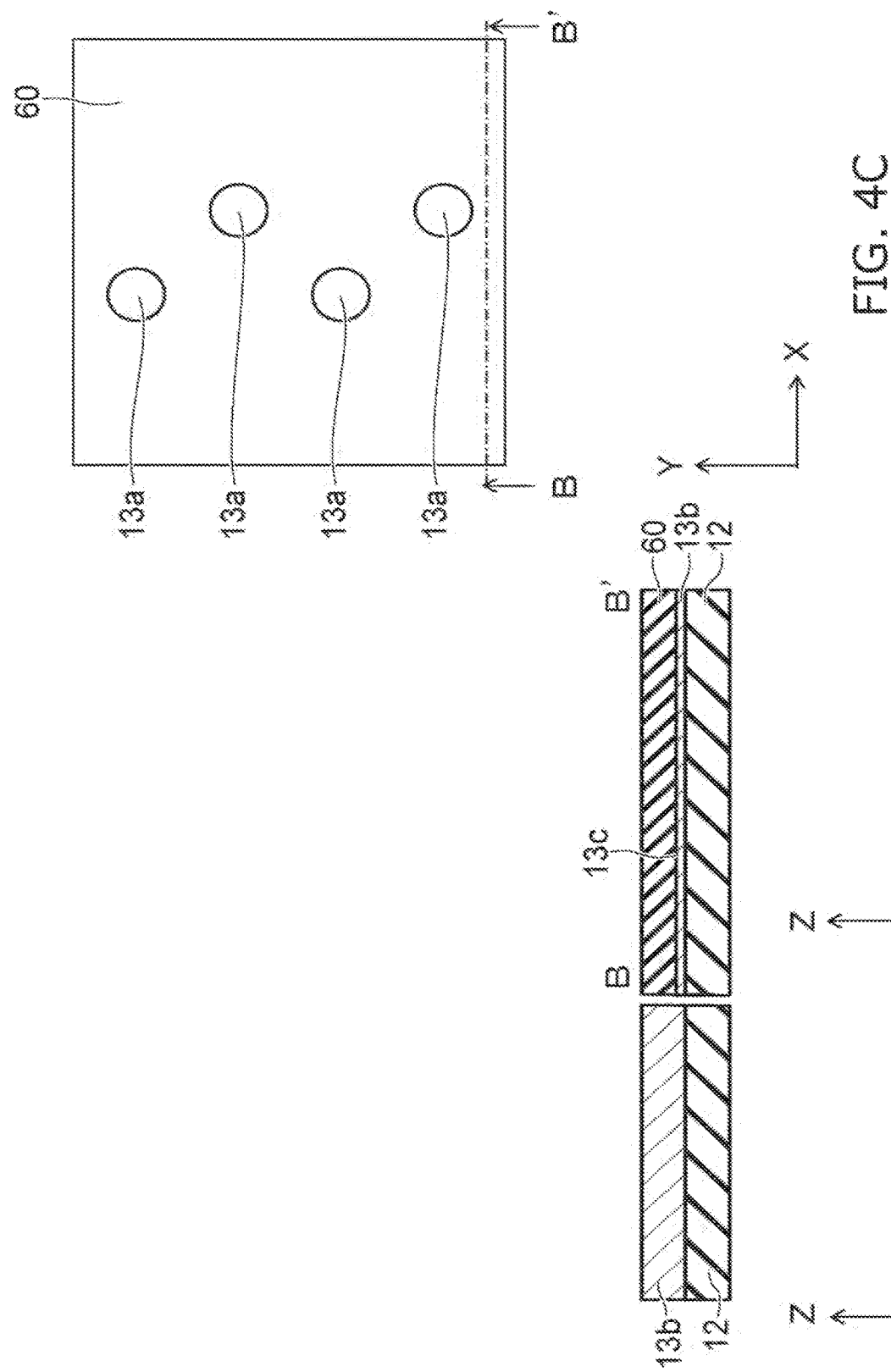

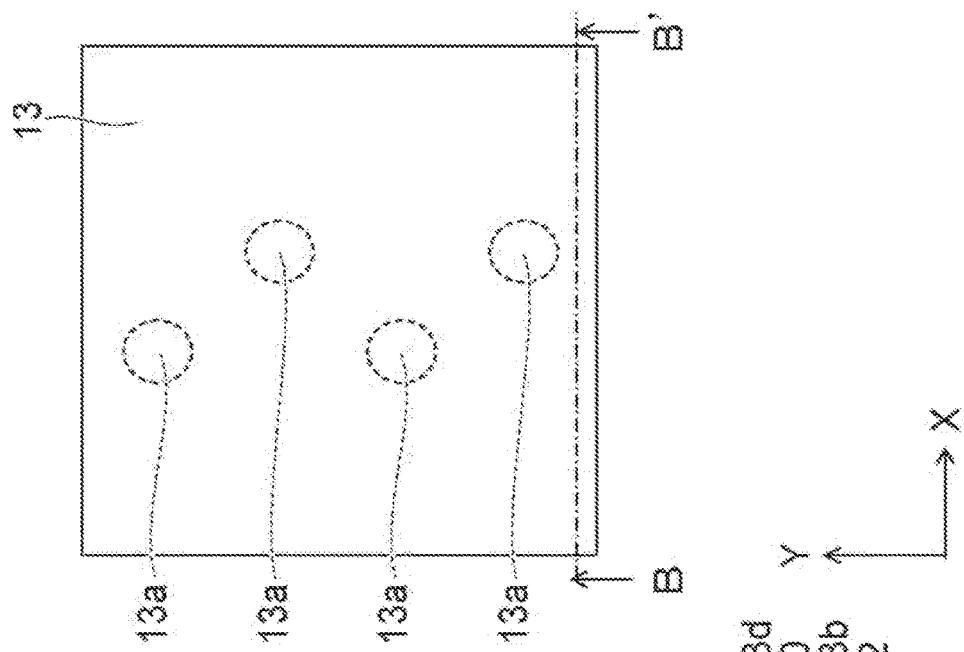
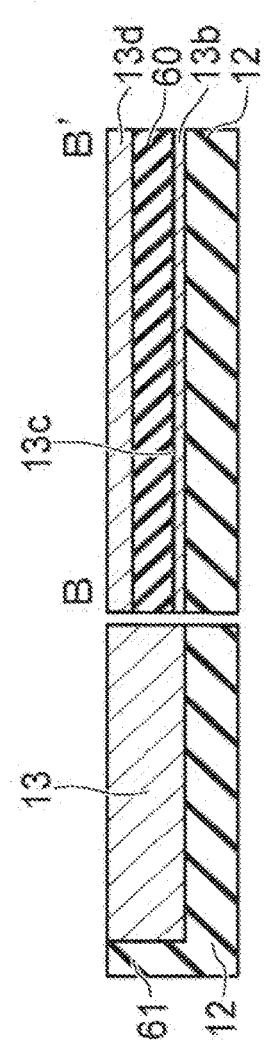

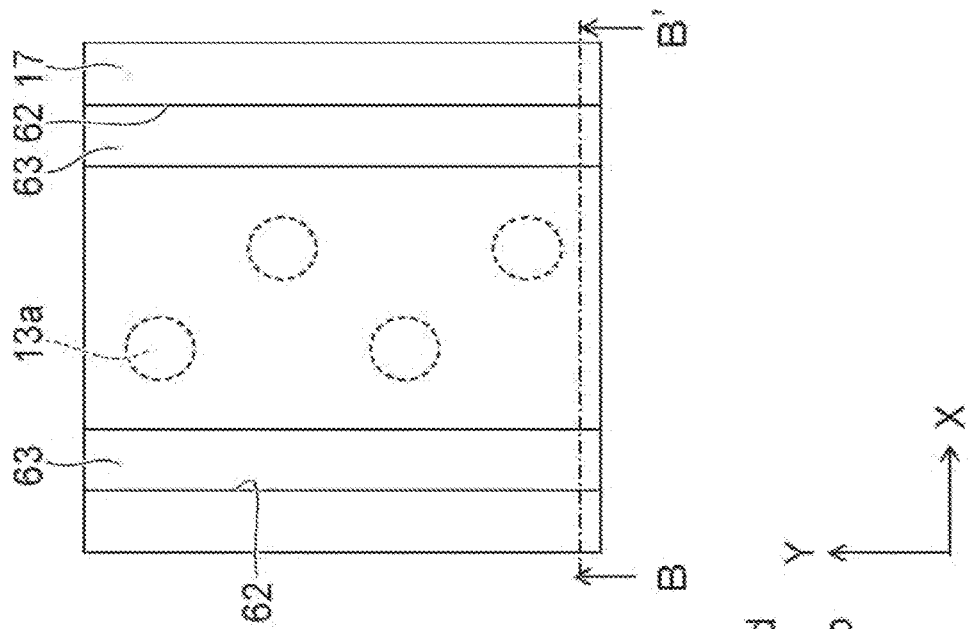
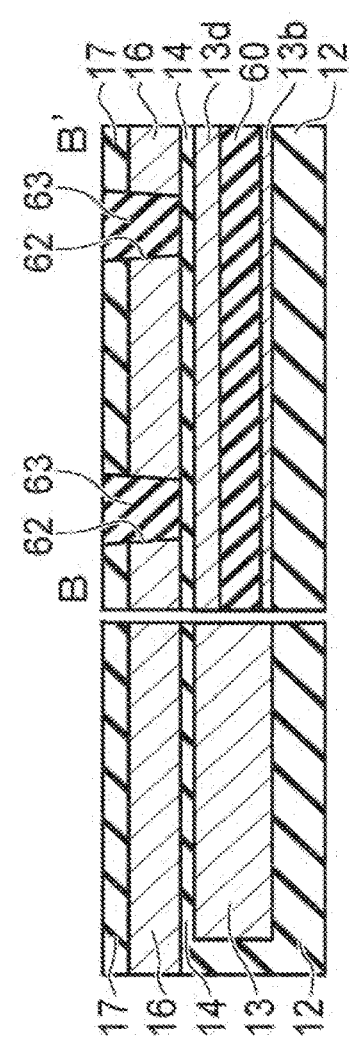
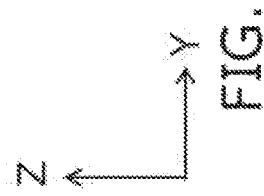

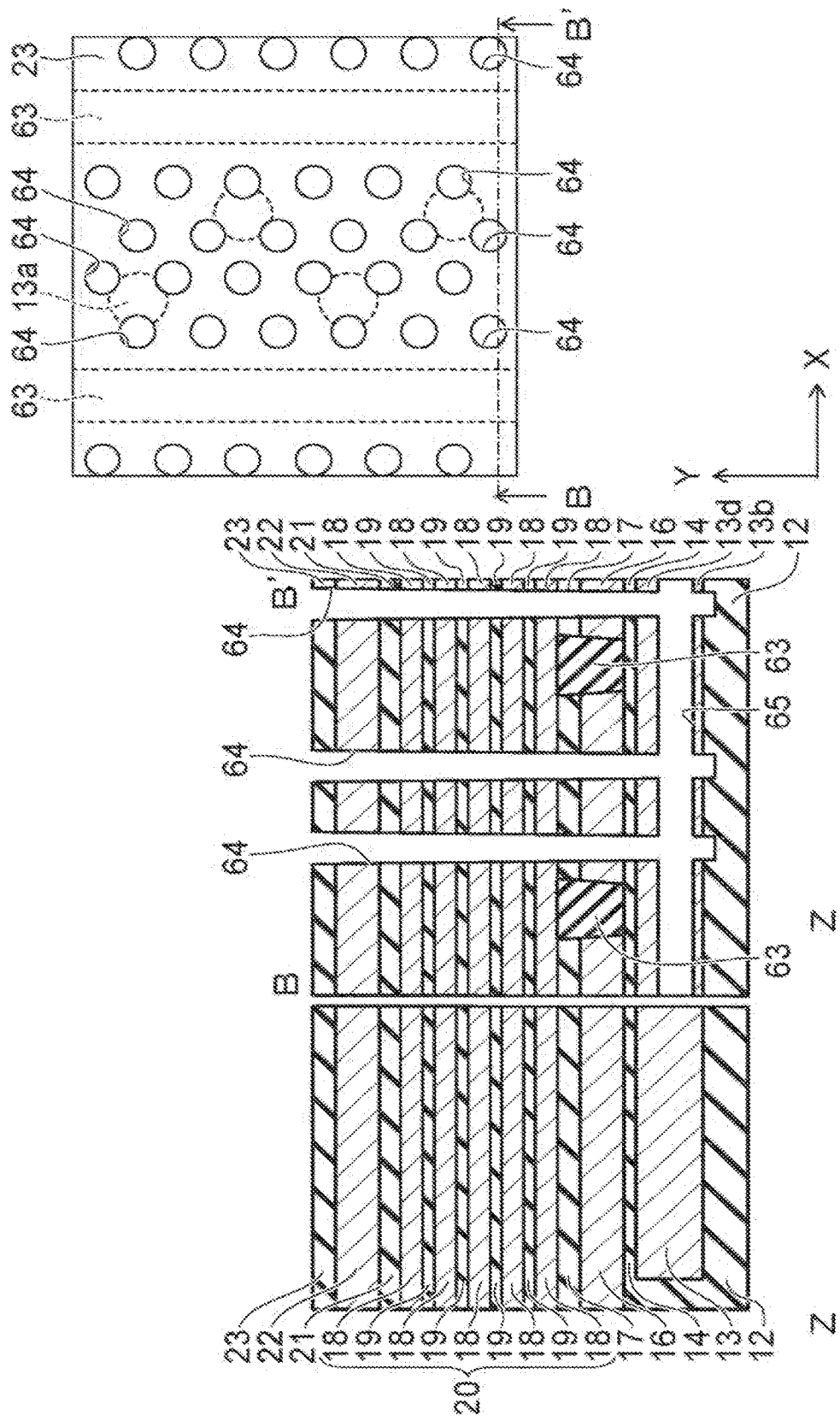

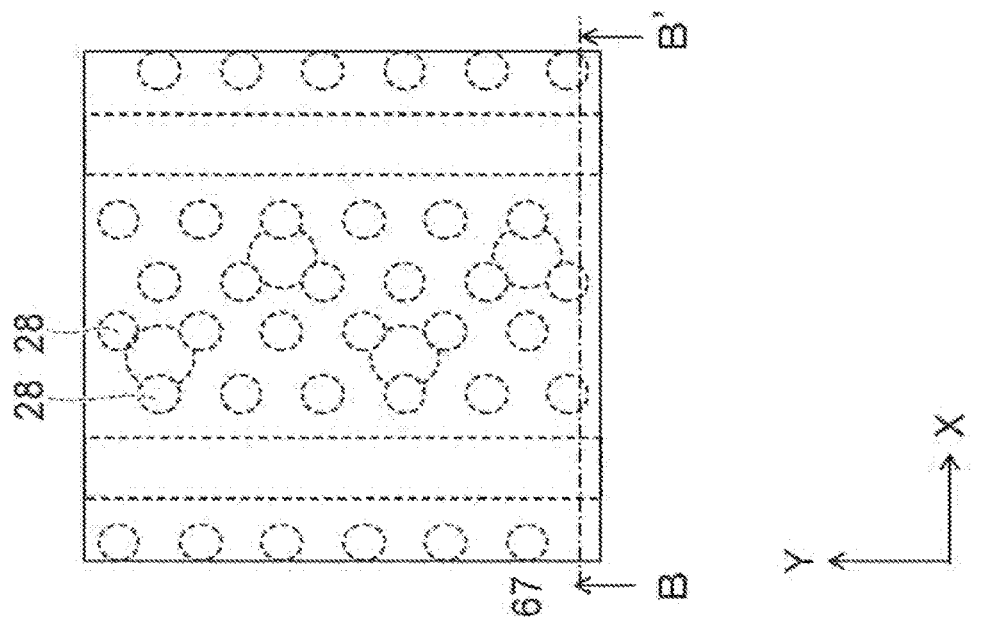
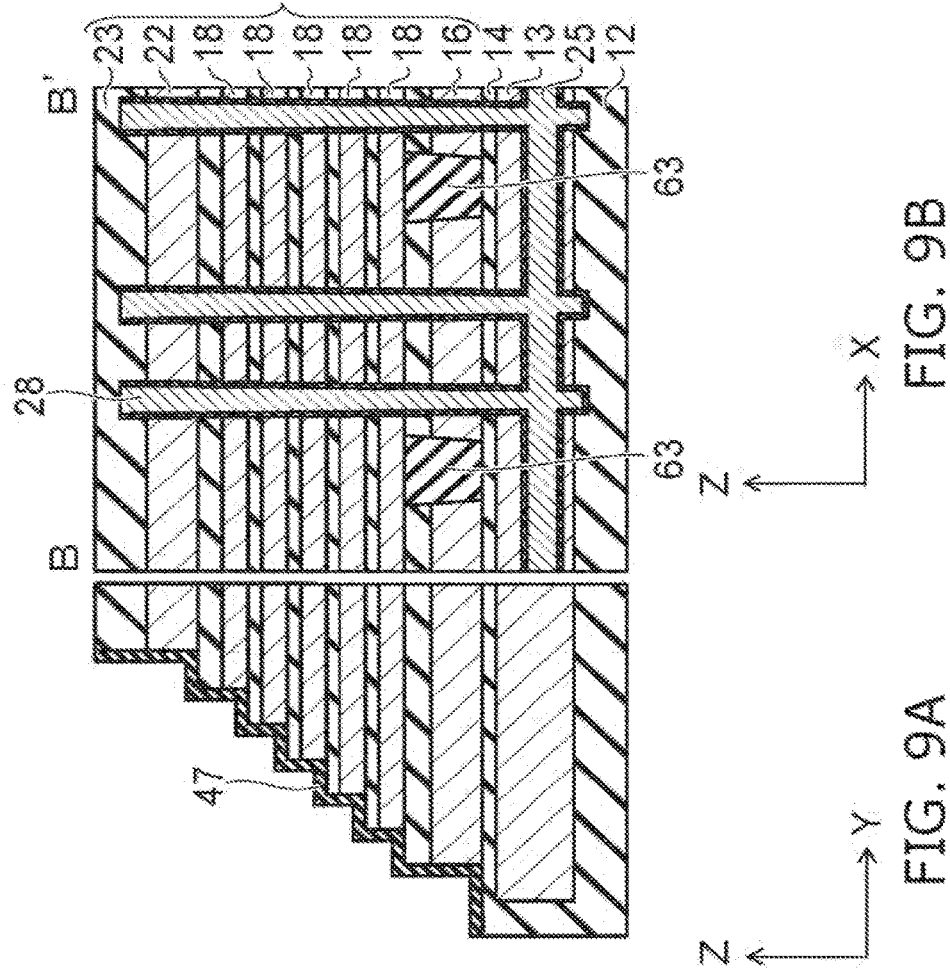
FIG. 9C
FIG. 9B
FIG. 9A

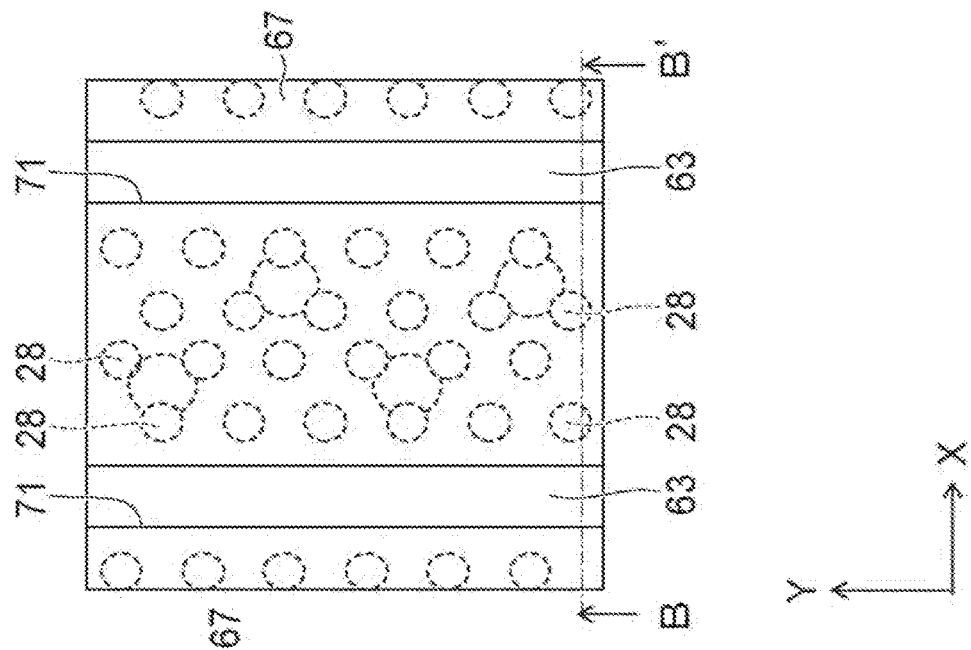
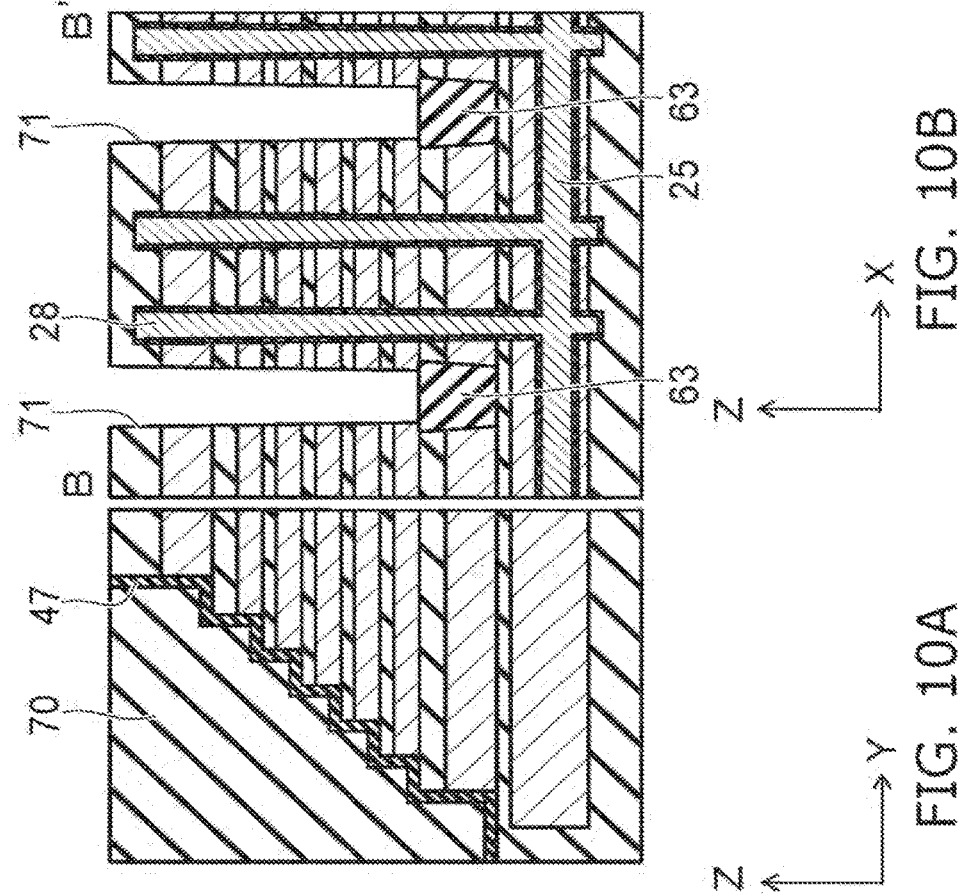
FIG. 10C
FIG. 10B
FIG. 10A

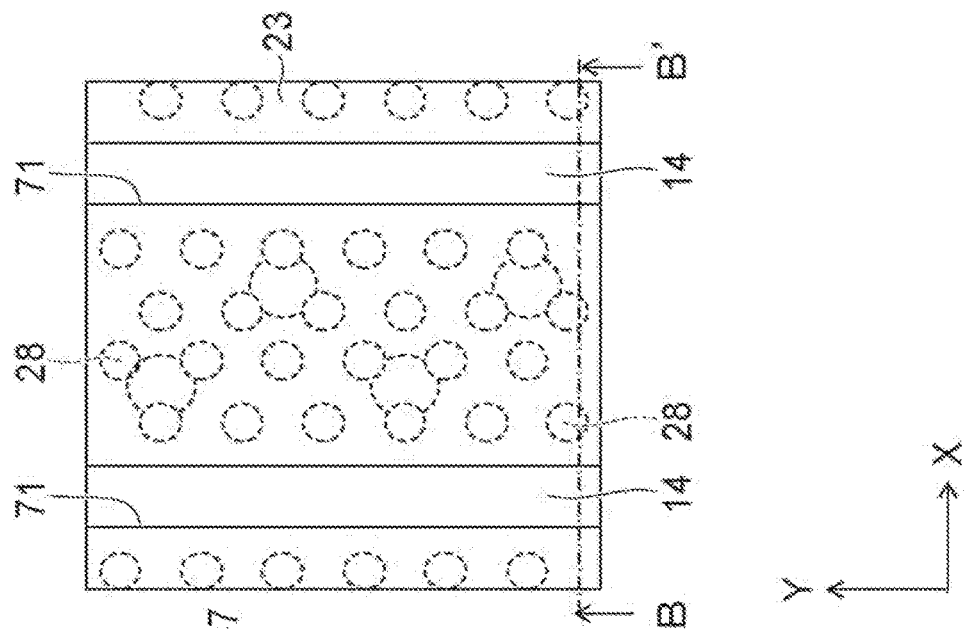
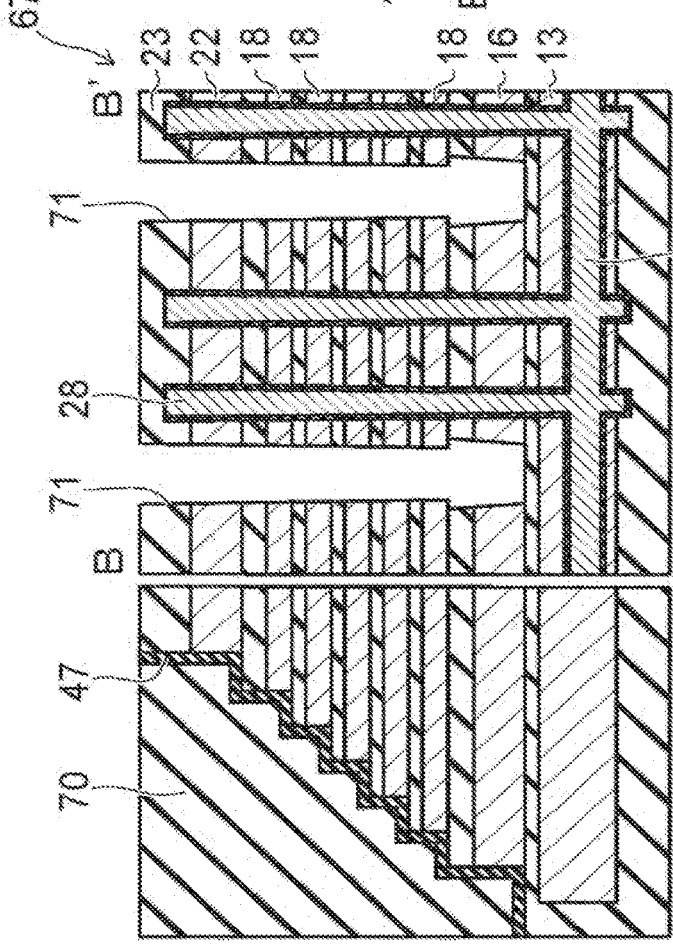
FIG. 11A   FIG. 11B   FIG. 11C

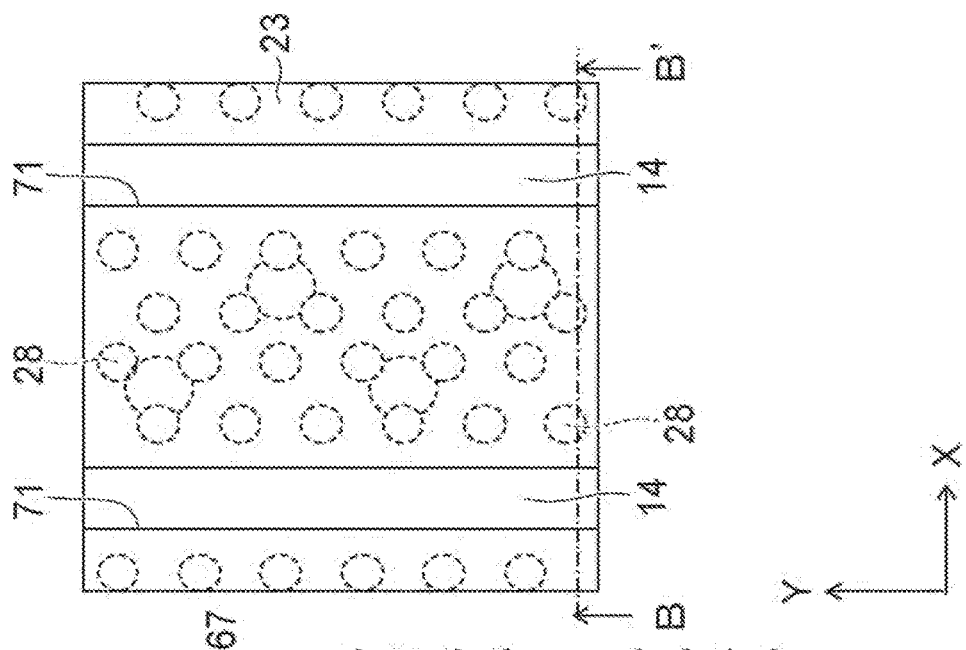
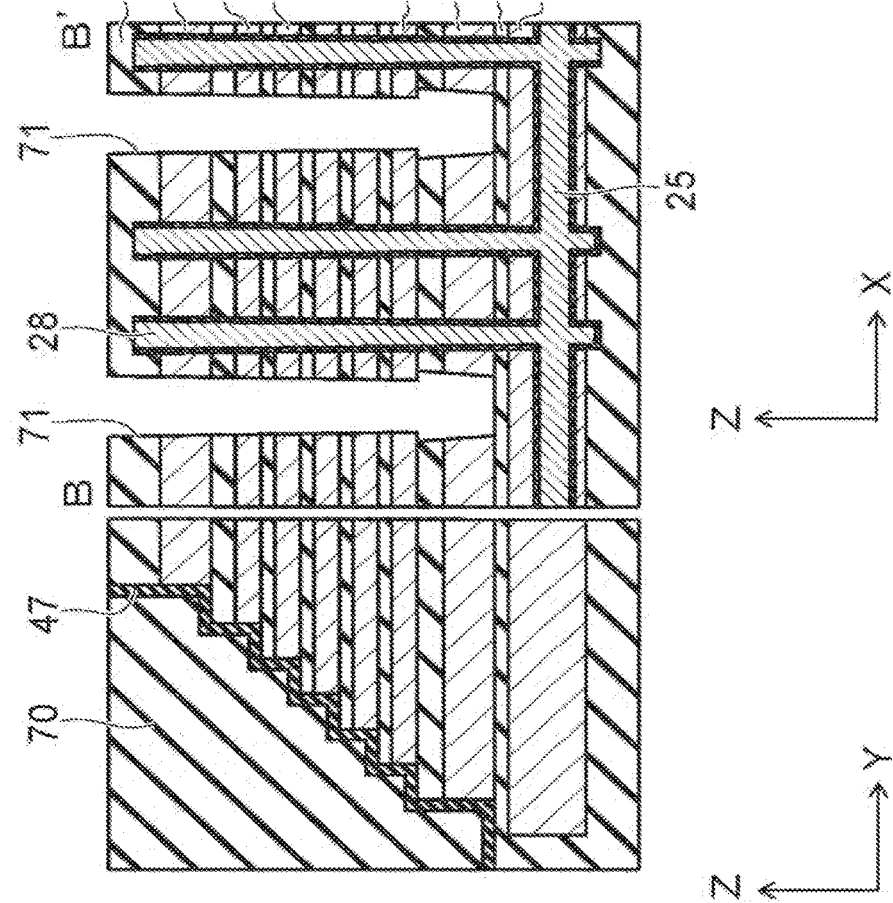
FIG. 12A  FIG. 12B  FIG. 12C

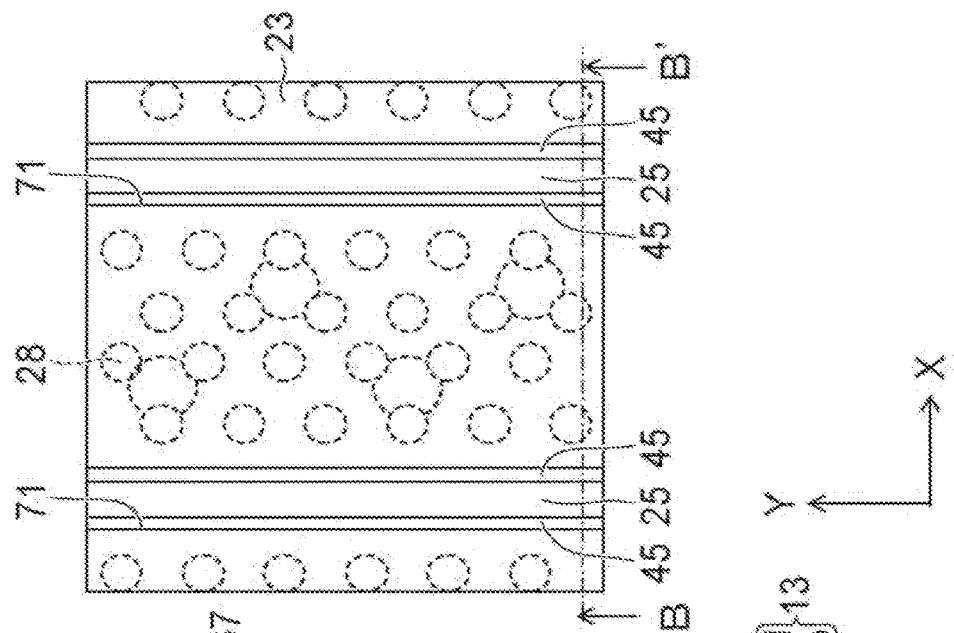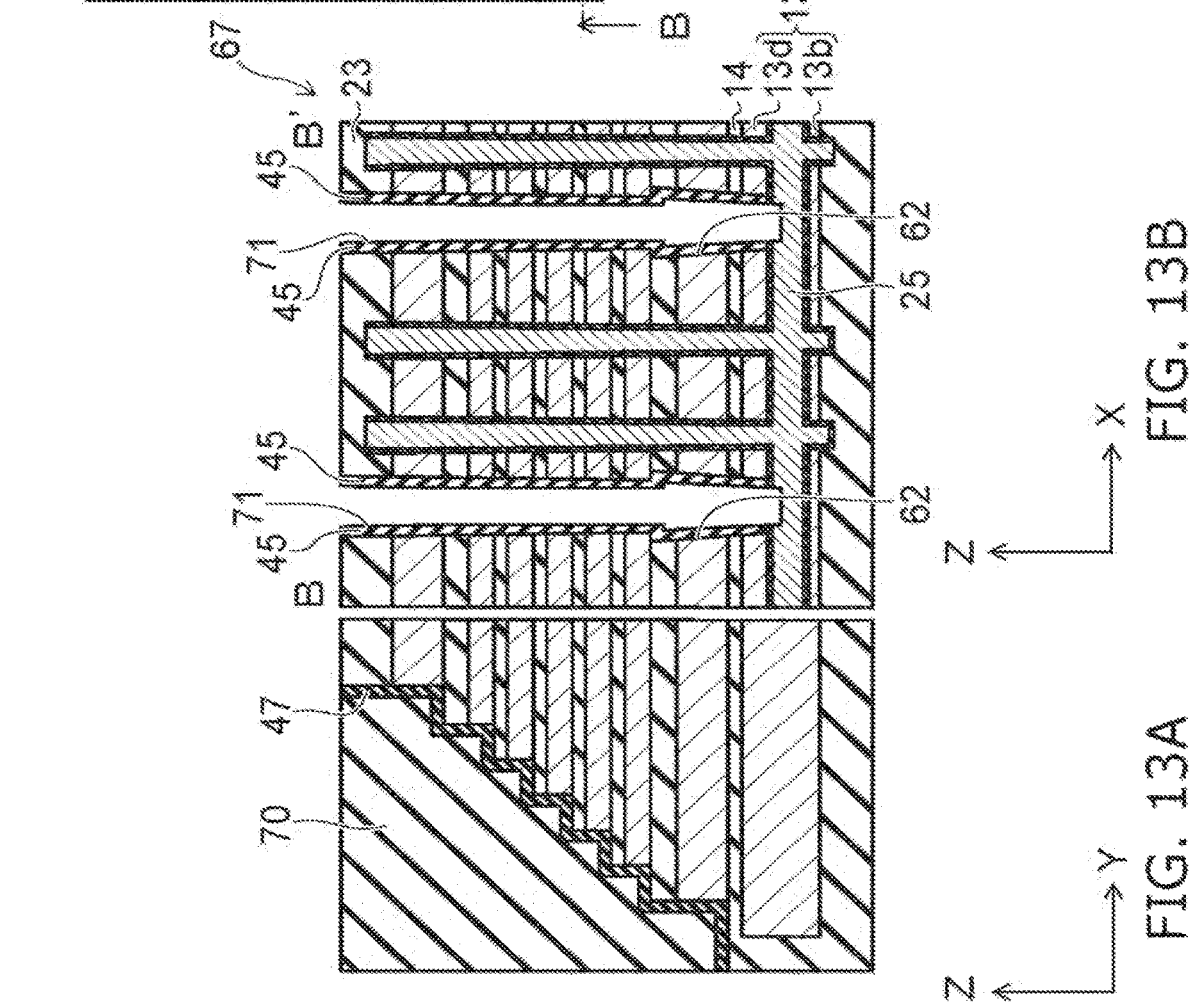
FIG. 13A  FIG. 13B  FIG. 13C

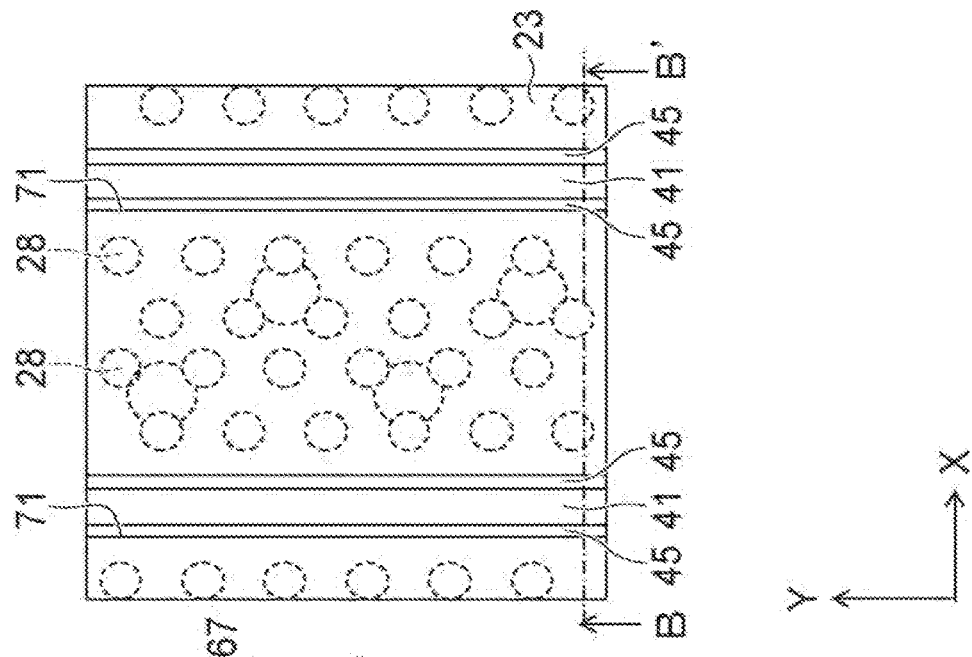
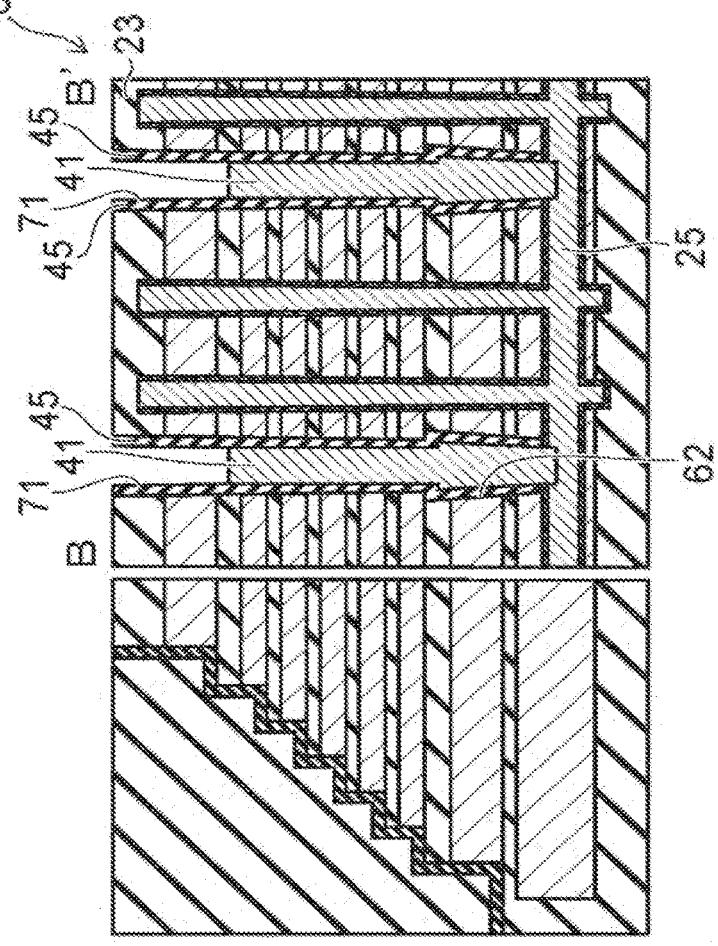

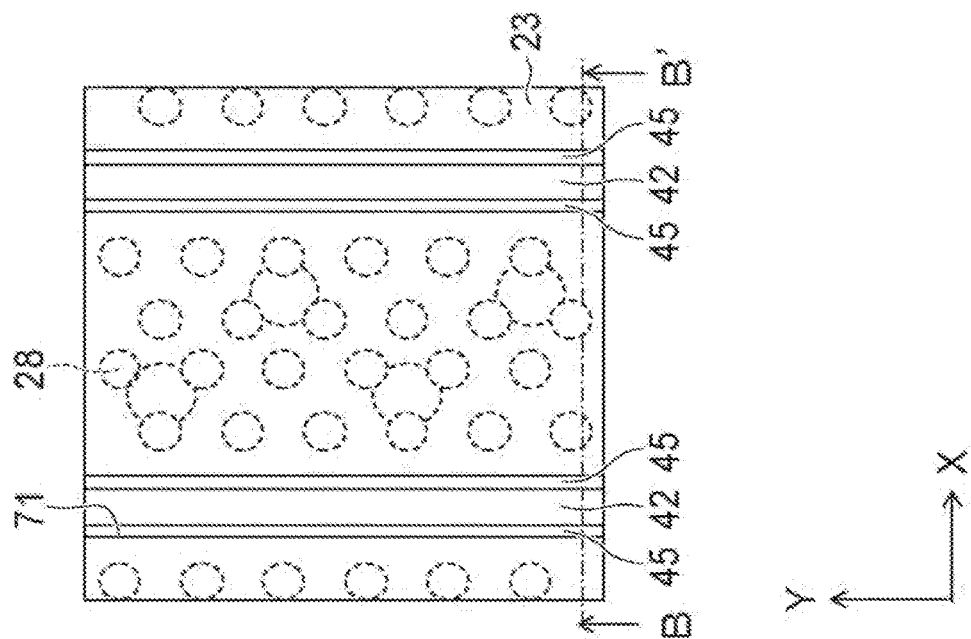
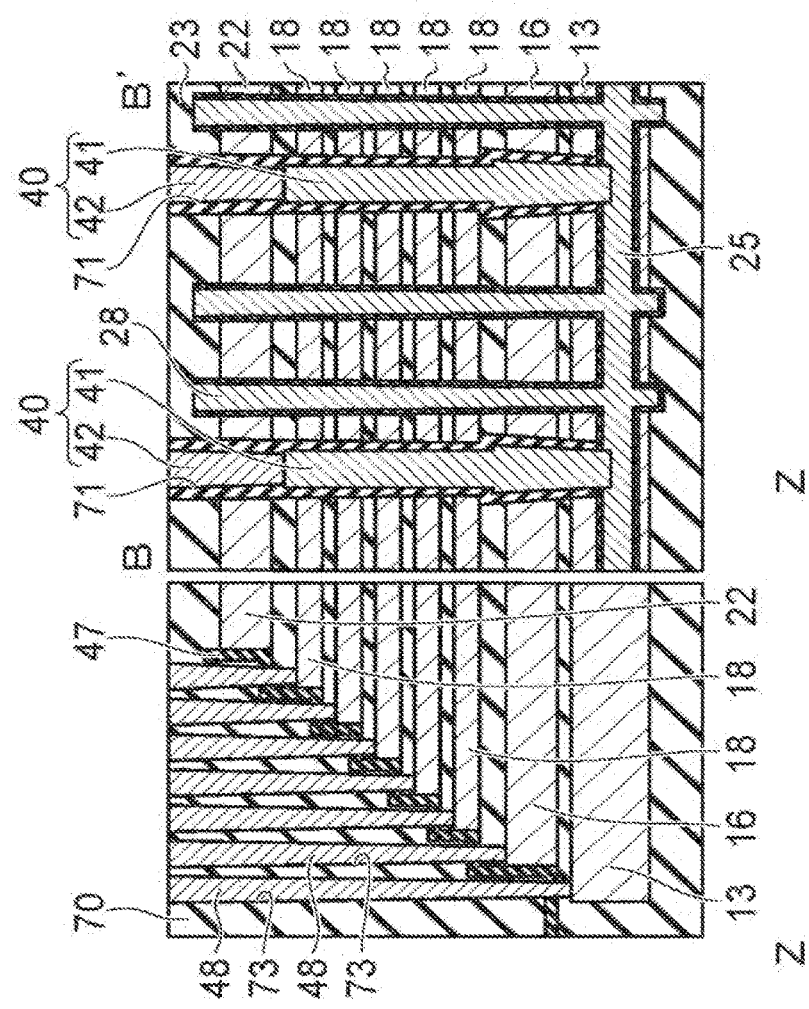
FIG. 15A  FIG. 15B  FIG. 15C

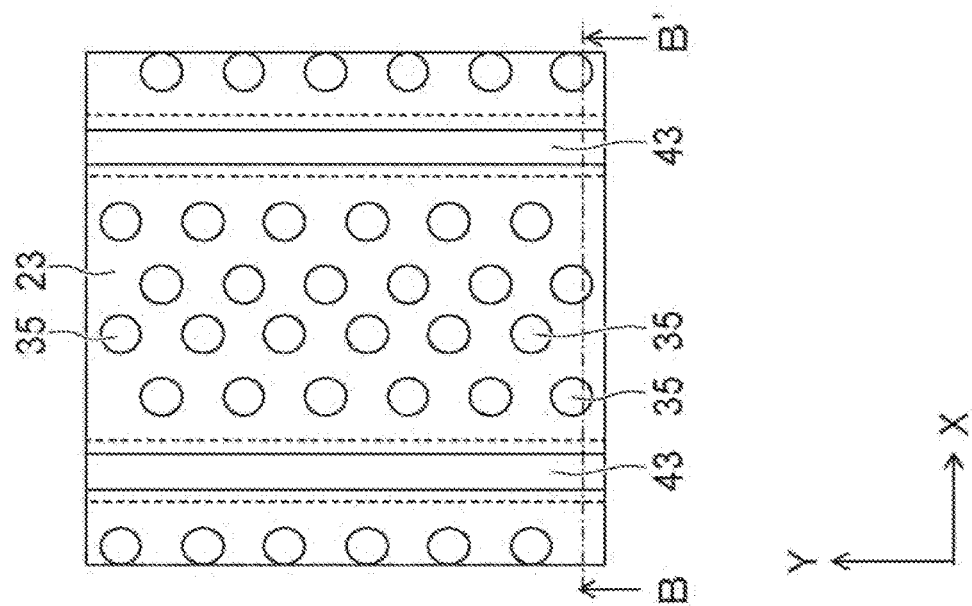
FIG. 16C
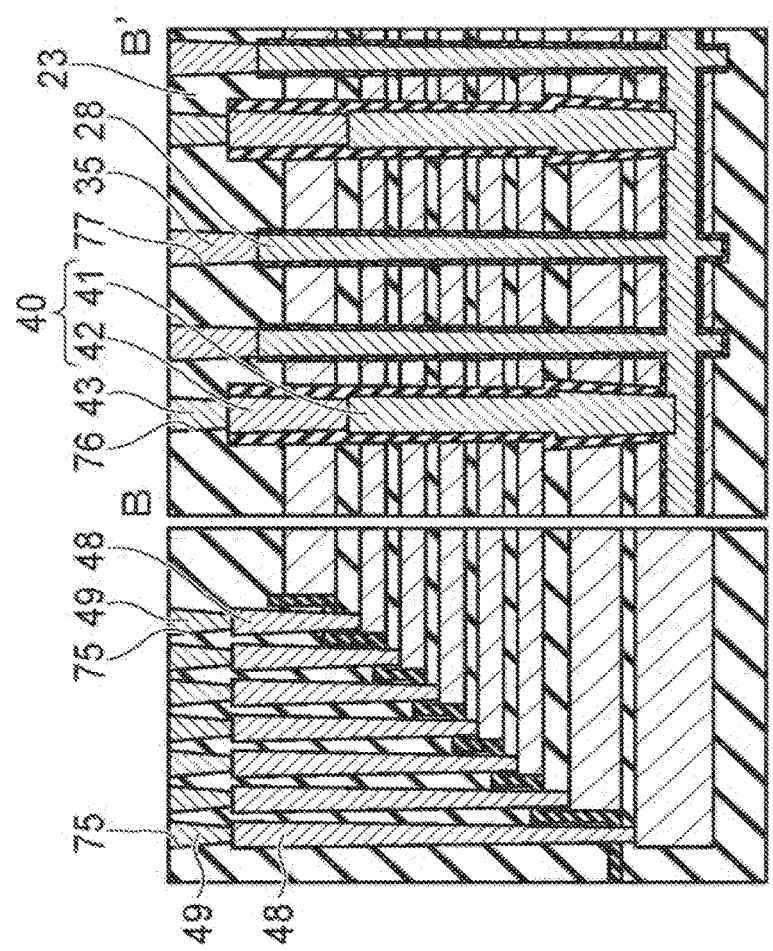
FIG. 16B
FIG. 16A

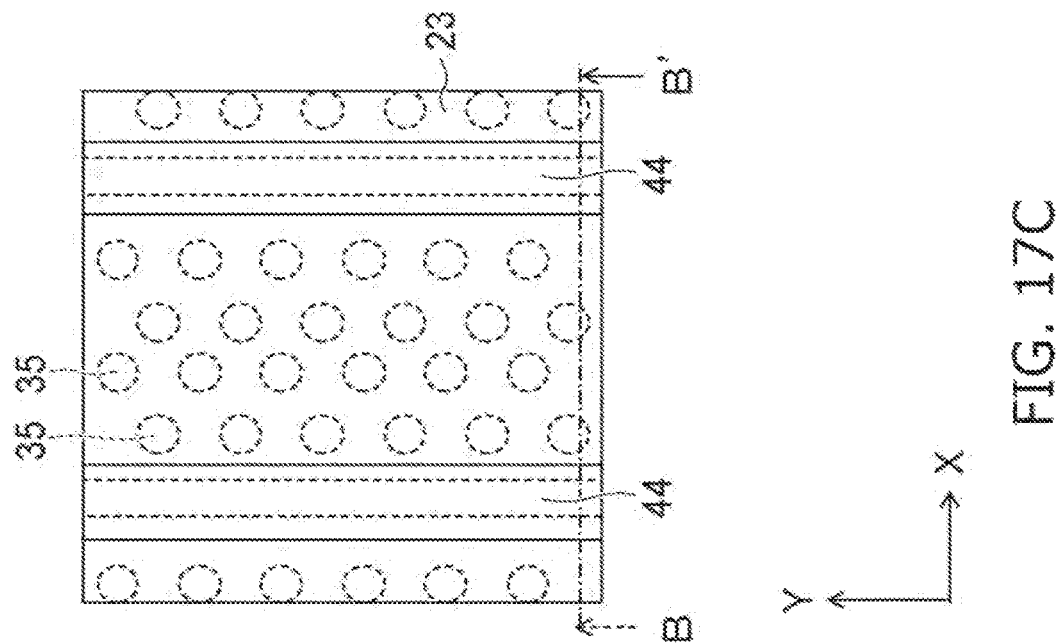
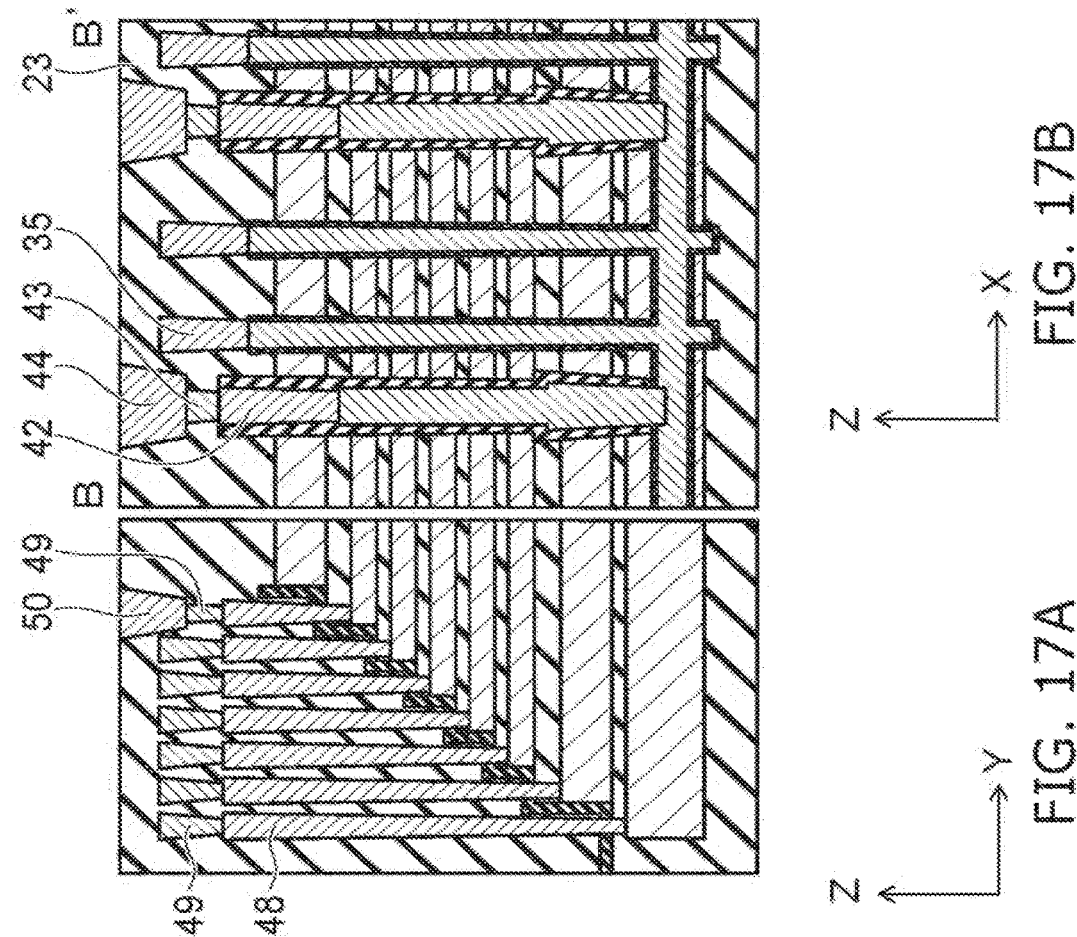
FIG. 17A  FIG. 17B  FIG. 17C

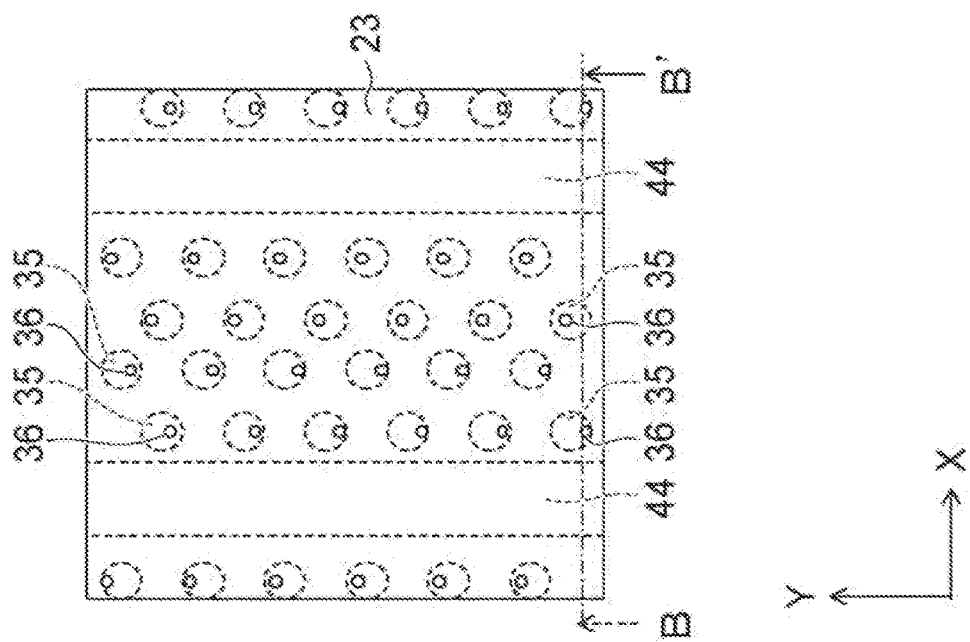
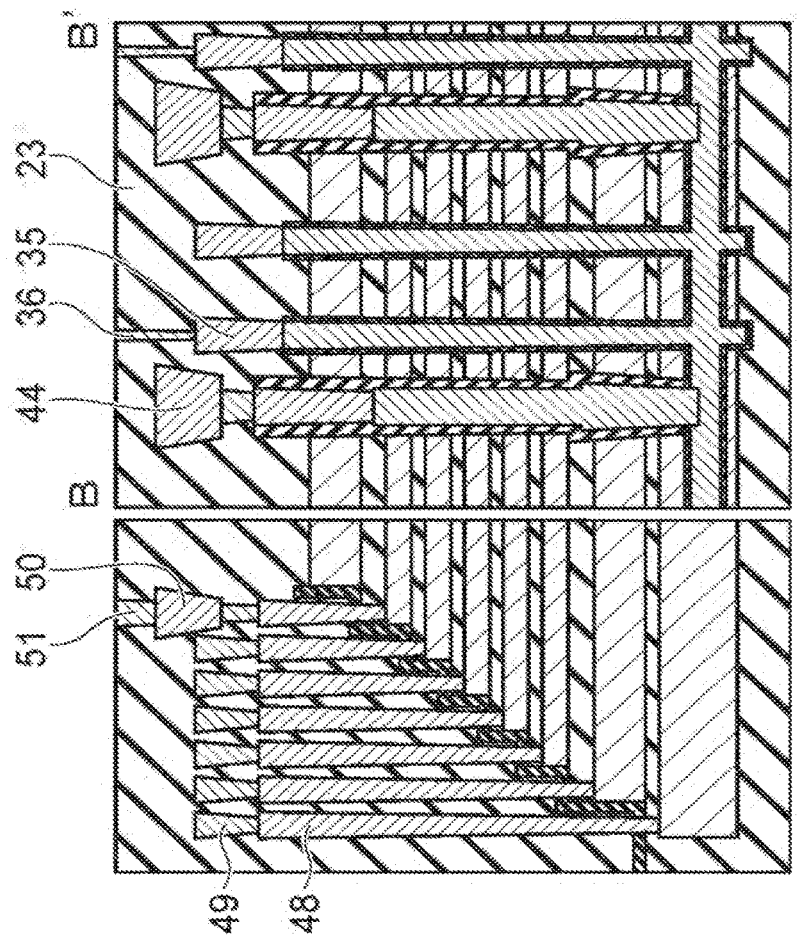
FIG. 18A  FIG. 18B  FIG. 18C

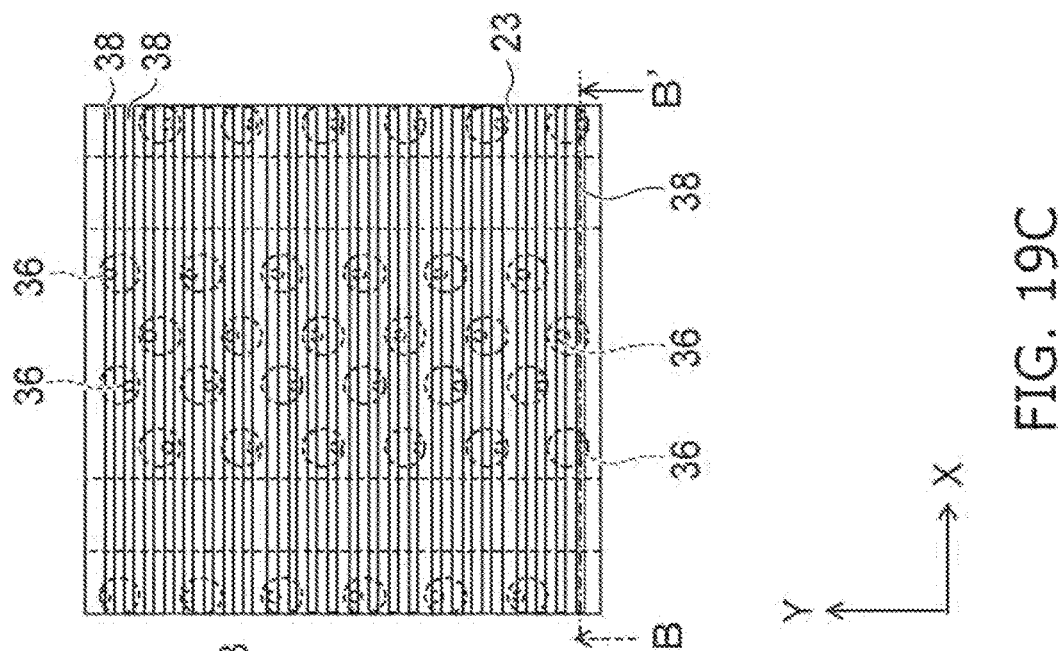
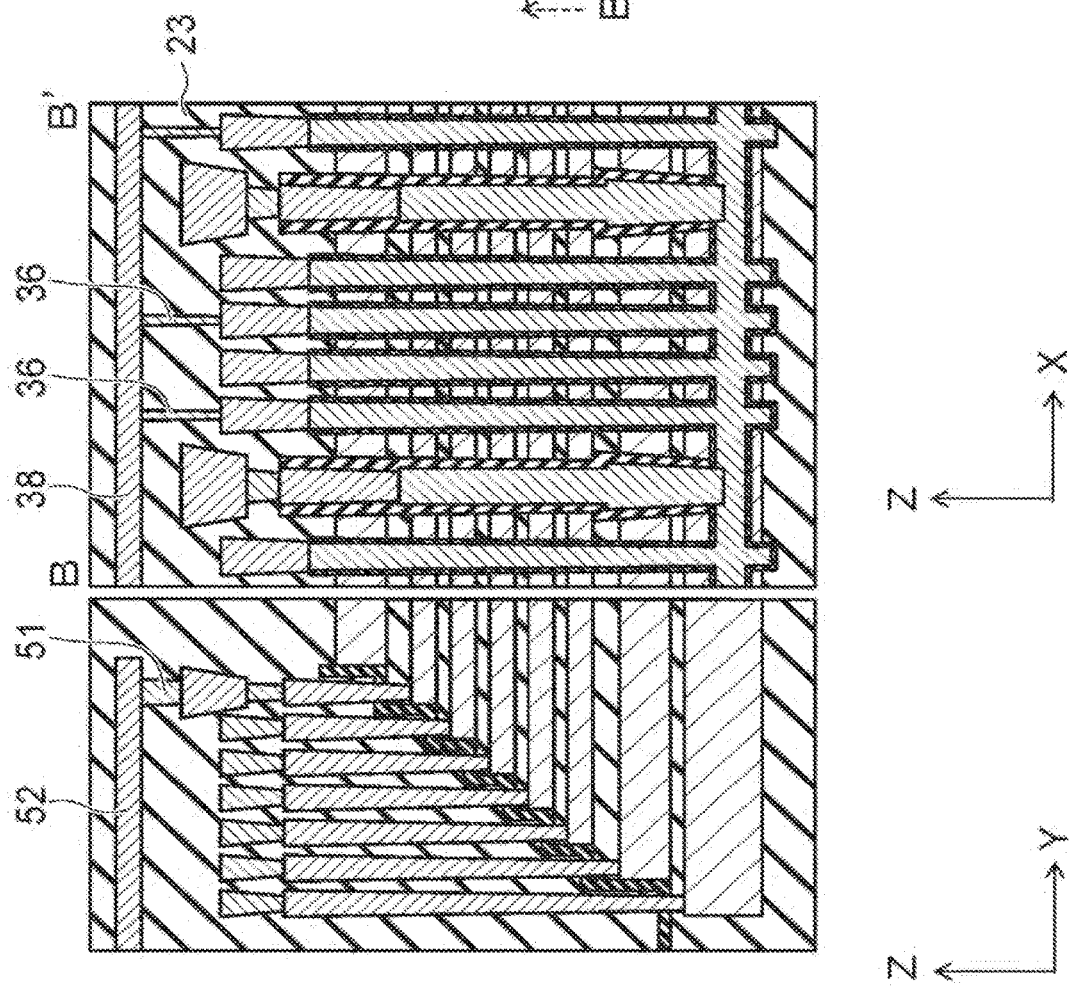
FIG. 19C
FIG. 19B
FIG. 19A

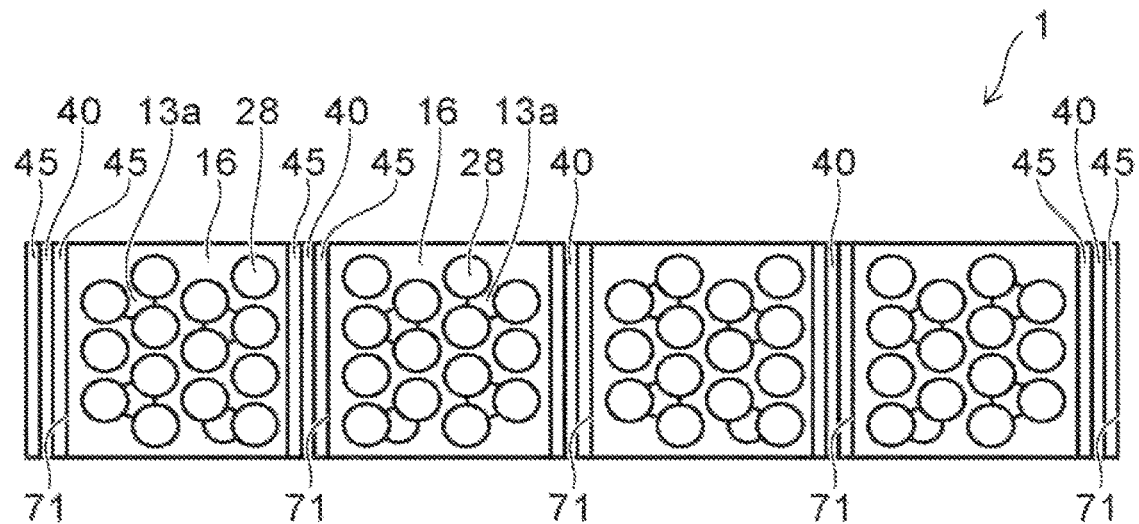
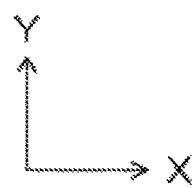
FIG. 26A
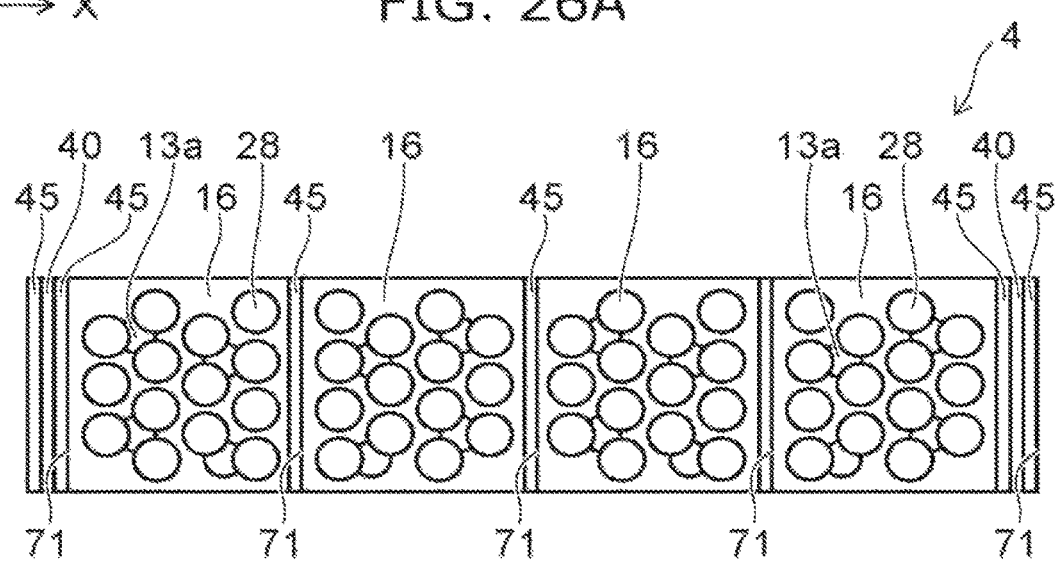
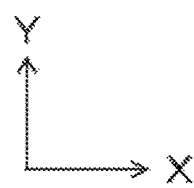
FIG. 26B

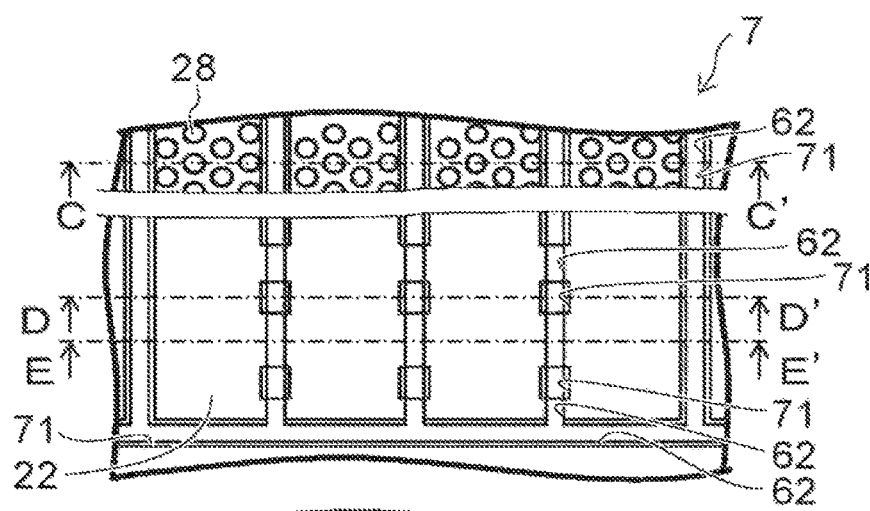
FIG. 30A
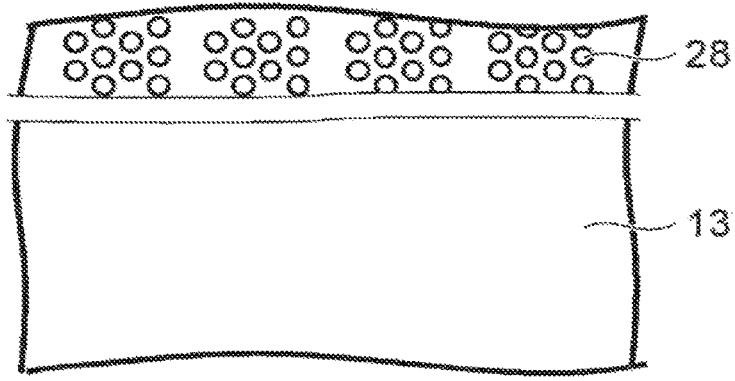
FIG. 30B
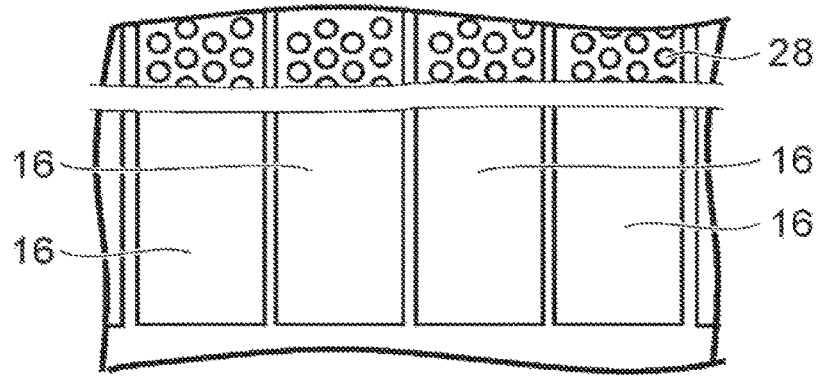
FIG. 30C
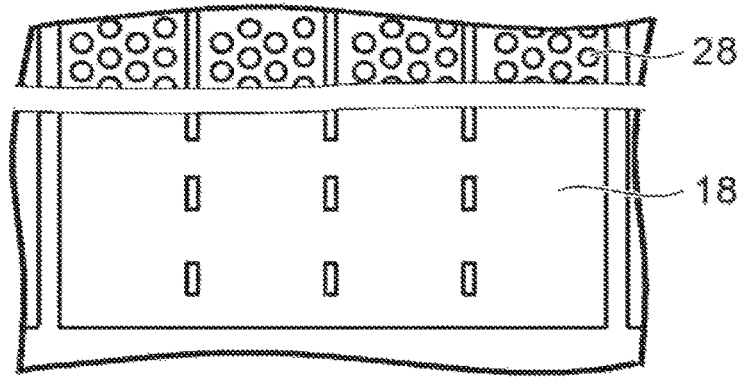
FIG. 30D
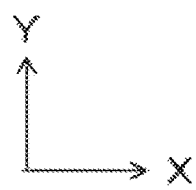

SEMICONDUCTOR MEMORY DEVICE AND METHOD FOR MANUFACTURING THE SAME

CROSS-REFERENCE TO RELATED APPLICATIONS

This application is a continuation of and claims the benefit of priority under 35 U.S.C. § 120 from U.S. application Ser. No. 17/335,214 filed Jun. 1, 2021, which is a continuation of U.S. application Ser. No. 16/918,005 filed Jul. 1, 2020 (now U.S. Pat. No. 11,063,064 issued Jul. 13, 2021), which is a continuation of U.S. application Ser. No. 16/596,892 filed Oct. 9, 2019 (now U.S. Pat. No. 10,741,583 issued Aug. 11, 2020), which is a continuation of U.S. application Ser. No. 16/138,619 filed Sep. 21, 2018 (now U.S. Pat. No. 10,497,717 issued Dec. 3, 2019), which is a continuation of U.S. application Ser. No. 15/345,790 filed Nov. 8, 2016 (now U.S. Pat. No. 10,115,733 issued Oct. 30, 2018), which is a continuation of U.S. application Ser. No. 14/614,588 filed Feb. 5, 2015 (now U.S. Pat. No. 9,520,407 issued Dec. 13, 2016), and claims the benefit of priority under 35 U.S.C. § 119 from Japanese Patent Application No. 2014-021747 filed Feb. 6, 2014; the entire contents of each of which are incorporated herein by reference.

FIELD

Embodiments described herein relate to a semiconductor memory device and a method for manufacturing the same.

BACKGROUND

High integration of semiconductor memory devices has been ongoing. However, a method for increasing a degree of integration according to improvement of a lithography technique is getting closer to the limit. Therefore, there has been proposed a stacked type memory device in which electrode films and insulating films are alternately stacked to form a stacked body, through-holes are collectively formed in the stacked body, a memory film is formed on the inner surfaces of the through-holes, and thereafter silicon pillars are formed on the insides of the through-holes. In the stacked type memory device, memory cells including the memory film as a charge storage member are formed in crossing portions of the silicon pillars and the electrode films. Therefore, the memory cells are three-dimensionally arrayed.

As a first example of the stacked type memory device, there has been proposed a memory device of an I-shaped pillar type in which source lines are provided under a stacked body, bit lines are provided on the stacked body, the lower ends of silicon pillars are connected to the source lines, and the upper ends of the silicon pillars are connected to the bit lines. However, when the memory device of the I-shaped pillar type is manufactured, in order to connect the silicon pillars to the source lines after forming a memory film on the inner surfaces of through-holes, the memory film from the bottoms of the through-holes needs to be removed by etching or the like. When the memory film is removed, the memory film formed on the side surfaces of the through-holes, that is, the memory film forming memory cells is damaged.

As a second example of the stacked type memory device, there has been proposed a memory device of a U-shaped pillar type in which source lines and bit lines are provided on a stacked body, upper end portions of two silicon pillars are respectively connected to the source lines and the bit lines, and the lower end portions of the two silicon pillars are connected via a connecting member. When the memory device of the U-shaped pillar type is manufactured, by causing two through-holes to communicate with a space in which the connecting member is planned to be formed, it is possible to form a memory film on the inner surfaces of the through-holes and a hollow and thereafter integrally form the silicon pillars and the connecting member. Therefore, it is unnecessary to remove the memory film on the bottoms of the through-holes. However, in the memory device of the U-shaped pillar type, the number of memory cells connected in series between the source lines and the bit lines increases. Therefore, a control circuit is large. Further, since a current path between the source lines and the bit lines is long, ON resistance is high.

BRIEF DESCRIPTION OF THE DRAWINGS

FIG. 3A is a plan view illustrating a mesh-like connecting member in the first embodiment, FIG. 3B is a plan view illustrating silicon pillars, source interconnection members, and control gate electrodes, and FIG. 3C is a plan view illustrating bit lines and the periphery of the bit lines;

FIGS. 4A to 4C to FIGS. 19A to 19C are diagrams illustrating a method for manufacturing the semiconductor memory device according to the first embodiment;

FIG. 26A is a plan view illustrating the semiconductor memory device according to the first embodiment, and FIG. 26B is a plan view illustrating a semiconductor memory device according to a fourth embodiment;

FIGS. 30A to 30D are plan views illustrating the semiconductor memory device according to the seventh embodiment;

DETAILED DESCRIPTION

A semiconductor memory device according to one embodiment includes a connecting member including a semiconductor material, a first electrode film provided at least above the connecting member, a first insulating film provided on the first electrode film, and a stacked body provided on the first insulating film. The stacked body includes second electrode films and second insulating films. Each of the second electrode films and each of the second insulating films are alternately stacked. The device includes three or more semiconductor pillars. The semiconductor pillars are arrayed along two or more directions different from one another, extend in a stacking direction of the second electrode films and the second insulating films, pierce through the stacked body and the first insulating film, and are connected to the connecting member. The device includes a third insulating film provided between the semiconductor pillars and the stacked body and between the connecting member and the first electrode film. The device includes a charge storage layer provided at least between one of the second electrode films and the third insulating film.

Embodiments of the invention are described below with reference to the drawings.

First Embodiment

First, a first embodiment is described.

Figures 1A, 1B:
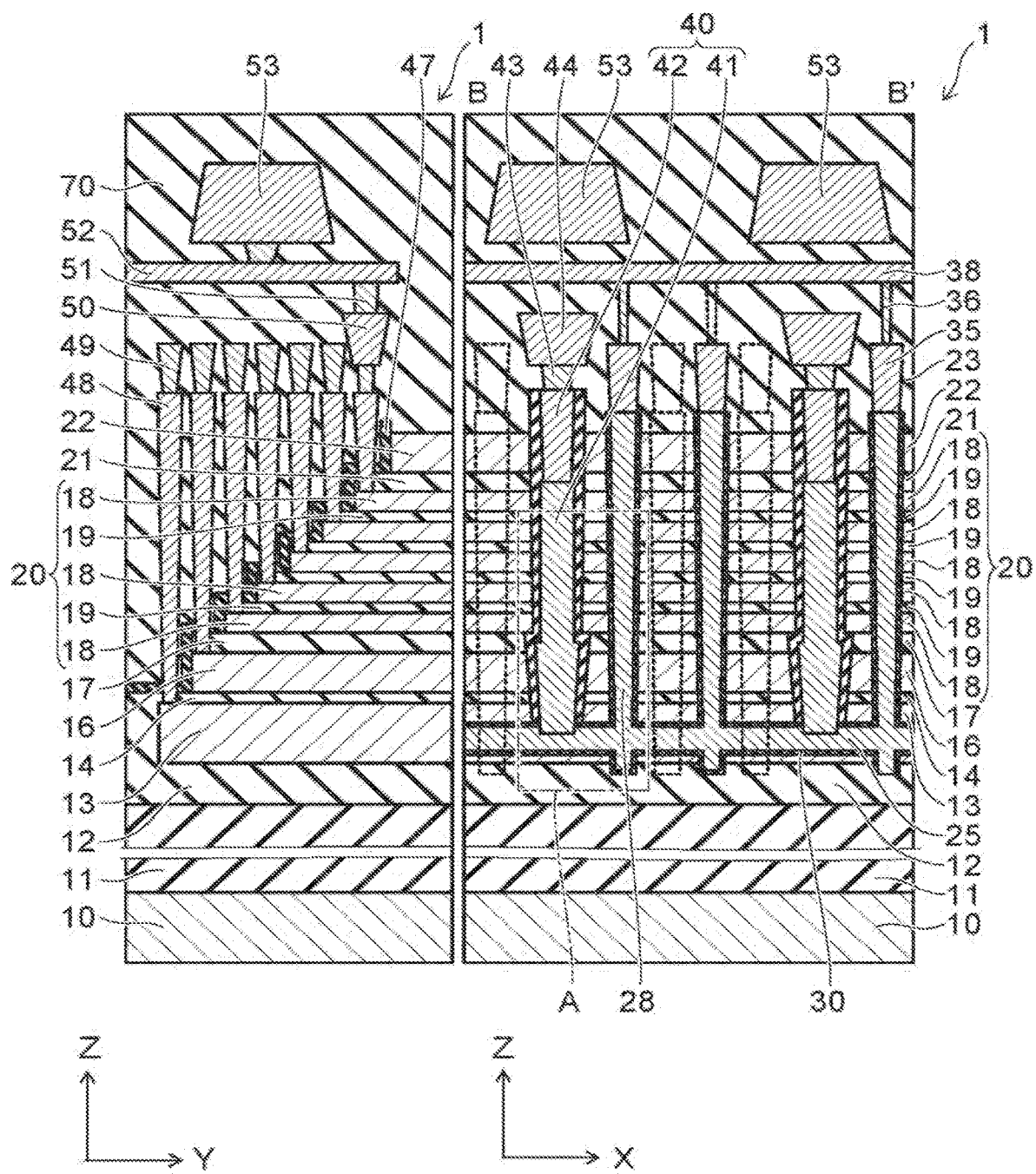
FIGS. 1A and 1B are sectional views illustrating a semiconductor memory device according to a first embodiment.

FIGS. 1A and 1B are sectional views illustrating a semiconductor memory device according to the embodiment. Cross sections orthogonal to each other are shown.

Figure 2:
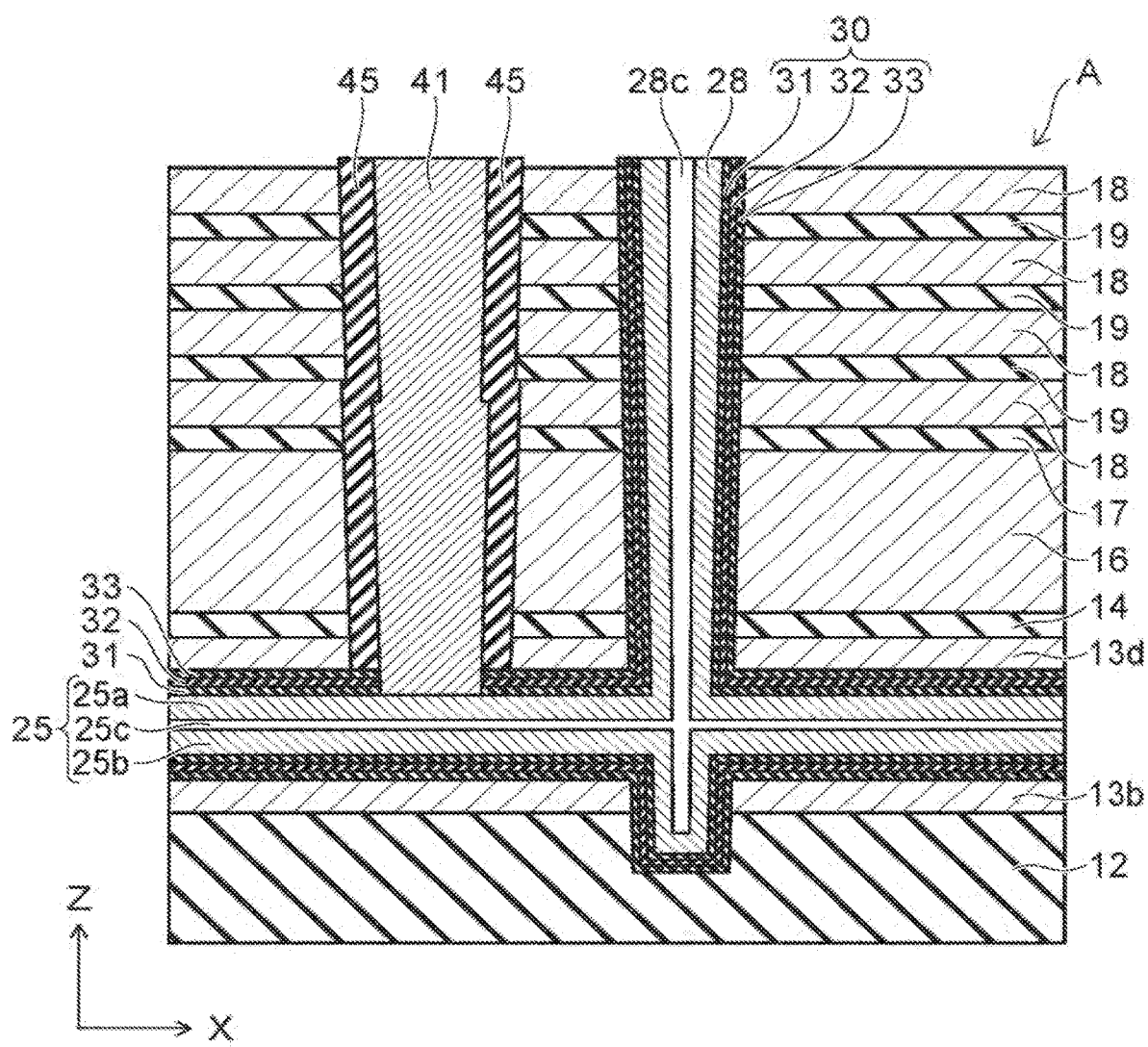
FIG. 2 is an enlarged sectional view of a region A shown in FIG. 1B.

FIG. 2 is an enlarged sectional view of a region A shown in FIG. 1B.

FIG. 3A is a plan view illustrating a mesh-like connecting member in the embodiment. FIG. 3B is a plan view illustrating silicon pillars, source interconnection members, and control gate electrodes. FIG. 3C is a plan view illustrating bit lines and the periphery of the bit lines.

FIG. 1B is a sectional view taken along line B-B' shown in FIG. 3C.

As shown in FIGS. 1A and 1B, in a semiconductor memory device 1 according to the embodiment, a silicon substrate 10 is provided. In the following description, in the specification, an XYZ orthogonal coordinate system is adopted for convenience of description. Directions parallel to the upper surface of the silicon substrate 10 and orthogonal to each other are referred to as "X-direction" and "Y-direction". A direction perpendicular to the upper surface of the silicon substrate 10 is referred to as "Z-direction".

A driving circuit section 11 is provided on the silicon substrate 10. An interlayer insulating film 12 is provided on the driving circuit section 11. Note that, in FIGS. 1A and 1B, only an interlayer insulating film is shown as the driving circuit section 11. Illustration of elements such as a transistor configuring the driving circuit section 11 is omitted. A back gate electrode film 13 (a first electrode film) is provided on the interlayer insulating film 12. An interlayer insulating film 14 (a first insulating film) is provided on the back gate electrode film 13. A selection gate electrode film 16 (a third electrode film) is provided on the interlayer insulating film 14. An interlayer insulating film 17 is provided on the selection gate electrode film 16. A stacked body 20 in which control gate electrode films 18 (second electrode films) and interlayer insulating films 19 (second insulating films) are alternately stacked is provided on the interlayer insulating film 17. An interlayer insulating film 21 is provided on the control gate electrode film 18 in the top layer of the stacked body 20. A selection gate electrode film 22 is provided on the interlayer insulating film 21. An interlayer insulating film 23 is provided on the selection gate electrode film 22. The interlayer insulating films are made of, for example, a silicon oxide. The back gate electrode film 13 is made of, for example, polysilicon including impurities. The selection gate electrode film 16, the control gate electrode films 18, and the selection gate electrode film 22 are made of, for example, any one of metal, metal silicide, or polysilicon.

A mesh-like connecting member 25 (a connecting member) is provided in the back gate electrode film 13. As shown in FIG. 3A, the shape of the mesh-like connecting member 25 is a mesh shape in which a plurality of through-holes 26 are periodically formed in a flat plate. The through-holes 26 are arrayed in zigzag on an XY plane. A part of the back gate electrode film 13 enters the insides of the through-holes 26. In other words, in the back gate electrode film 13, column sections 13a that pierce through the mesh-like connecting member 25 are provided. As shown in FIG. 2, the mesh-like connecting member 25 is divided into an upper layer portion 25a and a lower layer portion 25b. An air gap 25c is formed between the upper layer portion 25a and the lower layer portion 25b. The air gap 25c may be formed over the entire surface or may be partially formed. The mesh-like connecting member 25 may be a continuum. The air gap 25c does not have to be formed.

A plurality of silicon pillars 28 (semiconductor pillars) are formed to pierce through the selection gate electrode film 22, the interlayer insulating film 21, the stacked body 20, the interlayer insulating film 17, the selection gate electrode film 16, the interlayer insulating film 14, the back gate electrode film 13, and the mesh-like connecting member 25. The silicon pillars 28 are made of polysilicon and extend in the Z-direction, that is, a stacking direction of the control gate electrode films 18 and the interlayer insulating films 19. Air gaps 28c are formed in the center portions of the silicon pillars 28. Note that the air gaps 28c do not have to be formed.

As shown in FIG. 3B, most densely arrayed directions of the silicon pillars 28 viewed from the Z-direction are three directions, i.e., the Y-direction and directions inclined ±30° with respect to the X-direction. The silicon pillars 28 are periodically arrayed in a regular triangle lattice shape. As shown in FIG. 3B, three silicon pillars 28 cut into the outer circumferential portions of the column sections 13a. Note that, in FIG. 3A, crossing portions of the mesh-like connecting member 25 and the silicon pillars 28 are shown as the mesh-like connecting member 25.

As shown in FIG. 2, the silicon pillar 28 and the mesh-like connecting member 25 are integrally formed of, for example, polysilicon. Therefore, three or more silicon pillars 28 are connected to the mesh-like connecting member 25. An insulative memory film (third insulating film) 30 is provided on the outer surface of a structure made of the silicon pillars 28 and the mesh-like connecting member 25. The silicon pillars 28 are insulated from the selection gate electrode film 16, the control gate electrode films 18, and the selection gate electrode film 22 by the memory film 30. The mesh-like connecting member 25 is insulated from the back gate electrode film 13 by the memory film 30.

In the memory film 30, a tunnel insulating layer 31, a charge storage layer 32, and a block insulating layer 33 are stacked in this order from the side of the silicon pillars 28 and the mesh-like connecting member 25. The tunnel insulating layer 31 is a layer that is usually insulative but allows a tunnel current to flow when a predetermined voltage within a range of a driving voltage of the semiconductor memory device 1 is applied to the layer. The charge storage layer 32 is a layer having an ability to store charges and is formed of, for example, silicon nitride (SiN). The block insulating layer 33 is a layer that does not substantially allow an electric current to flow even if a voltage is applied to the layer within the range of the driving voltage of the semiconductor memory device 1. The block insulating layer 33 is an oxide layer formed of a high dielectric constant material, for example, a silicon oxide, an aluminum oxide, or a hafnium oxide or a multilayer film in which oxide layers of the high dielectric constant material are stacked.

As shown in FIGS. 1B and 3C, plugs 35 are provided on the silicon pillars 28 and connected to the silicon pillars 28. Plugs 36 are provided on the plugs 35 and connected to the plugs 35. The plugs 36 are thinner than the plugs 35. The plugs 35 and 36 are formed by stacking metal containing layers such as a tungsten layer and a titanium nitride layer. The positions in the Y-direction of two plugs 36 connected to the plugs 35 adjacent to each other in the X-direction are different from each other. Bit lines 38 extending in the X-direction are provided on the plugs 36. The bit lines 38 are connected to one silicon pillar 28 provided in a stacked body, which is divided into certain blocks (described below), via one plug 36 and one plug 35. Since the positions in the Y-direction of the two plugs 36 connected to the plugs 35 adjacent to each other in the X-direction are different from each other, the plugs 35 adjacent to each other in the X-direction are connected to the bit lines 38 different from each other.

Source interconnection members 40 (interconnection members) are provided to pierce through the selection gate electrode film 22, the interlayer insulating film 21, the stacked body 20, the interlayer insulating film 17, the selection gate electrode film 16, the interlayer insulating film 14, and an upper section of the back gate electrode film 13. A plurality of flat portions parallel to an YZ plane are provided in the source interconnection members 40. The plurality of flat portions may be connected to one another in not-shown portions. Note that, in FIG. 1B, two flat portions of the source interconnection members 40 are shown. Lower sections 41 of the source interconnection members 40 are formed of, for example, polysilicon, a conductivity type of which is an $n^+$ type. Effective impurity concentration in the lower sections 41 of the source interconnection members 40 is higher than effective impurity concentration in the mesh-like connecting member 25. Note that, in the specification, the "effective impurity concentration" means the concentration of impurities contributing to electric conduction of a semiconductor material. For example, both of impurities serving as a donor and impurities serving as an acceptor are contained in the semiconductor material, the "effective impurity concentration" means the concentration of the semiconductor material excluding an offset of the donor and the acceptor.

Upper sections 42 of the source interconnection members 40 are formed of, for example, a metal material. The upper sections 42 of the source interconnection members 40 are formed of, for example, a (TiSi/Ti/TiN/W) multilayer film in which a titanium silicide (TiSi) layer, a titanium (Ti) layer, a titanium nitride (TiN) layer, and a tungsten (W) layer are stacked in this order. Plugs 43 are provided on the source interconnection members 40. Source lines 44 extending in the Y-direction are provided on the plugs 43. The shape of the plugs 43 may be a wire shape. As shown in FIG. 2, the lower ends of the source interconnection members 40 are connected to the upper layer portion 25a of the mesh-like connecting member 25. Consequently, the source lines are connected to the silicon pillars 28 via the source interconnection members 40 and the mesh-like connecting member 25. Sidewall insulating films 45 (fourth insulating films) are provided between the source interconnection members 40 and the stacked body 20. Consequently, the source interconnection members 40 are insulated from the back gate electrode film 13, the selection gate electrode film 16, the control gate electrode films 18, and the selection gate electrode film 22.

The selection gate electrode film 16, the control gate electrode films 18, and the selection gate electrode film 22 are divided into belt-like portions extending in the Y-direction by the flat portions of the plurality of source interconnection members 40. In the following description, a portion between the flat portions of two source interconnection members 40 adjacent to each other in the X-direction is referred to as "block". In blocks, four silicon pillar columns consisting of the plurality of silicon pillars 28 arrayed along the Y-direction are disposed. The bit lines 38 extend in the X-direction over a plurality of blocks and connected to one silicon pillar 28 in each of the blocks. The back gate electrode film 13 and the mesh-like connecting member 25 are consecutively provided over the plurality of blocks.

On the other hand, as shown in FIG. 1A, at one end portions in the Y-direction of the blocks, a stacked body consisting of the selection gate electrode film 16, the control gate electrode films 18, and the selection gate electrode film 22 is processed into a stair shape in which a step is formed for each of the electrode films. Stopper films 47 made of, for example, a silicon nitride are provided to cover stair-shaped portions. On the end portions of the electrode films, plugs 48 are provided to be connected to the electrode films piercing through the stopper films 47. Plugs 49 are provided on the plugs 48. Plugs 50 and 51 are provided on the plugs 49. Word lines 52 extending in the Y-direction are provided on the plugs 51. The word lines 52 are disposed in the same layer as the bit lines 38. Upper layer interconnects 53 are provided above the bit lines 38 and the word lines 52.

In the semiconductor memory device 1, a memory cell transistor is configured in each of crossing portions of the silicon pillars 28 and the control gate electrode films 18. A lower selection transistor is configured in each of crossing portions of the silicon pillars 28 and the selection gate electrode film 16. Further, an upper selection transistor is configured in each of crossing portions of the silicon pillars 28 and the selection gate electrode film 22. Furthermore, the mesh-like connecting member 25 and the back gate electrode film 13 configure a back gate transistor.

Therefore, NAND strings in which the upper selection transistor, a plurality of the memory cell transistors, the lower selection transistor, and the back gate transistor are connected in series are configured between the bit lines 38 and the source lines 44. The lower sections 41 of the source interconnection members 40 function as source diffusion layers that supply electors to the transistors of the NAND strings. Note that, among the plurality of control gate electrode films 18, the control gate electrode films 18 in one or several layers including the bottom layer and the control gate electrode layers 18 in one or several layers including the top layer may be dummy control gate electrode films that do not configure memory cell transistors. The selection gate electrode film 16 of the lower selection transistor and the selection gate electrode film 22 of the upper selection transistor may be respectively stacked structures of a plurality of layers.

A method for manufacturing the semiconductor memory device according to the embodiment is described.

FIGS. 4A to 4C to FIGS. 19A to 19C are diagrams illustrating the method for manufacturing the semiconductor memory device according to the embodiment. FIG. 4A shows a cross section equivalent to FIG. 1A. FIG. 4B shows a cross section equivalent to FIG. 1B. FIG. 4C shows a plane equivalent to FIGS. 3A to 3C. The same applies to the other drawings.

Figure 20A:
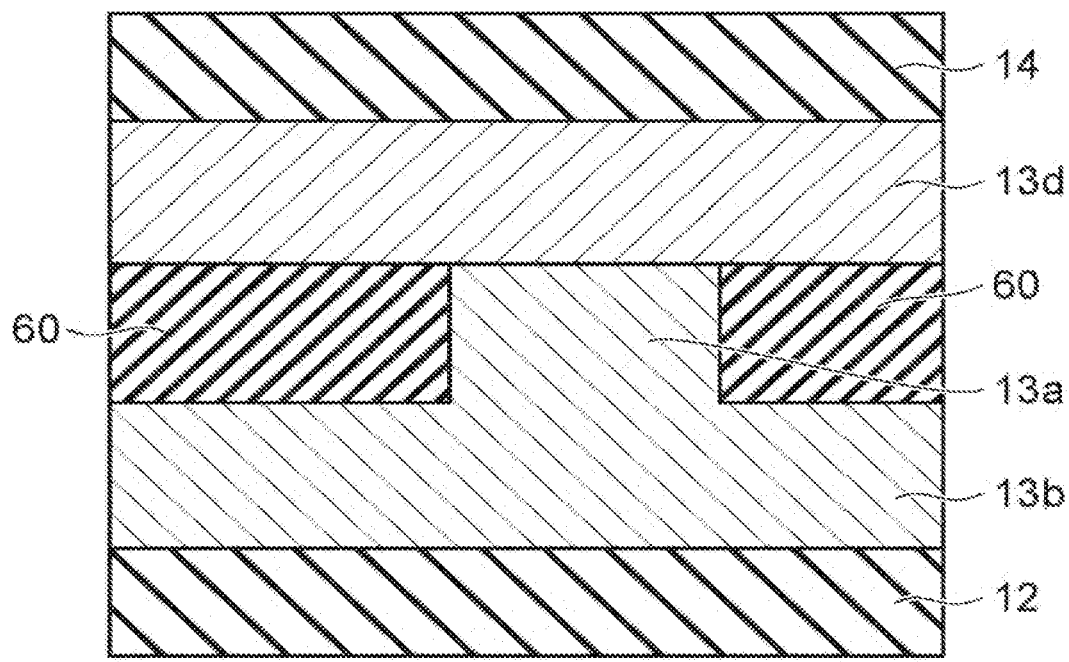
FIGS. 20A and 20B are sectional views illustrating the method for manufacturing the semiconductor memory device according to the first embodiment.
Figure 20B:
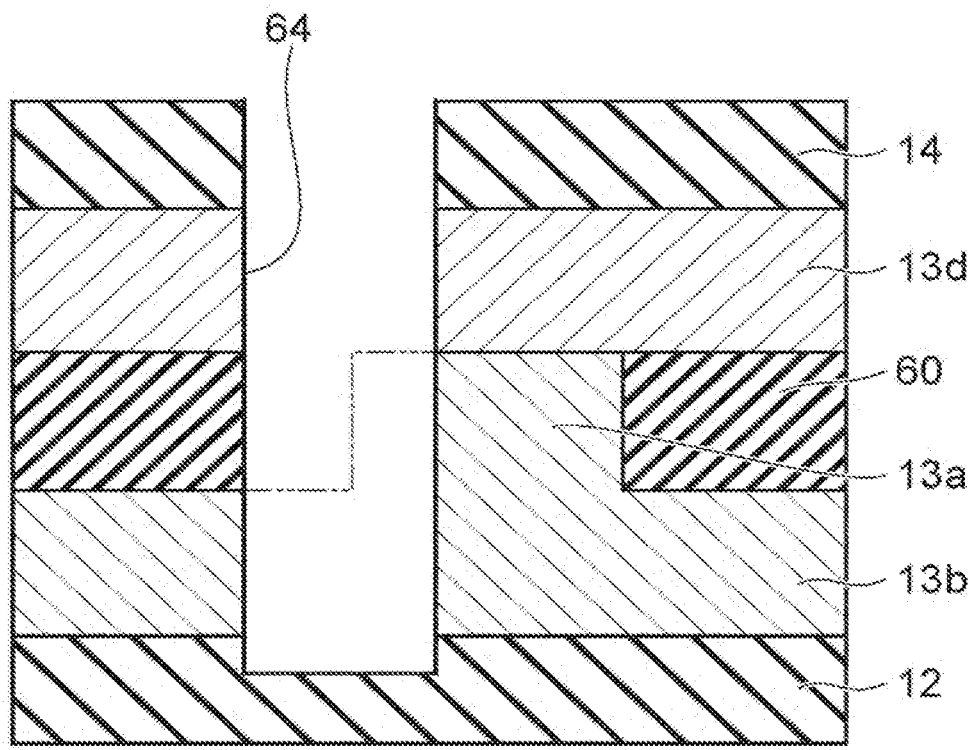

FIGS. 20A and 20B are sectional views illustrating the method for manufacturing the semiconductor memory device according to the embodiment.

First, as shown in FIGS. 1A and 1B, the driving circuit section 11 is formed on the silicon substrate 10. The interlayer insulating film 12 is formed on the driving circuit section 11.

Subsequently, as shown in FIGS. 4A to 4C, a lower layer portion 13b of the back gate electrode film 13 is formed on the interlayer insulating film 12. Subsequently, a recessed section 13c is formed on the upper surface of the lower layer portion 13b. In this case, the column sections 13a are left in the recessed section 13c. Subsequently, a sacrificial member 60 made of, for example, a silicon nitride is embedded in the recessed section 13c. In this case, the upper surfaces of the column sections 13a are exposed without being covered by the sacrificial member 60.

Subsequently, as shown in FIGS. 5A to 5C, an upper layer portion 13d of the back gate electrode film 13 is formed to cover the sacrificial member 60. Consequently, the lower layer portion 13b, the column sections 13a, and the upper layer portion 13d are integrated to form the back gate electrode film 13. Subsequently, the back gate electrode film 13 is patterned. Portions where the back gate electrode film 13 is removed are filled by an interlayer insulating film 61.

Subsequently, as shown in FIGS. 6A to 6C, the interlayer insulating film 14, the selection gate electrode film 16 made of polysilicon, and the interlayer insulating film 17 are formed in this order. Subsequently, slits 62 extending in the Y-direction are formed in the interlayer insulating film 17 and the selection gate electrode film 16. Consequently, the selection gate electrode film 16 is divided into belt-like portions extending in the Y-direction. Subsequently, sacrificial members 63 made of, for example, a silicon nitride are embedded in the slits 62.

Subsequently, as shown in FIGS. 7A to 7C, the control gate electrode films 18 and the interlayer insulating films 19 are alternately stacked to cover the interlayer insulating film 17 and the sacrificial members 63. Consequently, the stacked body 20 is formed. In this case, the control gate electrode films 18 are formed of, for example, polysilicon containing impurities. Subsequently, the interlayer insulating film 21, the selection gate electrode film 22, and the interlayer insulating film 23 are formed in this order on the stacked body 20. The selection gate electrode film 22 is formed of, for example, polysilicon containing impurities.

Subsequently, memory holes 64 are formed by, for example, a lithography method and an RIE (reactive ion etching) method to reach the sacrificial member 60 embedded in the back gate electrode film 13 piercing through the interlayer insulating film 23, the selection gate electrode film 22, the interlayer insulating film 21, the stacked body 20, the interlayer insulating film 17, the selection gate electrode film 16, the interlayer insulating film 14, and the upper layer portion 13d of the back gate electrode film 13. Consequently, the sacrificial member 60 is exposed on the inner surfaces of the memory holes 64.

In this case, as shown in FIG. 7B, the memory holes 64 may be caused to pierce through the lower layer portion 13b of the back gate electrode film 13 as well to reach the interlayer insulating film 12 halfway. As shown in FIGS. 20A and 20B, when positions where the memory holes 64 are planned to be formed overlap the column sections 13a of the back gate electrode film 13, the memory halls 64 are caused to pierce through the column sections 13a as well.

Subsequently, the sacrificial member 60 is removed by applying wet etching to the sacrificial member 60 via the memory holes 64. As a result, a hollow 65 is formed in portions where the sacrificial member 60 is removed in the back gate electrode film 13. The hollow 65 is caused to communicate with the memory holes 64.

Figure 8A:
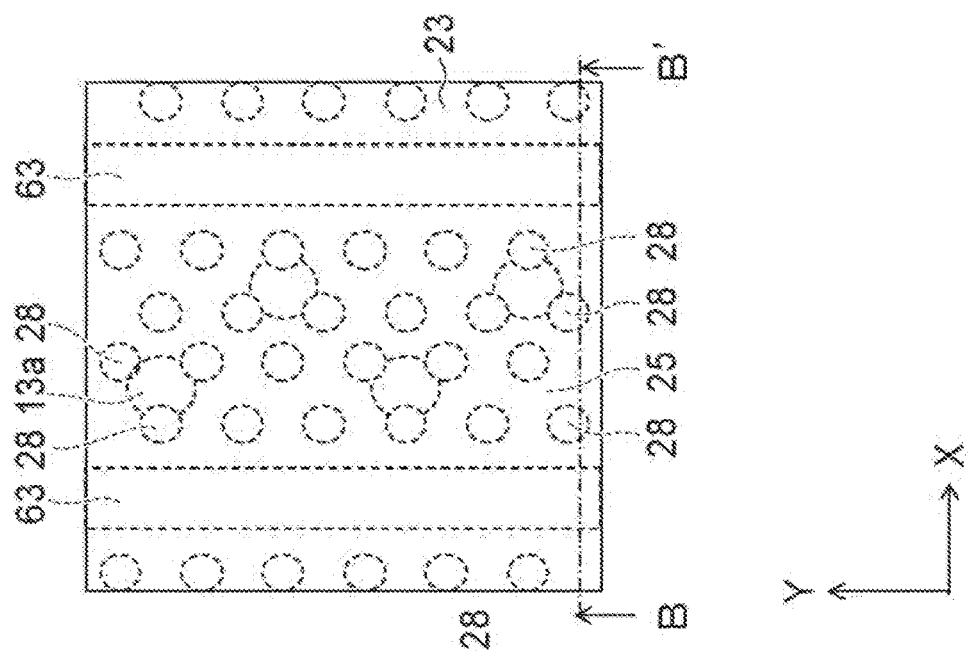
Figure 8B:
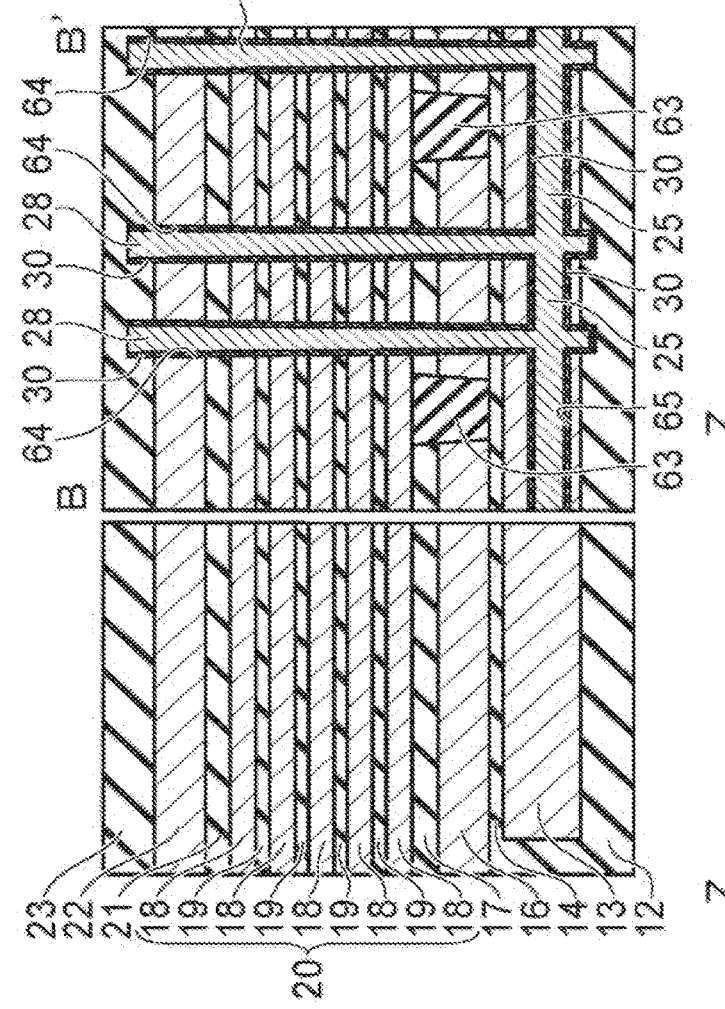
Figure 8C:
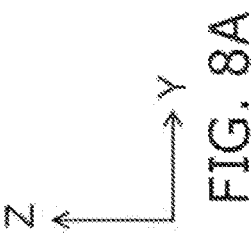

Subsequently, as shown in FIGS. 8A to 8C, the block insulating layer 33, the charge storage layer 32, and the tunnel insulating layer 31 (see FIG. 2) are formed in this order on the inner surfaces of the memory holes 64 and the hollow 65 to form the memory film 30. Subsequently, silicon is deposited on the insides of the memory holes 64 and the hollow 65 to form the mesh-like connecting member 25 in the hollow 65 and integrally form the silicon pillars 28 in the memory holes 64.

In this case, as shown in FIG. 2, silicon is deposited on the upper surface of the hollow 65 to form the upper layer portion 25a of the mesh-like connecting member 25. Silicon is deposited on the lower surface of the hollow 65 to form the lower layer portion 25b of the mesh-like connecting member 25. Depending on a deposition condition of silicon, an air gap 25c is formed between the upper layer portion 25a and the lower layer portion 25b. Subsequently, the interlayer insulating film 23 is further formed on the interlayer insulating film 23 to cover the upper end portions of the silicon pillars 28.

Subsequently, as shown in FIGS. 9A to 9C, the end portion in the Y-direction of a stacked body 67 consisting of the selection gate electrode film 16, the interlayer insulating film 17, the stacked body 20, the interlayer insulating film 21, the selection gate electrode film 22, and the interlayer insulating film 23 is processed into a stair shape. Subsequently, a stopper film 47 made of, for example, a silicon nitride is formed to cover steps processed into the stair shape.

Subsequently, as shown in FIGS. 10A to 10C, an insulating film 70 is embedded on a side of the stacked body 67 processed into the stair shape to planarize the upper surfaces of the interlayer insulating film 23 and the insulating film 70. Subsequently, slits 71 extending in the Y-direction are formed in regions right above the sacrificial members 63 in the stacked body 67. Consequently, the control gate electrode films 18 and the selection gate electrode film 22 are divided into belt-like portions extending in the Y-direction.

Subsequently, as shown in FIGS. 11A to 11C, the sacrificial members 63 are removed from the bottoms of the slits 71 by applying, for example, wet etching to the sacrificial members 63. Consequently, the selection gate electrode film 16 is exposed to the inner surface of the slits 62. Note that, since the interlayer insulating film 14 is not removed, the back gate electrode film 13 is not exposed to the inner surfaces of the slits 71.

Subsequently, as shown in FIGS. 12A to 12C, silicidation treatment is applied to the selection gate electrode film 16, the control gate electrode films 18, and the selection gate electrode film 22 via the slits 71. Consequently, portions disposed around the silicon pillars 28 in the selection gate electrode film 16, the control gate electrode films 18, and the selection gate electrode film 22 are silicided. On the other hand, portions distant from the slits 71 in the selection gate electrode film 16, the control gate electrode films 18, and the selection gate electrode film 22, for example, portions located at end portions of the stacked body 67 processed into the stair shape are not silicided and are left as polysilicon.

Subsequently, as shown in FIGS. 13A to 13C, for example, anisotropic etching is performed to remove the interlayer insulating film 14 and the upper layer portion 13d of the back gate electrode film 13 from the bottoms of the slits 62. Subsequently, an insulating material is deposited over the entire surface. Consequently, the sidewall insulating films 45 are formed on the inner surfaces of the slits 71 and the slits 62. Subsequently, the anisotropic etching such as the RIE method is applied to remove portions formed on the upper surface of the interlayer insulating film 23 in the sidewall insulating films 45 and portions formed on the bottom surfaces of the slits 62. Consequently, the mesh-like connecting member 25 is exposed in the bottoms of the slits 62.

Subsequently, as shown in FIGS. 14A to 14C, for example, polysilicon, a conductivity type of which is an n$^+$ type, is embedded in the slits 62 and the slits 71. Subsequently, recessing is performed to remove the polysilicon from upper sections of the slits 71. Consequently, the lower sections 41 of the source interconnection members 40 are formed in the slits 62 and lower sections of the slits 71. The lower sections 41 of the source interconnection members 40 are ohmic-connected to the mesh-like connecting member 25.

Subsequently, as shown in FIGS. 15A to 15C, the anisotropic etching is performed using the stopper films 47 as stoppers to form a plurality of contact holes 73 in the insulating film 70 in regions right above the end portions of the stacked body 67 processed into the stair shape. Subsequently, a metal material, for example, a (Ti/TiN/W) stacked film is deposited over the entire surface and etched back to form the upper sections 42 of the source interconnection members 40 in the upper sections of the slits 71 and form the plugs 48 in the contact holes 73. The plugs 48 are ohmic-connected to the back gate electrode film 13, the selection gate electrode film 16, and the control gate electrode films 18. The upper sections 42 of the source interconnection members 40 are ohmic-connected to the lower sections 41.

Subsequently, as shown in FIGS. 16A to 16C, the interlayer insulating film 23 is further formed on the interlayer insulating film 23. Subsequently, via holes 75 are formed in regions right above the plugs 48, slits 76 are formed in regions right above the source interconnection members 40, and via holes 77 are formed in regions right above the silicon pillars 28 by the lithography method and the RIE method. Subsequently, a metal material such as tungsten is deposited over the entire surface and etched back to form the plugs 49 in the via holes 75, form the plugs 43 in the slits 76, and form the plugs 35 in the via holes 77. The plugs 49 are connected to the plugs 48, the plugs 43 are connected to the source interconnection members 40, and the plugs 35 are connected to the silicon pillars 28.

Subsequently, as shown in FIGS. 17A to 17C, the interlayer insulating film 23 is further formed on the interlayer insulating film 23, trenches are formed, and a metal material is embedded in the trenches to form the plugs 50 and the source lines 44. The plugs 50 are connected to the plugs 49. The source lines 44 are connected to the plugs 43.

Subsequently, as shown in FIGS. 18A to 18C, the interlayer insulating film 23 is further formed on the interlayer insulating film 23, via holes are formed, and a metal material is embedded in the via holes to form the plugs 51 and the plugs 36. The plugs 51 are connected to the plugs 50. The plugs 36 are connected to the plugs 35. The plugs 36 are formed thinner than the plugs 35. A plurality of plugs 36 respectively connected to a plurality of plugs 35 formed in the same position in the Y-direction in the blocks are disposed in positions different from one another in the Y-direction.

Subsequently, as shown in FIGS. 19A to 19C, the interlayer insulating film 23 is further formed on the interlayer insulating film 23, trenches are formed, and a metal material is embedded in the trenches to form the word lines 52 and the bit lines 38. The word lines 52 are connected to the plugs 51. The bit lines 38 are connected to the plugs 36. Subsequently, the interlayer insulating film 23 is further formed to embed the word lines 52 and the bit lines 38.

Subsequently, as shown in FIGS. 1A and 1B, the upper layer interconnects 53 are formed and embedded by the interlayer insulating film 23. In this case, a part of the upper layer interconnects 53 is connected to the word lines 52. In this way, the semiconductor memory device 1 according to the embodiment is manufactured. Note that the lower layer portion 13b of the back gate electrode film 13 does not always have to be provided. The back gate electrode film 13 only has to be provided at least above the mesh-like connecting member 25.

The operation of the semiconductor memory device according to the embodiment is described.

First, a writing operation (Program) is described.

Writing of data in memory cell transistors is performed by storing electrons in the charge storage layer 32 of a writing target memory cell transistor (hereinafter also referred to as "selected memory cell"). Specifically, first, the potential of the source lines 44 is set to reference potential Vss or small positive potential of approximately (Vss+2V) and the potential of the selection gate electrode film 16, through which a NAND string (hereinafter also referred to as "selected string") to which the selected memory cell belongs, is set to the potential Vss to change a lower selection transistor to an OFF state and make the selected string electrically independent from the source line.

The potential of the bit line 38 connected to the selected memory cell is set to the reference potential Vss, for example, potential Vdd (>Vss) is applied to the selection gate electrode film 22 to change an upper selection transistor of the selected string to an ON state and change an upper selection transistor of unselected strings to the OFF state to set the potential of the silicon pillar 28 of the selected string to approximately the reference potential Vss. On the other hand, after potential Vpass (>Vss) is applied to all the control gate electrode films 18 of a target block, the potential of the control gate electrode film 18 of the selected memory cell is set to positive writing potential Vprg. Consequently, concerning the selected memory cell, electrons are injected into the charge storage layer 32 from the silicon pillar 28 via the tunnel insulating layer 31. Consequently, data is written in the selected memory cell. Concerning the bit lines 38 connected to unselected memory cells in which writing is not performed, bit line potential is raised to, for example, the potential Vdd to change the upper selection transistor, the gate potential of which is the potential Vdd, to the OFF state and set the silicon pillar 28 of the NAND string in a floating state. Consequently, in the unselected memory cells, a large potential difference is prevented from occurring between the control gate electrode films 18 and the silicon pillars 28.

In this case, the potential of the back gate electrode film 13 may be set to approximately the reference potential Vss to change the back gate transistor to the OFF state. The potential of the back gate electrode film 13 may be set to approximately readout potential Vread_bg higher than the reference potential Vss to change the back gate transistor to the ON state.

Subsequently, a readout operation (Read) is described.

When data stored in the selected memory cell is read out, a threshold of the selected memory cell is detected. Specifically, the potential of the source lines 44 is set to the reference potential Vss and the potential of the back gate electrode film 13 is set to positive readout potential Vread_bg. Consequently, electrons are induced in the mesh-like connecting member 25 surrounded by the back gate electrode film 13. As a result, the mesh-like connecting member 25 functions as a source diffusion layer of the memory cell transistors or the like.

In this state, positive ON potential VSGS_on is applied to the selection gate electrode film 16, through which the selected string pierces, to change the lower selected gate transistor to the ON state. On the other hand, negative OFF potential VSGS_off or ground potential is applied to the selection gate electrode film 16, through which the unselected strings pierce, to change the lower selected gate transistor to the OFF state. Consequently, a readout current can flow to only the selected string. The potential of the bit lines 38 is set to positive readout potential and the readout potential Vread (>Vss) is applied to the selection gate potential film 16 corresponding to the unselected memory cells belonging to the selected string to change the unselected memory cells to the ON state. A readout current flowing to the selected string is detected to determine the threshold of the selected memory cell and read out data.

An erasing operation (Erase) is described.

When data written in the memory cell transistors is erased, holes are injected into the charge storage layer 32 from the silicon pillars 28 to extinguish the holes and electrons stored in the charge storage layer 32 as a pair. In the embodiment, for example, erasing potential Vera is applied to the source interconnection members 40 and erasing potential Vera_bg (Vera>Vera_bg>Vss) is applied to the back gate electrode film 13 to generate an electric field between the lower sections 41 of the source interconnection members 40 and the back gate electrode film 13. The reference potential Vss is applied to the control gate electrode film 18 of a block in which erasing is performed. The control gate electrode film 18 of a block in which erasing is not performed is changed to a floating state. Consequently, holes are generated by inter-band tunneling. In the block in which erasing is performed, the holes are injected into the charge storage layer 32 via the mesh-like connecting member 25 and the silicon pillars 28. Therefore, it is unnecessary to generate a strong electric field near the selection transistor to cause the inter-band tunneling and generate holes. Consequently, it is possible to suppress an off-leak current of the selection transistor and further stabilize the operation. It is possible to realize the semiconductor memory device having higher reliability.

Effects of the embodiment are described.

As shown in FIG. 1B, in the semiconductor memory device 1 according to the embodiment, the memory cell transistors connected between the bit lines 38 and the source lines 44 are arrayed in only one column along the Z-direction. Therefore, even if the number of stacked control gate electrode films 18 is increased, the number of the memory cell transistors connected between the bit lines 38 and the source lines 44 does not increase exceeding the number of stacked control gate electrode films 18. An excessively large control circuit is not required. A current path between the source lines and the bit lines is not excessively long. It is possible to suppress ON resistance. As a result, it is possible to attain refining of the structure and an increase in a cell current. It is possible to realize an increase in speed of the operation.

In the embodiment, when the semiconductor memory device 1 is manufactured, in a process shown in FIGS. 7A to 7C, the hollow 65 and the memory holes 64 are formed as integral spaces communicating with each other. In a process shown in FIGS. 8A to 8C, after the memory film 30 is formed on the inner surfaces of the hollow 65 and the memory holes 64, the mesh-like connecting member 25 and the silicon pillars 28 are integrally formed on the insides of the hollow 65 and the memory holes 64. Therefore, it is unnecessary to remove a part of the memory film 30 with the etching or the like in order to connect the silicon pillars 28 to the mesh-like connecting member 25. It is unlikely that the memory film 30 is damaged. As a result, it is possible to manufacture the semiconductor memory device having high reliability.

Further, in the semiconductor memory device 1, the column sections 13a are provided in the back gate electrode film 13. Consequently, in the process shown in FIGS. 7A to 7C, when the sacrificial member 60 is removed from the hollow 65, the column sections 13a can support the hollow 65. Therefore, it is possible to prevent the hollow 65 from collapsing. Since the column sections 13a are periodically arrayed, it is possible to more surely support the hollow 65. Further, the column sections 13a are disposed relatively sparsely. The distance between the columns sections 13a adjacent to each other is longer than the distance between the silicon pillars 28 adjacent to each other. Consequently, in the process shown in FIGS. 7A to 7C, the width of a narrowest portion of the hollow 65 is not smaller than the interval between the memory holes 64 adjacent to each other. As a result, in the process shown in FIGS. 8A to 8C, when polysilicon is embedded in the hollow 65 to form the mesh-like connecting member 25, it is possible to surely embed the polysilicon.

Note that, in the example described in the embodiment, the lower sections 41 of the source interconnection members 40 are formed of $n^+$-type polysilicon. However, the material of the lower sections 41 is not limited to this. The lower sections 41 may be formed of $n^+$-type germanium (Ge) or may be formed of $n^+$-type silicon germanium (SiGe). Consequently, it is possible to activate impurities at lower temperature than when polysilicon is used. As a result, it is possible to reduce a heat load applied to the memory cell transistors, the interconnects, and the like. It is possible to manufacture the semiconductor memory device having higher reliability. Instead of the column sections 13a, supporting members made of a material different from the back gate electrode film 13 may be embedded in the throughholes 26. The hollow 65 can also be supported by the supporting members.

Variation of the First Embodiment

A variation of the embodiment is described.

Figure 21A:
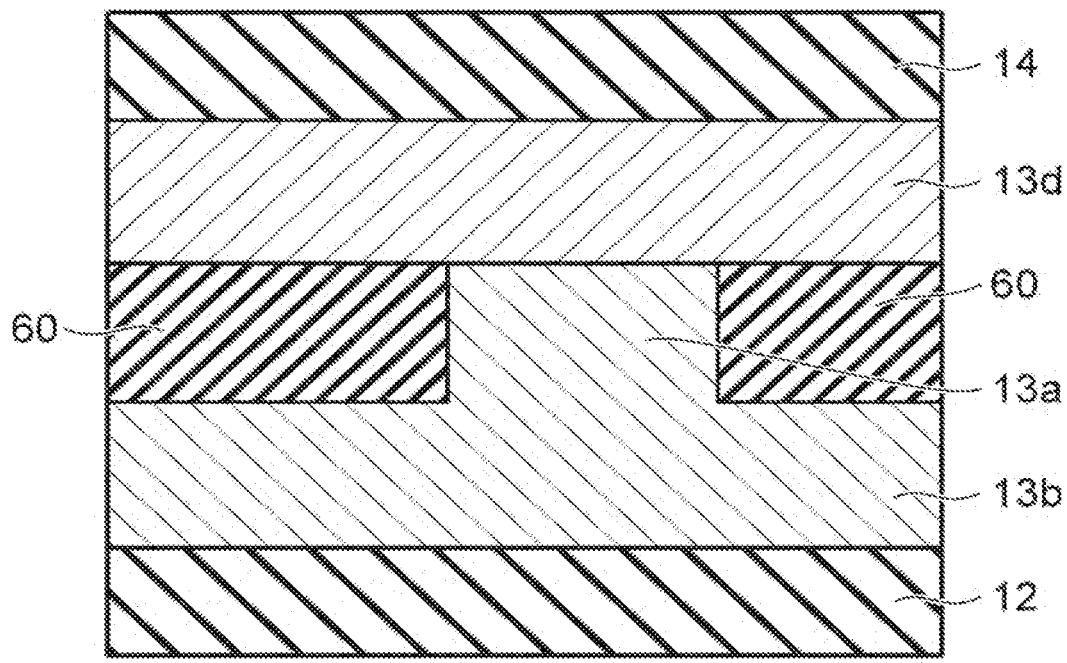
FIGS. 21A and 21B are sectional views illustrating a method for manufacturing a semiconductor memory device according to a variation of the first embodiment.
Figure 21B:
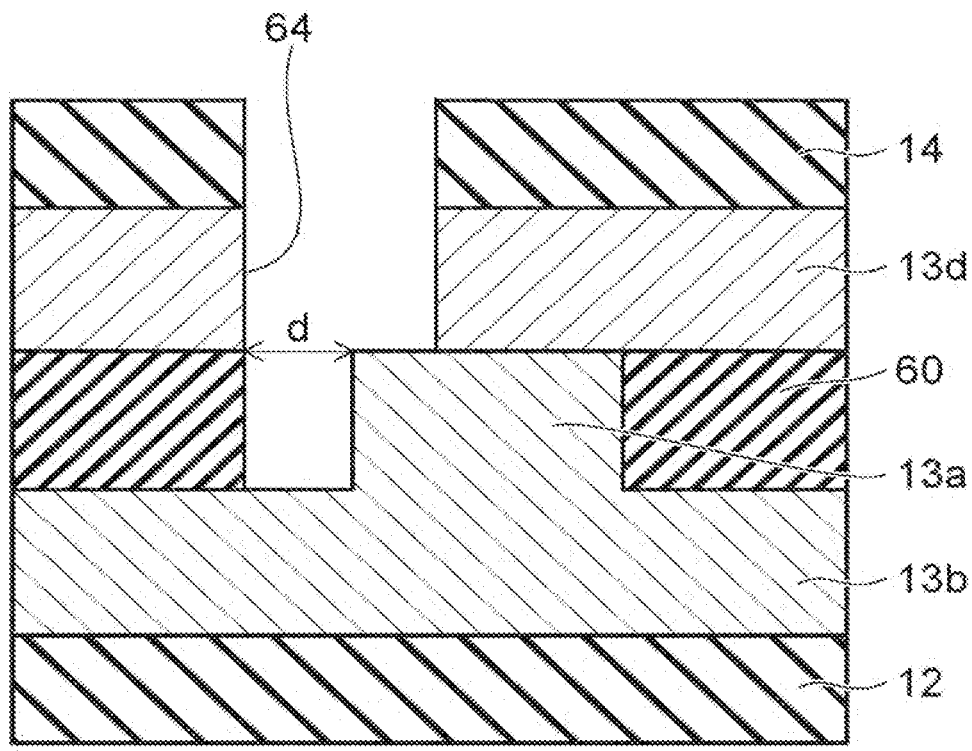

FIGS. 21A and 21B are sectional views illustrating a method for manufacturing a semiconductor memory device according to the variation.

Figure 22:
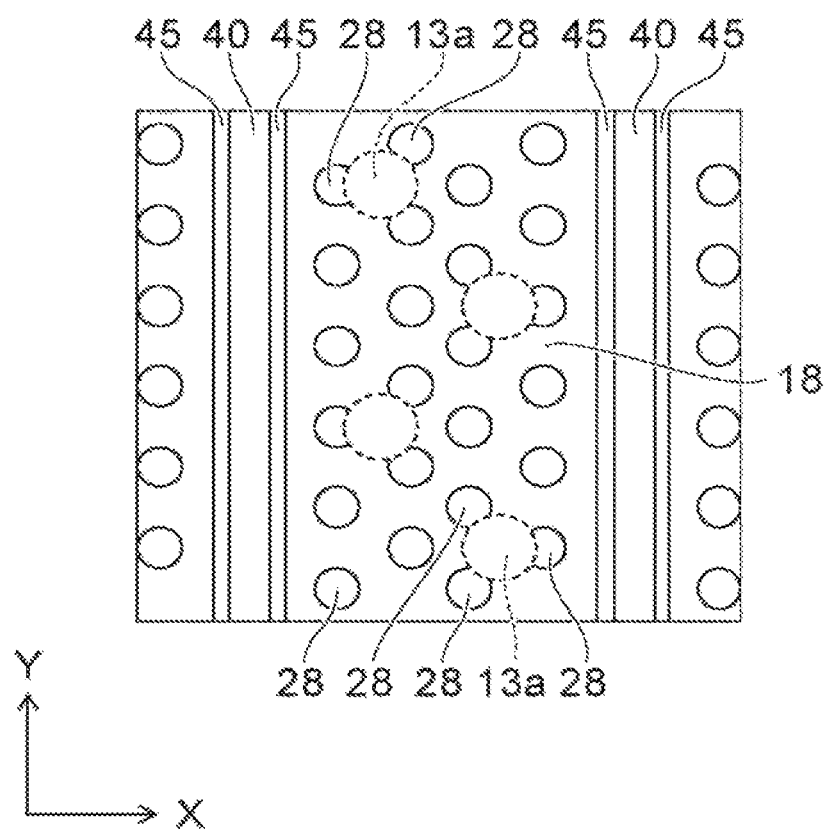
FIG. 22 is a plan view illustrating silicon pillars, source interconnection members, and control gate electrodes in the variation of the first embodiment.

FIG. 22 is a plan view illustrating silicon pillars, source interconnection members, and control gate electrodes in the variation.

As shown in FIGS. 21A and 21B, in the variation, when the memory holes 64 are formed, the column sections 13a of the back gate electrode film 13 are not substantially etched. Consequently, as shown in FIG. 22, in lower sections of a part of the silicon pillars 28, portions overlapping the column sections 13a are cut. For example, when viewed from the Z-direction, in the lower sections of a part of the silicon pillars 28, a part of a circle is cut. The memory holes 64 do not pierce through the back gate electrode film 13.

According to the variation, substantially the entire column sections 13a remain even after the memory holes 64 are formed, it is possible to surely support the hollow 65. However, it is likely that width d of a communicating portion of the memory hole 64 and the hollow 65 decreases and polysilicon is hindered from entering the inside of the hollow 65. Therefore, it is favorable to set a value of the width d to a value not less than a fixed value. Specifically, the width d is favorably set to approximately a double of total film thickness of the memory film 30 and a polysilicon film in the memory holes 64. Components, manufacturing methods, operations, and effects other than those described above in the variation are the same as those in the first embodiment.

Second Embodiment

A second embodiment is described.

Figure 23:
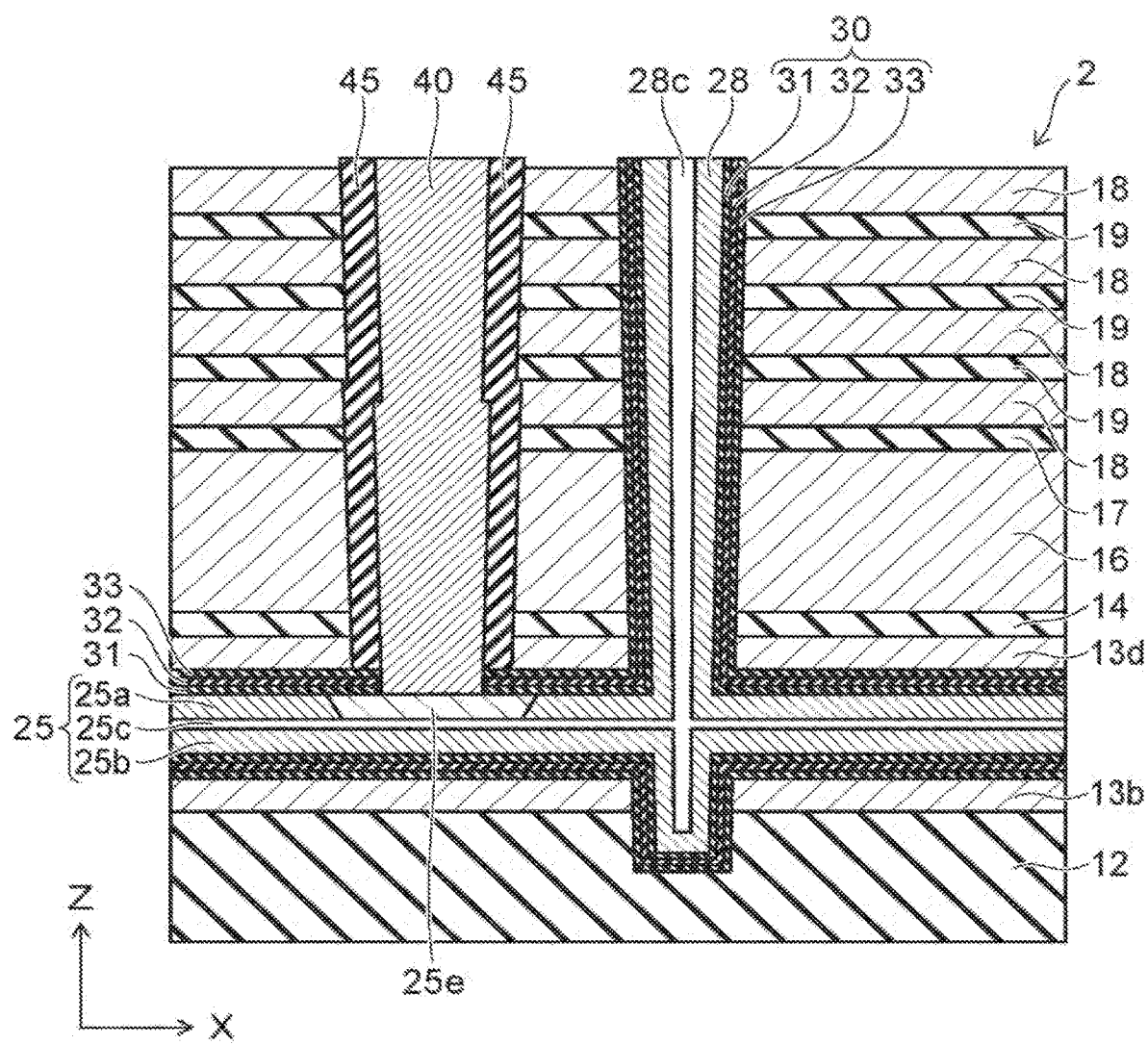
FIG. 23 is a sectional view illustrating a semiconductor memory device according to a second embodiment.

FIG. 23 is a sectional view illustrating a semiconductor memory device according to the embodiment.

As shown in FIG. 23, in a semiconductor memory device 2 according to the embodiment, the entire source interconnection member 40 is formed of a metal material. Impurities are injected into a portion equivalent to a region directly under the source interconnection member 40 and the sidewall insulating films 45 in the upper layer portion 25a of the mesh-like connecting member 25. A high-concentration region 25e, a conductivity type of which is the $n^+$ type, is formed. Effective impurity concentration in the high-concentration region 25e is higher than effective impurity concentration of a portion in contact with the silicon pillar 28 in the upper layer portion 25a. In the semiconductor memory device 2 according to the embodiment, the silicon pillar 28 does not pierce through the back gate electrode film 13.

The semiconductor memory device 2 according to the embodiment can be manufactured by a method described below. That is, in a process shown in FIGS. 11A to 11C, after the slits 71 are formed, impurities are ion-injected into the upper layer portion 25a of the mesh-like connecting member 25 via the slits 71 to form the high-concentration region 25e. In a process shown in FIGS. 15A to 15C, the slits 71 are filled by a metal material to form the source interconnection members 40.

In the semiconductor memory device 2, when the high-concentration region 25e can be formed under good control, it is possible to improve a cutoff characteristic and improve selectivity of a writing operation by changing the back gate transistors to the OFF state. On the other hand, when the formation of the high-concentration region 25e depends on a state of the mesh-like connecting member 25 and becomes unstable, it is favorable to write data according to the operation of the lower selection transistor by changing the back gate transistors to the ON state.

According to the embodiment, it is possible to reduce the resistivity of the source interconnection members 40 by forming the entire source interconnection members 40 with the metal material. The source interconnection members 40 can be ohmic-connected to the mesh-like connecting member 25 via the high-concentration region 25e. Further, the high-concentration region 25e functions as a memory cell transistor and an electron supply source. Components, manufacturing methods, operations, and effects other than those described above in the embodiment are the same as those in the first embodiment.

Third Embodiment

A third embodiment is described.

Figure 24:
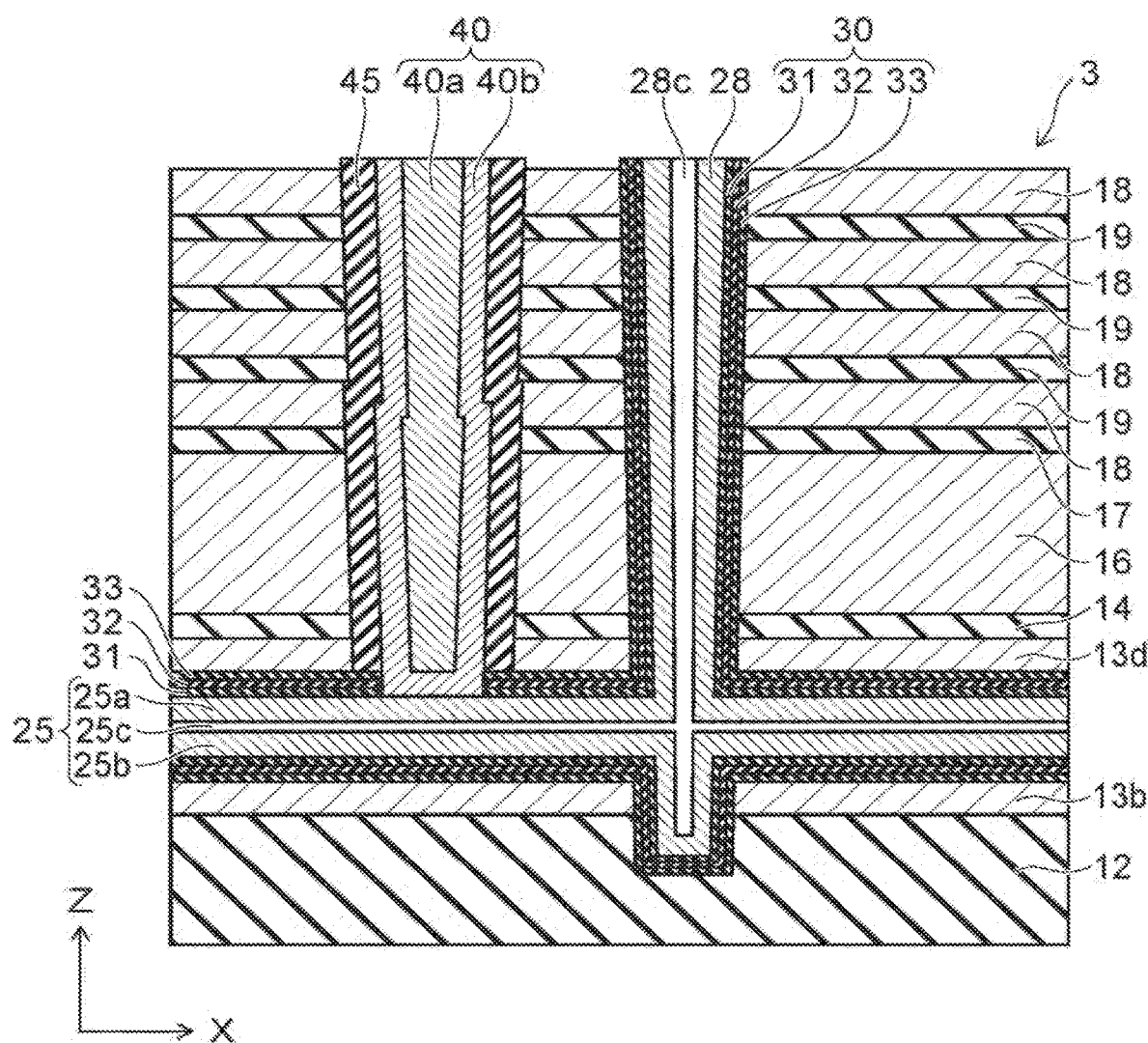
FIG. 24 is a sectional view illustrating a semiconductor memory device according to a third embodiment.

FIG. 24 is a sectional view illustrating a semiconductor memory device according to the embodiment.

As shown in FIG. 24, in a semiconductor memory device 3 according to the embodiment, the source interconnection member 40 is formed of a core section 40a and a peripheral section 40b that covers the lower surface and both the side surfaces of the core section 40a. The core section 40a is formed of a metal material, for example, a (Ti/TiN/W) stacked film. The peripheral section 40b is formed of a semiconductor material, for example, $n^+$-type polysilicon. Consequently, it is possible to further reduce a resistance value of the source interconnection member 40. Components, manufacturing methods, operations, and effects other than those described above in the embodiment are the same as those in the first embodiment.

Note that the entire upper section of the source interconnection member 40 may be formed of a metal material as in the first embodiment. Consequently, it is possible to further reduce the resistance value of the source interconnection member 40. It is possible to simultaneously realize a reduction in costs and an increase in speed of the semiconductor memory device.

Variation of the Third Embodiment

A variation of the third embodiment is described.

Figure 25:
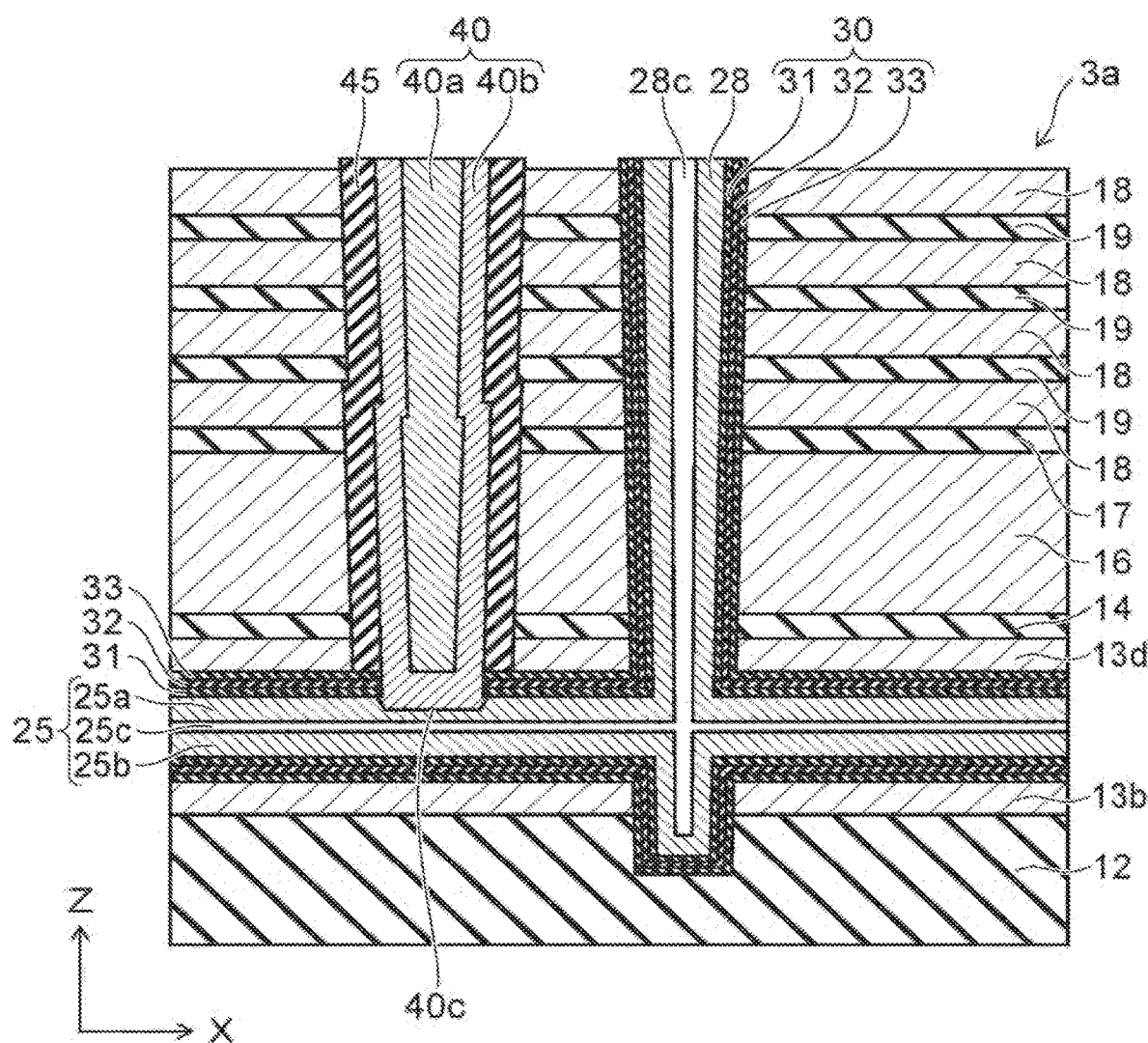
FIG. 25 is a sectional view illustrating a semiconductor memory device according to a variation of the third embodiment.

FIG. 25 is a sectional view illustrating a semiconductor memory device according to the variation.

As shown in FIG. 25, in a semiconductor memory device 3a according to the variation, the peripheral section 40b of the source interconnection member 40 is silicided and is formed of, for example, titanium silicide ($TiSi_2$). By forming an $n^+$-type polysilicon layer thin compared with the third embodiment, the entire polysilicon layer is consumed for the silicidation. It is possible to realize a structure according to the variation. In this case, the peripheral section 40b penetrates into the mesh-like connecting member 25. A penetrating section 40c is formed.

According to this variation, compared with the third embodiment, it is possible to further reduce a resistance value of the source interconnection member 40. Impurities, for example, phosphorus (P) and arsenic (As) included in the peripheral section 40b are pushed out from the peripheral section 40b according to a so-called "snow shoveling effect". It is possible to more effectively supply impurities serving as a donor to the mesh-like connecting member 25. Components, manufacturing methods, operations, and effects other than those described above in the variation are the same as those in the third embodiment.

Fourth Embodiment

A fourth embodiment is described.

FIG. 26A is a plan view illustrating the semiconductor memory device according to the first embodiment. FIG. 26B is a plan view illustrating a semiconductor memory device according to the fourth embodiment.

As shown in FIG. 26A, in the semiconductor memory device 1 according to the first embodiment, the flat portion of the source interconnection member 40 is provided for each of the four columns of the silicon pillars 28 extending in the Y-direction. The selection gate electrode film 16 is divided by the source interconnection member 40. In other words, the flat portion of the source interconnection member 40 is provided for each of the slits 71 that divide the selection gate electrode film 16.

On the other hand, as shown in FIG. 26B, in a semiconductor memory device 4 according to the fourth embodiment, as in the first embodiment, the selection gate electrode film 16 is divided for each of the four columns of the silicon pillars 28 by the slits 71. However, the source interconnection members 40 are not always disposed for all the slits 71. One flat portion of the source interconnection member 40 is disposed for every four slits 71. Such a structure can be realized by setting the width of the slits 71 in two levels and setting the width of the slits 71 not provided with the source interconnection members 40 smaller than the width of the slits 71 provided with the source interconnection members 40 to thereby close the narrow slits 71 with the sidewall insulating films 45. The slits 71 may be formed dividedly twice according to the widths of the slits 71 or may be formed in one process.

According to the embodiment, compared with the first embodiment, it is possible to more highly integrate the semiconductor memory device and further reduce costs. On the other hand, according to the first embodiment, by arraying the source interconnection members 40 at a cycle shorter than the cycle in the embodiment, it is possible to surely suppress ON resistance of the NAND string. Components, manufacturing methods, operations, and effects other than those described above in the embodiment are the same as those in the first embodiment.

Fifth Embodiment

A fifth embodiment is described.

Figure 27:
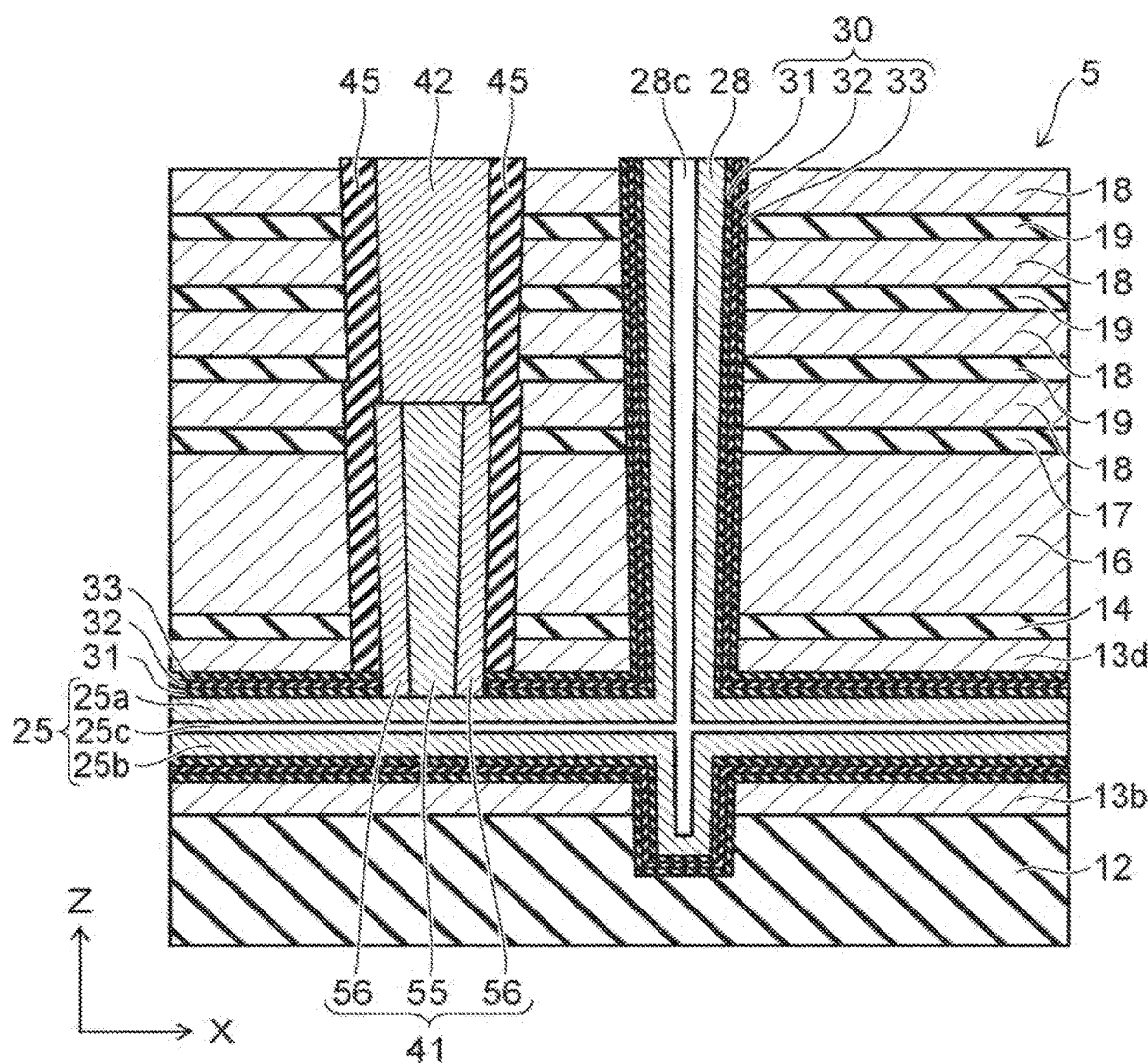
FIG. 27 is a sectional view illustrating a semiconductor memory device according to a fifth embodiment.

FIG. 27 is a sectional view illustrating a semiconductor memory device according to the embodiment.

As shown in FIG. 27, in a semiconductor memory device 5 according to the embodiment, a p$^+$-type semiconductor portion 55 and n$^+$-type semiconductor portions 56 are provided in the lower section 41 of the source interconnection member 40. Both of the p$^+$-type semiconductor portion 55 and the n$^+$-type semiconductor portions 56 are made of a semiconductor material, for example, polysilicon and are in contact with the mesh-like connecting member 25. For example, the p$^+$-type semiconductor portion 55 is provided in the width direction center portion of the lower section 41. The n$^+$-type semiconductor portions 56 are provided to sandwich the p$^+$ semiconductor portion 55.

According to the embodiment, the p$^+$-type semiconductor portion 55 and the n$^+$-type semiconductor portions 56 are provided in contact with the mesh-like connecting member 25. Consequently, according to the potential of the back gate electrode film 13, it is possible to switch the polarity of a lower selection transistor realized by the selection gate electrode film 16. That is, if positive potential is applied to the back gate electrode film 13, electrons are filled in the mesh-like connecting member 25 and electrically integrated with the n$^+$-type semiconductor portions 56. Therefore, when viewed from the selection gate electrode film 16, the n$^+$-type semiconductor layer is close to the vicinity. The lower selection transistor functions as an NMOS. On the other hand, if negative potential is applied to the back gate electrode film 13, holes are filled in the mesh-like connecting member 25 and electrically integrated with the p$^+$-type semiconductor portion 55. Therefore, when viewed from the selection gate electrode film 16, the p$^+$-type semiconductor layer is close to the vicinity. The lower selection transistor functions as a PMOS.

Consequently, in a writing operation and a readout operation, if a positive potential is applied to the back gate electrode film 13 to cause the lower selection transistor to function as the NMOS, it is possible to supply electrons to the silicon pillar 28 of the selected string.

On the other hand, in an erasing operation, if negative potential is applied to the back gate electrode film 13 to cause the lower selection transistor to function as the PMOS, by applying negative potential to the selection gate electrode film 16 and changing the lower selection transistor to the ON state, it is possible to supply holes from the source interconnection member 40 into the silicon pillar 28 via the p$^+$-type semiconductor portion and the mesh-like connecting member 25 and raise the pressure in the silicon pillar 28. Consequently, if holes are generated by a GIDL (Gate-Induced Drain Leakage) current at an edge of the selection gate electrode film 16 and injected into the silicon pillar 28, it is unnecessary to raise the pressure in the silicon pillar 28. Therefore, it is unnecessary to provide a high-concentration impurity region in the vicinity of the selection gate electrode film 16 in order to efficiently generate the GIDL current. It is possible to suppress a leakage current in the OFF state. Components, manufacturing methods, operations, and effects other than those described above in the embodiment are the same as those in the first embodiment.

Sixth Embodiment

A sixth embodiment is described.

Figure 28:
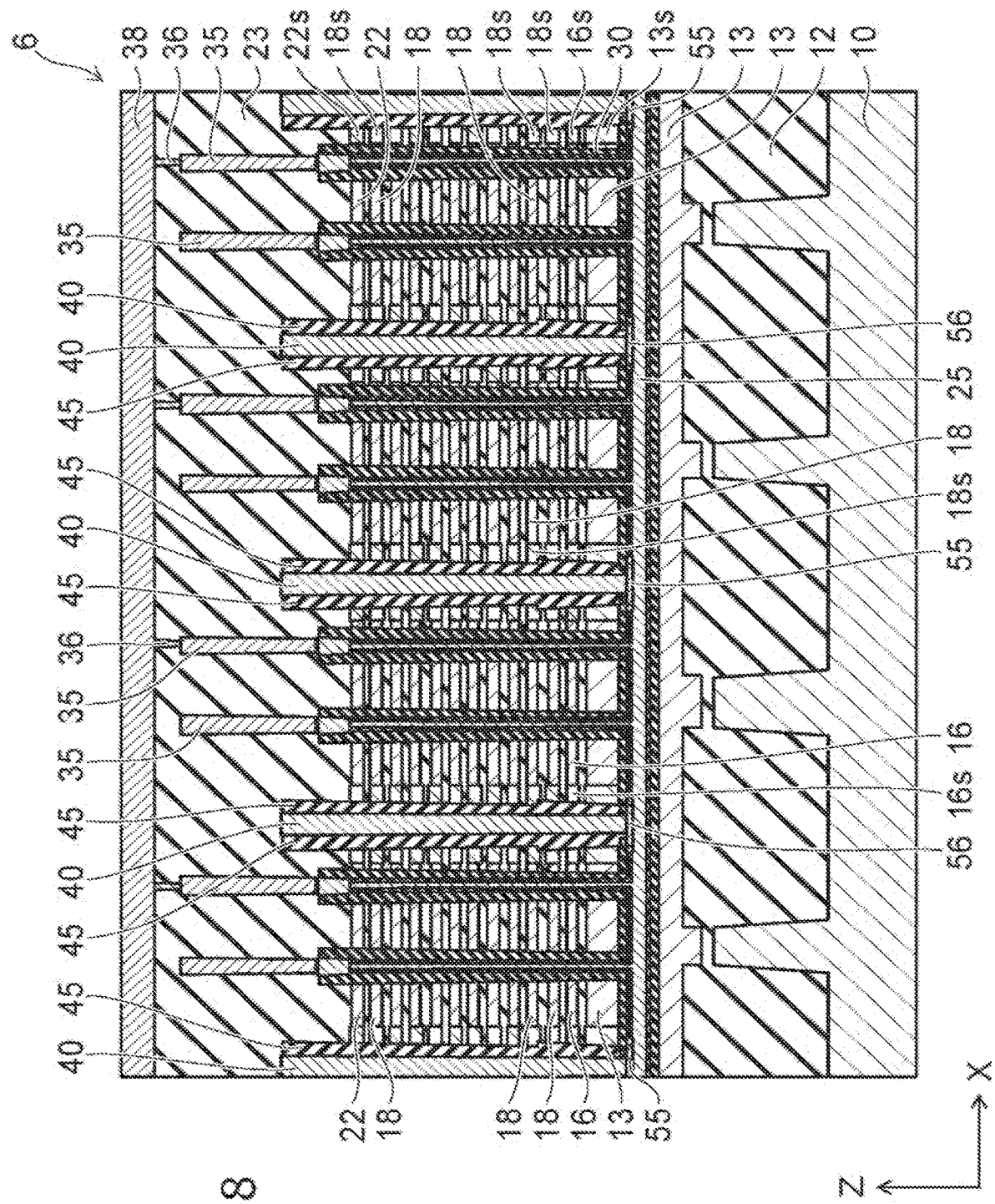
FIG. 28 is a sectional view illustrating a semiconductor memory device according to a sixth embodiment.

FIG. 28 is a sectional view illustrating a semiconductor memory device according to the embodiment.

As shown in FIG. 28, in a semiconductor memory device 6 according to the embodiment, a plurality of flat portions of the source interconnection members 40 are arrayed at equal intervals along the X-direction. The p$^+$-type semiconductor portions 55 and the n$^+$-type semiconductor portions 56 are alternately formed in regions directly under the flat portions. That is, one of the p$^+$-type semiconductor portion 55 and the n$^+$-type semiconductor portion 56 is formed in a region directly under certain one flat portion. The p$^+$-type semiconductor portions 55 and the n$^+$-type semiconductor portions 56 are in contact with the mesh-like connecting member 25. The back gate electrode film 13, the selection gate electrode film 16, the control gate electrode films 18, and portions opposed to the sidewall insulating films 45 in the selection gate electrode film 22 are respectively silicided silicide portions 13s, 16s, 18s, and 22s.

During a writing operation and a readout operation, the source interconnection members 40 connected to the n+-type semiconductor portions 56 are used as source electrodes. For example, the reference potential Vss (e.g., 0 V) is applied to the source interconnection members 40 connected to the n+-type semiconductor portions 56. Potential (e.g., 5 V) higher than the reference potential Vss is applied to the back gate electrode film 13. Consequently, a lower selection transistor functions as an NMOS. On the other hand, the source interconnection members 40 connected to the p+-type semiconductor portions 55 are set in a floating state.

During an erasing operation, the source interconnection members 40 connected to the p+-type semiconductor portions 55 are used as source electrodes. For example, erasing potential (e.g., 23 V) is applied to the source interconnection members 40 connected to the p+-type semiconductor portions 55. Potential (e.g., 15 V) lower than the erasing potential is applied to the back gate electrode film 13. Consequently, the lower selection transistor functions as a PMOS. On the other hand, the source interconnection members 40 connected to the n+-type semiconductor portions 56 are set in the floating state.

In the embodiment, as in the fifth embodiment, holes can be injected into the silicon pillars 28 by filling the holes in the mesh-like connecting member 25 during the erasing operation and causing the lower selection transistor to operate as the PMOS. Only one of the p+-type semiconductor portion 55 and the n+-type semiconductor portion 56 is formed in a region directly under one flat portion of the source siring member 40. Therefore, a manufacturing process is easy. Components, manufacturing methods, operations, and effects other than those described above in the embodiment are the same as those in the first embodiment.

Note that, usually, time consumed for the erasing operation is longer than time consumed for the writing operation and time consumed for the readout operation. Therefore, the p+-type semiconductor portions 55 and the flat portions of the source interconnection members 40 connected to the p+-type semiconductor portions 55 may be curtailed. On the other hand, if the number of the n+-type semiconductor portions 56 and the number of the flat portions of the source interconnection members connected to the n+-type semiconductor portions 56 are reduced, a resistance value from the source lines 44 to the mesh-like connecting member 25 increases. Therefore, it is favorable to secure a certain degree of arrangement density.

Seventh Embodiment

A seventh embodiment is described.

Figure 29:
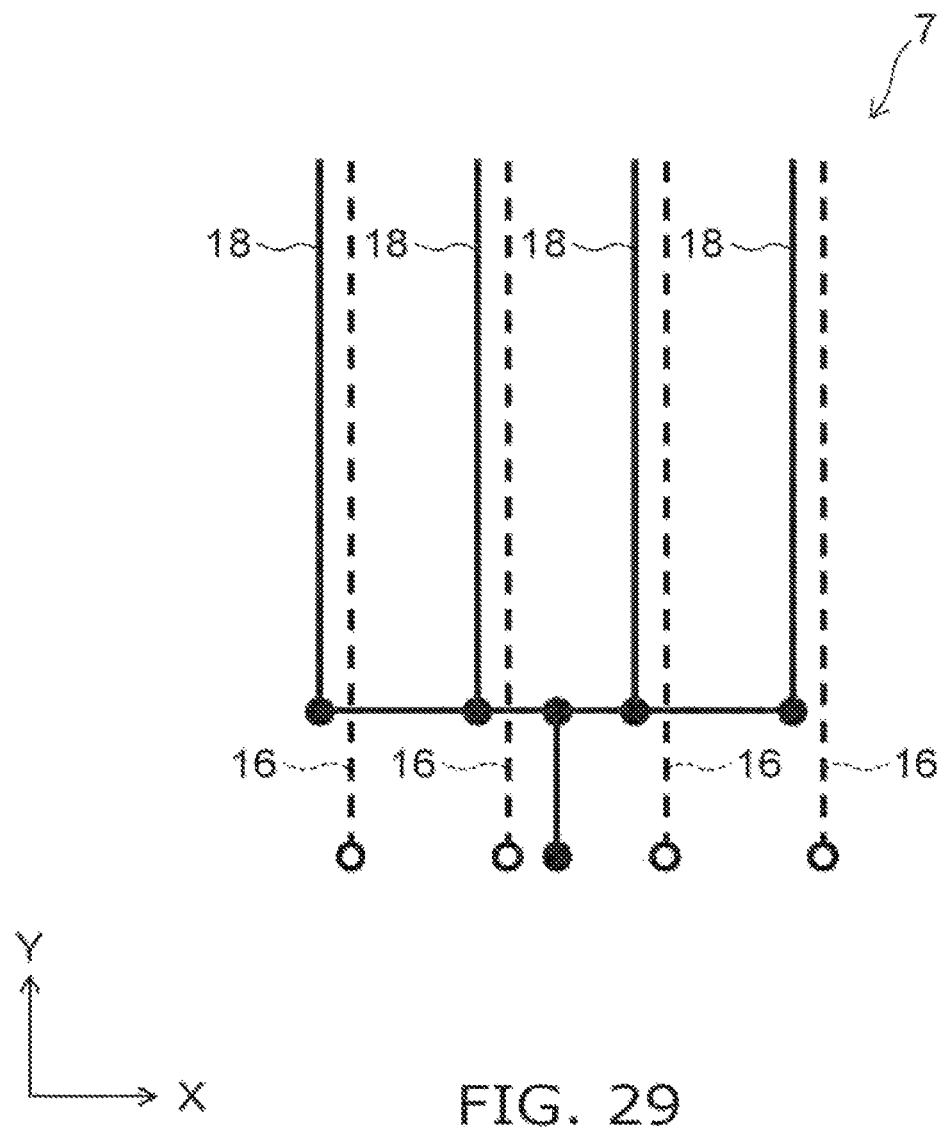
FIG. 29 is a diagram illustrating a positional relation of interconnects in a semiconductor memory device according to a seventh embodiment.

FIG. 29 is a diagram illustrating a positional relation of interconnects in a semiconductor memory device according to the embodiment.

FIGS. 30A to 30D are plan views illustrating the semiconductor memory device according to the embodiment. FIG. 30A shows all layers. FIG. 30B shows a back gate electrode film. FIG. 30C shows lower selection gate electrode films. FIG. 30D shows a control gate electrode film.

Figure 31A:
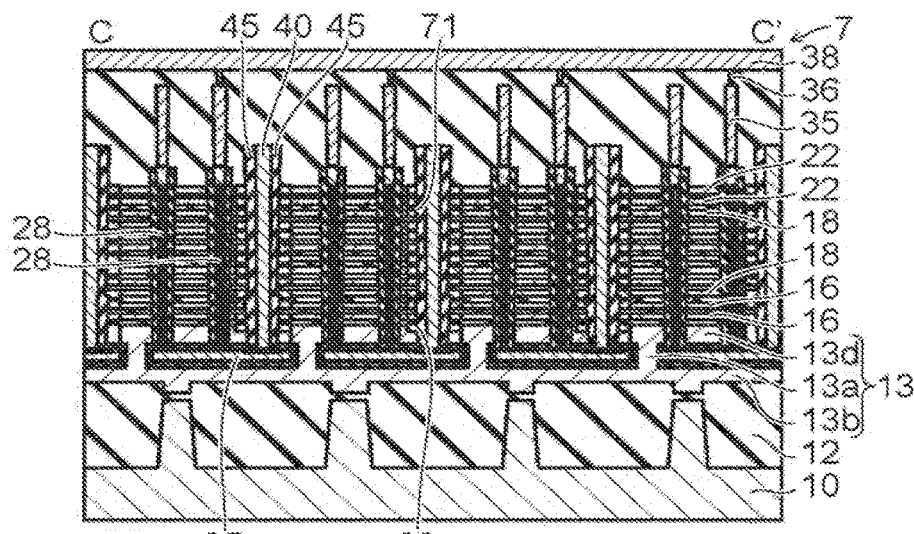
FIG. 31A is a sectional view taken along line C-C' shown in FIG. 30A.
Figure 31B:
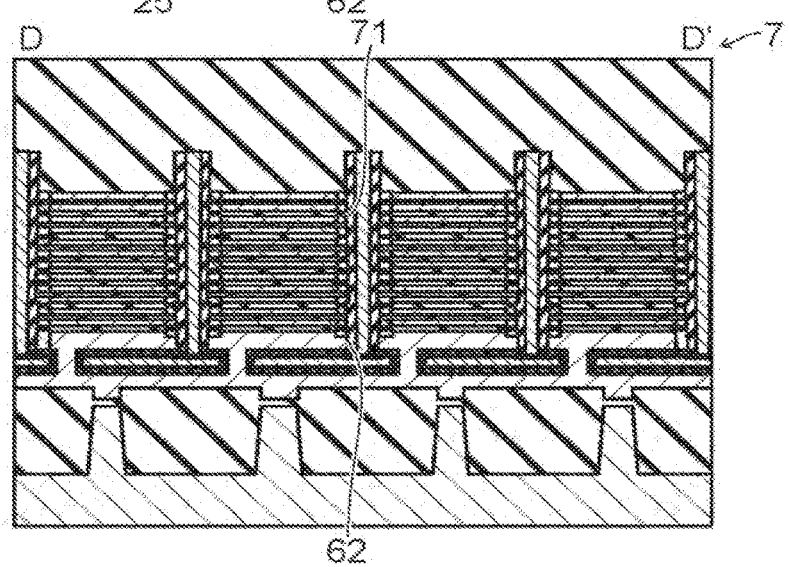
FIG. 31B is a sectional view taken along line D-D' shown in FIG. 30A.
Figure 31C:
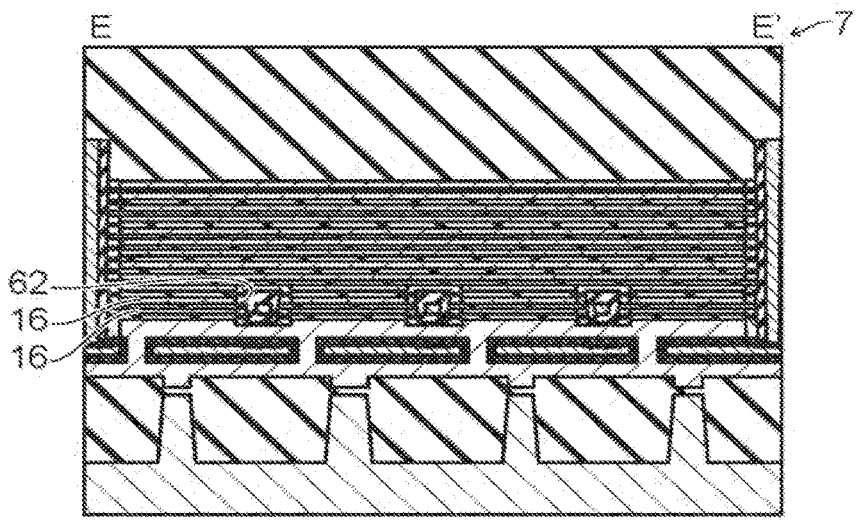
FIG. 31C is a sectional view taken along line E-E' shown in FIG. 30A.

FIG. 31A is a sectional view taken along line C-C' shown in FIG. 30A. FIG. 31B is a sectional view taken along D-D' shown in FIG. 30A. FIG. 31C is a sectional view taken along line E-E' shown in FIG. 30A.

As shown in FIG. 29, in a semiconductor memory device 7 according to the embodiment, the selection gate electrode films 16 and 22 divided by the source interconnection members 40 (see FIG. 31A) are insulated from each other. However, the control gate electrode films 18 divided by the source interconnection members 40 are bound at one end portion in the Y-direction of the stacked body and connected to each other.

Specifically, as shown in FIG. 30B and FIGS. 31A to 31C, the back gate electrode film 13 expands over the entire surface below the stacked body and is formed as a single conductive film. As shown in FIGS. 31A to 31C, the mesh-like connecting member 25 is divided for each of blocks. The shape of divided portions is a belt shape extending in the Y-direction. As shown in FIG. 30C and FIGS. 31A to 31C, the lower selection gate electrode film 16 is also divided for each of the blocks. The shape of divided portions is a belt shape extending in the Y-direction. The same applies to the upper selection gate electrode film 22. As shown in FIG. 30D and FIGS. 31A to 31C, the control gate electrode films 18 are divided for each of the blocks in the Y-direction center portions through which the silicon pillars 28 pierce. However, the control gate electrode films 18 are connected to one another among the blocks at the Y-direction end portions processed into a stair shape.

A method for manufacturing the semiconductor memory device according to the embodiment is described.

Differences from the method for manufacturing the semiconductor memory device according to the first embodiment (see FIGS. 4 to 20) are mainly described.

In the embodiment, in a process shown in FIGS. 4A to 4C, the recessed sections 13c of the back gate electrode film 13 are formed for each of the blocks. In a process shown in FIGS. 6A to 6C, as shown in FIG. 30A, the slits 62 are formed to completely divide the selection gate electrode film 16 for each of the blocks. In a process shown in FIGS. 10A to 10C, as shown in FIG. 30A, the slits 71 are discontinuously formed along the Y-direction. Consequently, the control gate electrode films 18 are partially divided and partially connected to one another.

In a process shown in FIGS. 12A to 12C, the selection gate electrode film 16, the control gate electrode films 18, and the selection gate electrode film 22 are silicided via the slits 71 and 62. In this case, since the slits 71 are discontinuously formed, the electrode films are efficiently silicided. Consequently, the semiconductor memory device 7 shown in FIG. 29, FIGS. 30A to 30D, and FIGS. 31A to 31C are manufactured.

In the embodiment, the mesh-like connecting member 25 is divided into the plurality of portions for each of the blocks. Therefore, during the readout operation, the potential of a portion to which a selected string is not connected may be the same as the potential of the bit lines. Consequently, it is possible to reduce a leakage current flowing to a block not provided with the selected string.

According to the embodiment, since the plurality of control gate electrode films 18 are bound, the driving of the control gate electrode films 18 is simplified. It is possible to attain a reduction in the size of a driving circuit. Components, manufacturing methods, operations, and effects other than those described above in the embodiment are the same as those in the first embodiment.

Eighth Embodiment

An eighth embodiment is described.

Figure 32:
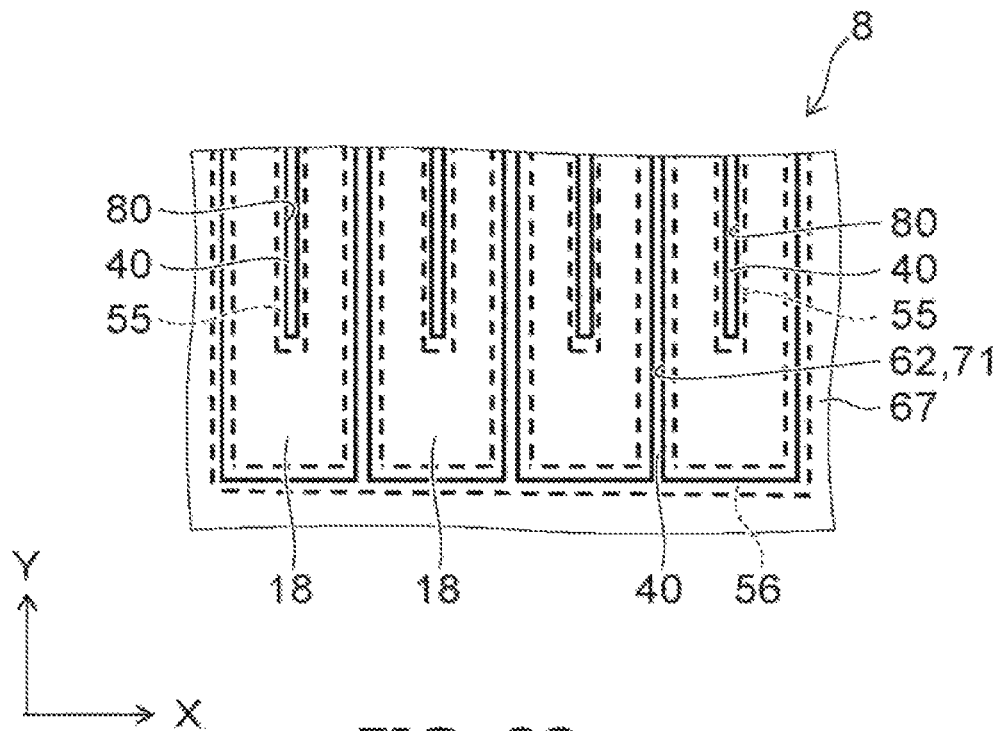
FIG. 32 is a plan view illustrating a semiconductor memory device according to an eighth embodiment.

FIG. 32 is a plan view illustrating a semiconductor memory device according to the embodiment.

As shown in FIG. 32, in a semiconductor memory device 8 according to the embodiment, in the stacked body 67, the slits 62 are formed to completely divide the selection gate electrode film 16 for each of blocks. The slits 71 are formed to completely divide the control gate electrode films 18 for each of the blocks. The source interconnection members 40 are provided on the insides of the slits 62 and 71. The $n^+$-type semiconductor portions 56 are provided in regions including the regions directly under the source interconnection members 40. The source interconnection members 40 are connected to the mesh-like connecting member 25 (see FIG. 31A) via the $n^+$-type semiconductor portions 56.

In the stacked body 67, slits 80 are formed in the X-direction center portions in the blocks. The slits 80 extend along the YZ plane and reach the mesh-like connecting member 25. The source interconnection members 40 are provided on the insides of the slits 80. The $p^+$-type semiconductor portions 55 are formed in regions directly under the slits 80 in the mesh-like connecting member 25. The $p^+$-type semiconductor portions 55 are connected to a driving circuit via the source interconnection members 40. That is, only the $n^+$-type semiconductor portions 56 are provided in regions directly under the source interconnection members 40 that divide the selection gate electrode film 16 for each of the blocks. The $p^+$-type semiconductor portions 55 are provided on the insides of the blocks.

In the embodiment, in a process shown in FIGS. 13A to 13C, after the slits 71 are caused to reach the mesh-like connecting member 25, impurities serving as a donor are ion-injected via the slits 71 to form the $n^+$-type semiconductor portions 56 in the mesh-like connecting member 25. Subsequently, after the slits 71 are filled with a sacrificial member, the slits 80 are formed in the stacked body 67. Impurities serving as an acceptor are ion-injected via the slits 80 to form the $p^+$-type semiconductor portions 55 in the mesh-like connecting member 25. Subsequently, the sacrificial member is removed from the slits 71, the sidewall insulating films 45 are formed on the side surfaces of the slits 71 and 80, and the source interconnection members 40 are embedded in the insides of the slits 71 and 80. In this way, the semiconductor memory device 8 according to the embodiment is manufactured. Components, manufacturing methods, operations, and effects other than those described above in the embodiment are the same as those in the seventh embodiment.

Variation of the Eighth Embodiment

A variation of the eighth embodiment is described.

Figure 33:
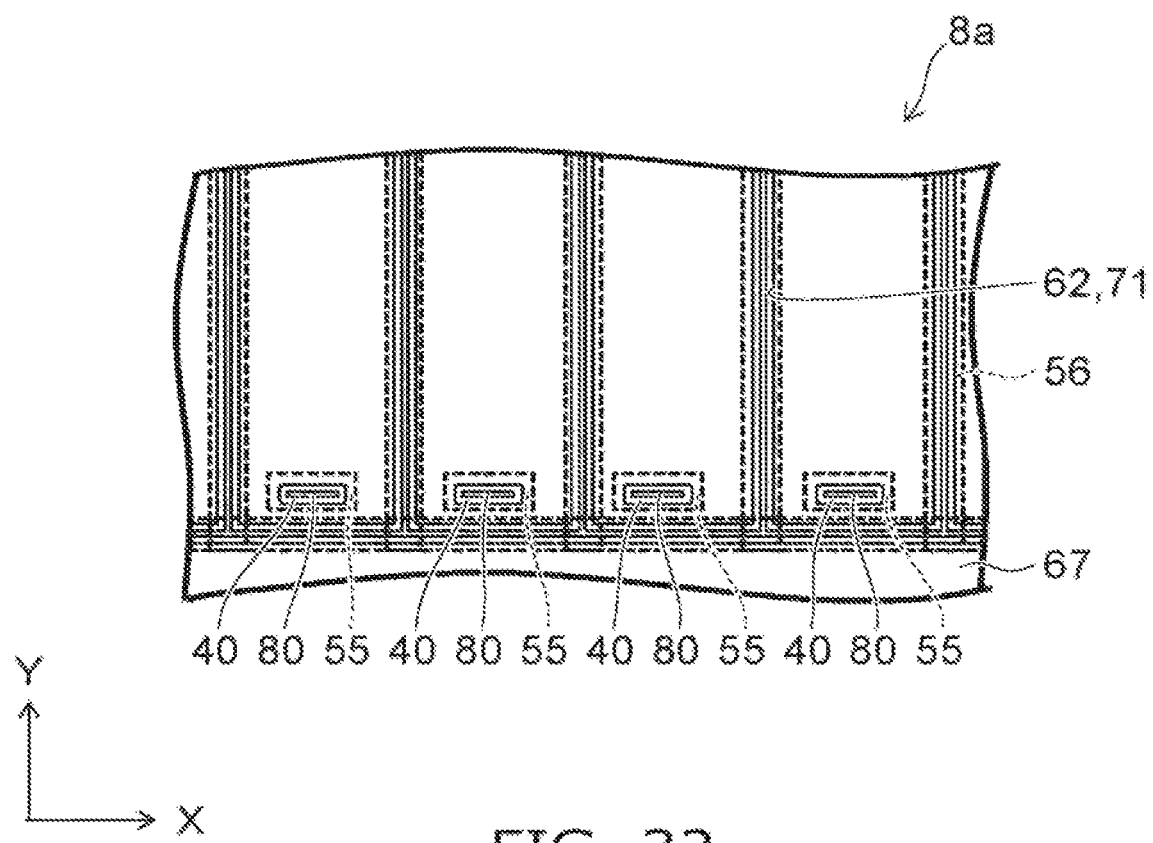
FIG. 33 is a plan view illustrating a semiconductor memory device according to a variation of the eighth embodiment.

FIG. 33 is a plan view illustrating a semiconductor memory device according to the variation.

As shown in FIG. 33, in a semiconductor memory device 8a according to the variation, the slits 80 and the $p^+$-type semiconductor portions 55 are provided at one end portions in the Y-direction of blocks. According to the variation, effects same as the effects in the eighth embodiment can be obtained.

Note that forming positions of the slits 80 and the $p^+$-type semiconductor portions 55 are not limited to the X-direction center portions and the Y-direction end portions. The slits 80 and the $p^+$-type semiconductor portions 55 may be provided in any positions as long as the slits 80 and the $p^+$-type semiconductor portions 55 can come into contact with the mesh-like connecting member 25. As described above, usually, longer time is consumed for an erasing operation than a writing operation and a readout operation. Therefore, very high-speed driving is not requested for the erasing operation. The $p^+$-type semiconductor portions 55 may be present in positions apart from the sections of the mesh-like connecting member 25. Components, manufacturing methods, operations, and effects other than those described above in the embodiment are the same as those in the eighth embodiment.

Ninth Embodiment

A ninth embodiment is described.

Figure 34A:
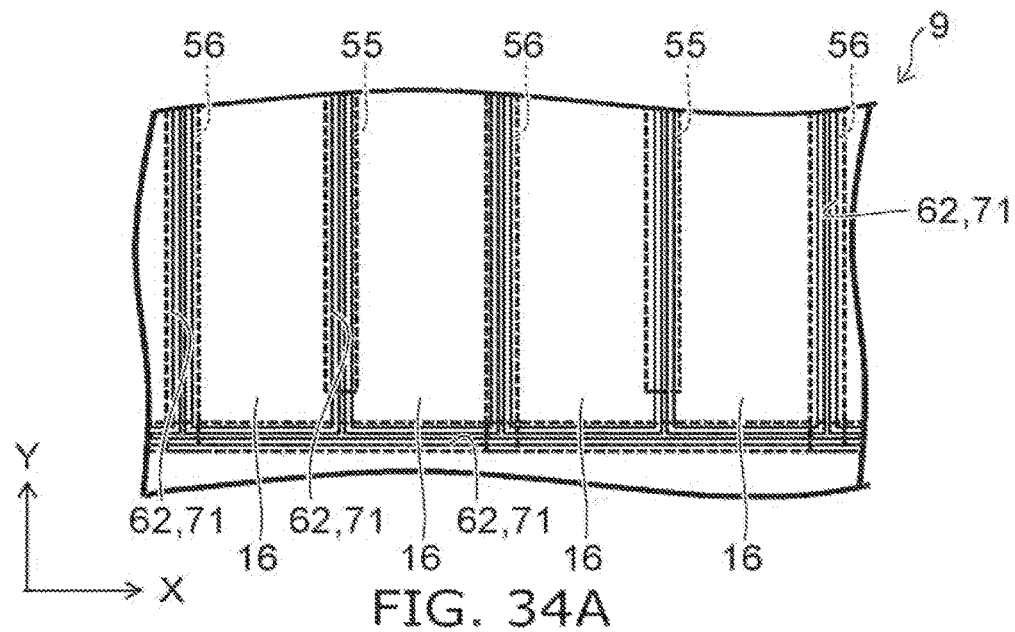
FIG. 34A is a plan view illustrating a semiconductor memory device according to a ninth embodiment.
Figure 34B:
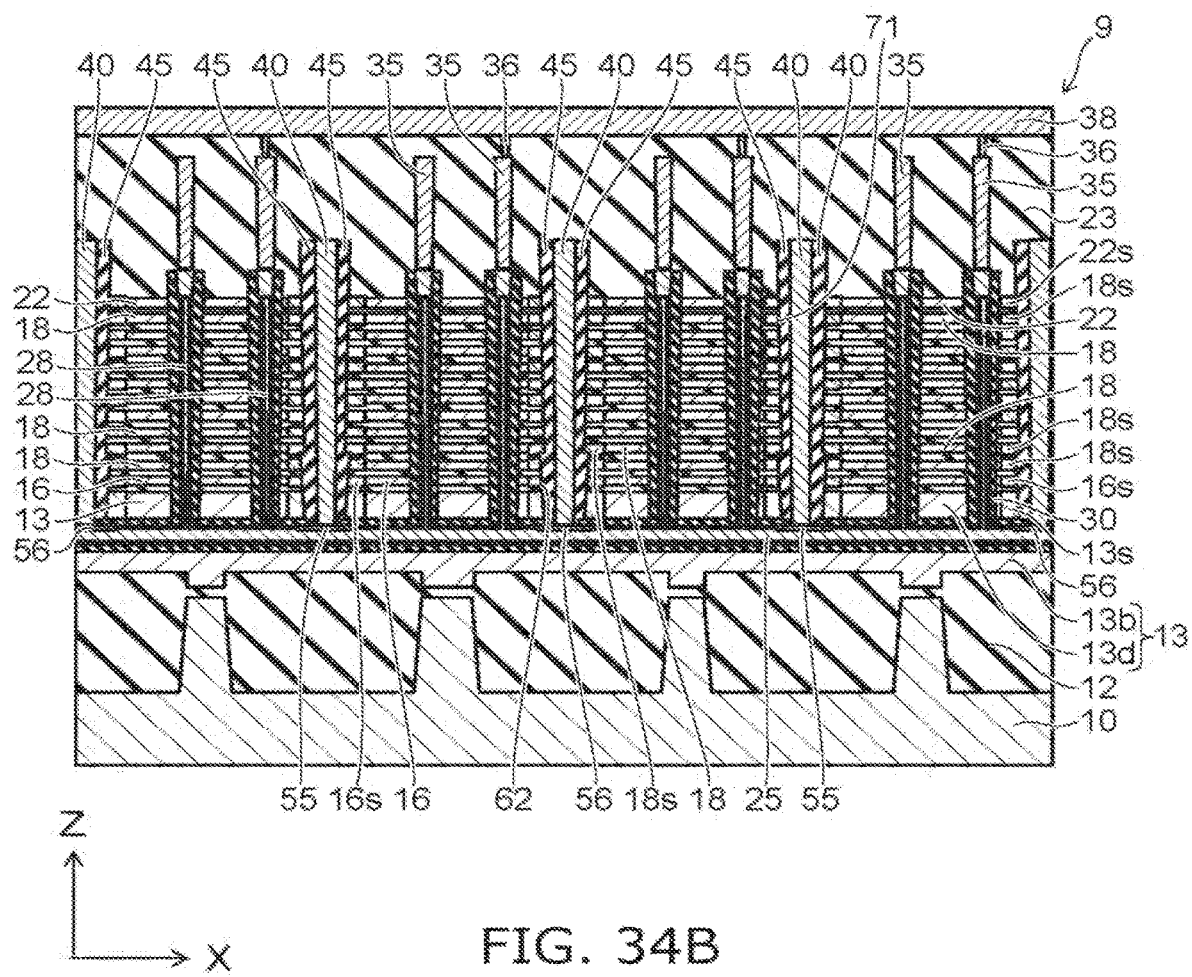
FIG. 34B is a sectional view of the semiconductor memory device according to the ninth embodiment.

FIG. 34A is a plan view illustrating a semiconductor memory device according to the embodiment. FIG. 34B is a sectional view of the semiconductor memory device.

As shown in FIGS. 34A and 34B, in a semiconductor memory device 9 according to the embodiment, the slits 62 and 71 are formed to completely divide the selection gate electrode film 16, the control gate electrode films 18, and the selection electrode film 22 for each of blocks. The $p^+$-type semiconductor portions 55 and the $n^+$-type semiconductor portions 56 are alternately disposed along the X-direction in regions directly under the slits 71. However, in the regions directly under the slits 71, the $p^+$-type semiconductor portions 55 and the $n^+$-type semiconductor portions 56 are spaced from each other. Flat portions connected to $p^+$-type semiconductor portions 55 and flat portions connected to the $n^+$-type semiconductor portions 56 in the source interconnection members 40 are insulated from each other. Therefore, the $p^+$-type semiconductor portions 55 and the $n^+$-type semiconductor portions 56 are insulated from each other.

According to the embodiment, it is possible to insulate the $p^+$-type semiconductor portions 55 and the $n^+$-type semiconductor portions 56 from each other and connect the $p^+$-type semiconductor portions 55 and the $n^+$-type semiconductor portions respectively to different driving circuits while completely dividing the selection gate electrode film 16, the control gate electrode films 18, and the selection gate electrode film 22 for each of the blocks. Consequently, a degree of freedom of driving increases. Components, operations, and effects other than those described above in the embodiment are the same as those in the seventh embodiment.

First Specific Example of the Ninth Embodiment

A first specific example of the ninth embodiment is described.

The specific example is an example of a method for manufacturing the semiconductor memory device according to the ninth embodiment.

Figure 35A:
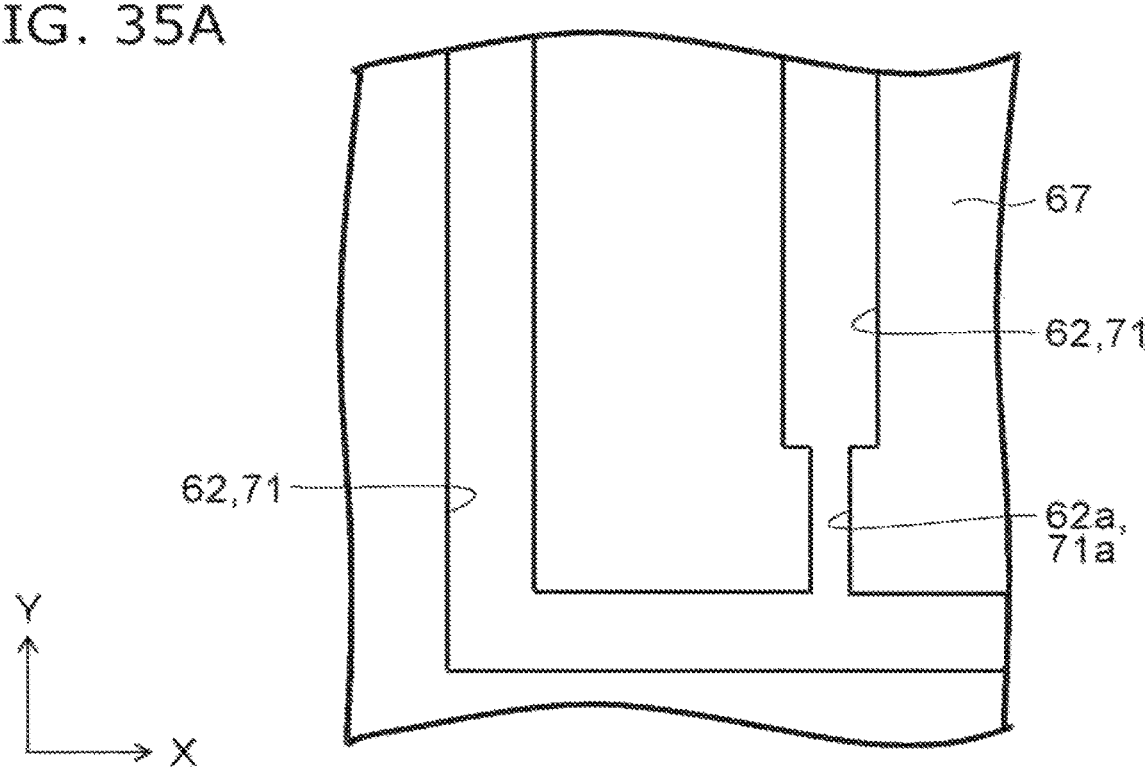
FIGS. 35A and 35B are plan views illustrating a method for manufacturing a semiconductor memory device according to a first specific example of the ninth embodiment.
Figure 35B:
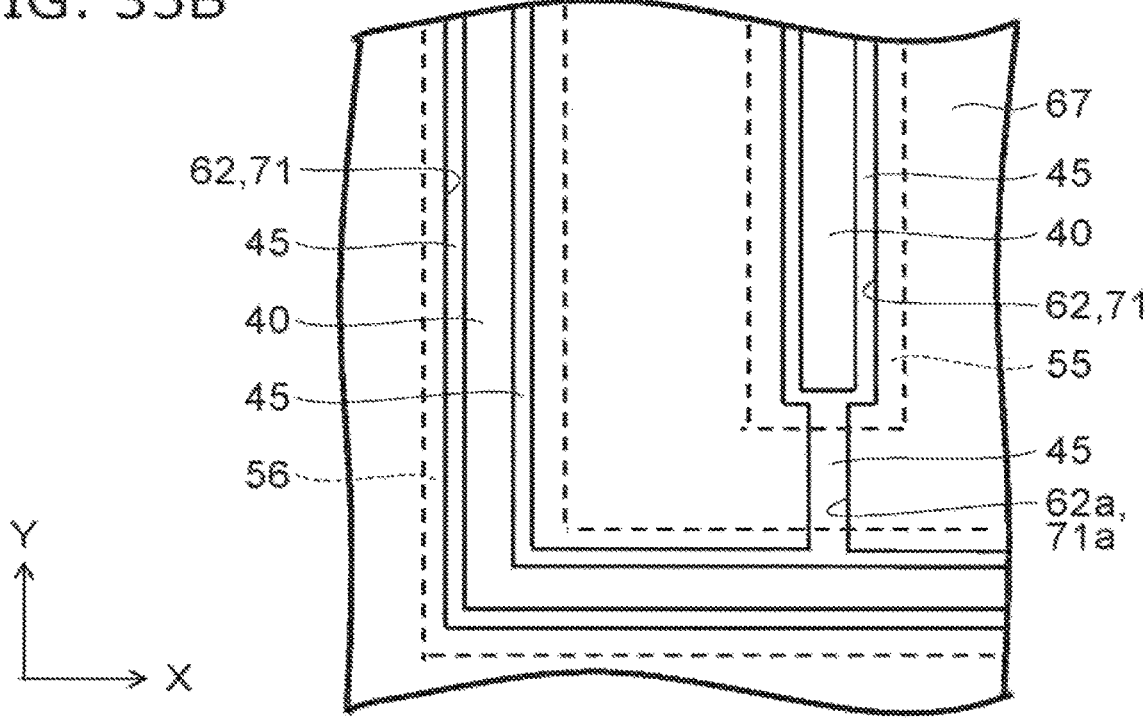

FIGS. 35A and 35B are plan views illustrating the method for manufacturing the semiconductor memory device according to the specific example.

As shown in FIG. 35A, in the specific example, in the process shown in FIGS. 10A to 10C, when the slits 62 and 71 are formed in the stacked body 67, narrow sections 62a and 71a narrower than the other portions are provided. Consequently, as shown in FIG. 35B, in the process shown in FIGS. 13A to 13C, when the sidewall insulating films 45 are formed on the inner surfaces of the slits 62 and 71, the narrow sections 62a and 71a are closed by the sidewall insulating films 45. As a result, in a process for forming the $p^+$-type semiconductor portion 55 and the $n^+$-type semiconductor portion 56 in regions directly under the slits 71 by ion-injecting impurities, the impurities are not injected into regions directly under the narrow sections 62a and 71a. Therefore, both of the $p^+$-type semiconductor portion 55 and the $n^+$-type semiconductor portion 56 are not formed.

In a process for embedding a metal material in the slits 62 and 71 to form the source interconnection members 40, since the metal material is not embedded in the narrow sections 62a and 71a, the source interconnection members 40 are not formed. Therefore, the p⁺-type semiconductor portion 55 and the n⁺-type semiconductor portion 56 formed in regions directly under both side portions of the narrow section 71a in the slit 71 are not connected to each other via the source interconnection members 40 in the narrow sections 62a and 71a. In this way, it is possible to space the p⁺-type semiconductor portion 55 and the n⁺-type semiconductor portion 56 from each other and insulate the p⁺-type semiconductor portion 55 and the n⁺-type semiconductor portion 56 from each other. Manufacturing methods other than those described above in the specific example is the same as those in the first embodiment.

Second Specific Example of the Ninth Embodiment

A second specific example of the ninth embodiment is described.

The specific example is an example of the method for manufacturing the semiconductor memory device according to the ninth embodiment.

Figure 36A:
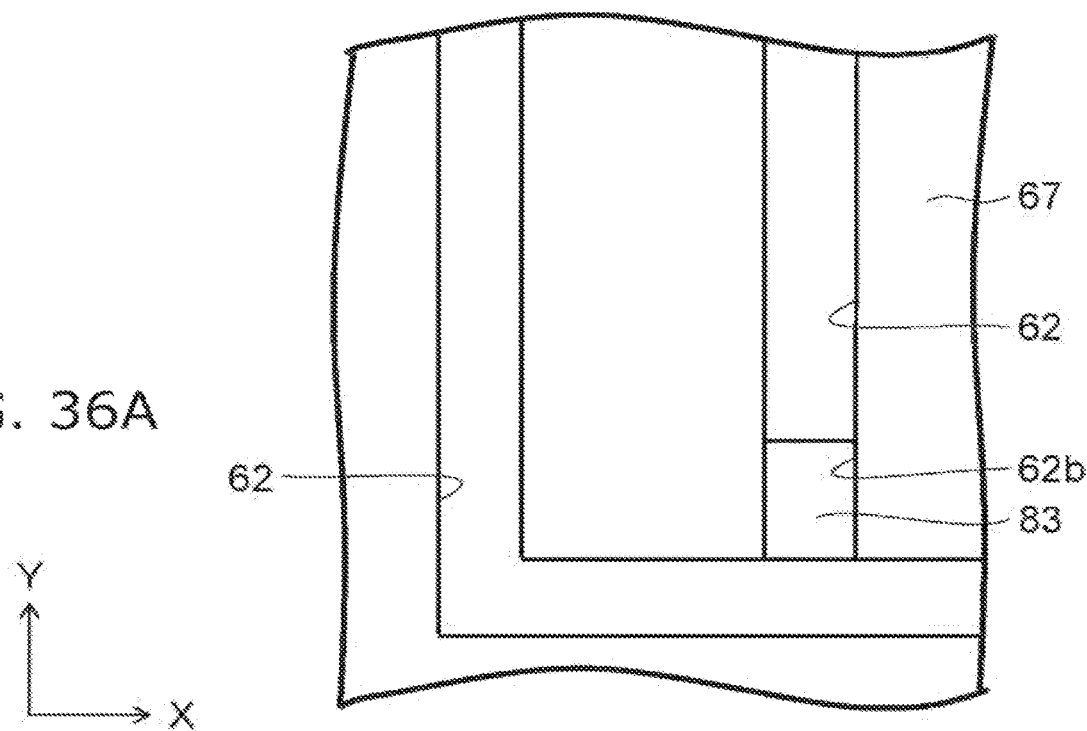
FIGS. 36A and 36B are plan views illustrating a method for manufacturing a semiconductor memory device according to a second specific example of the ninth embodiment.
Figure 36B:
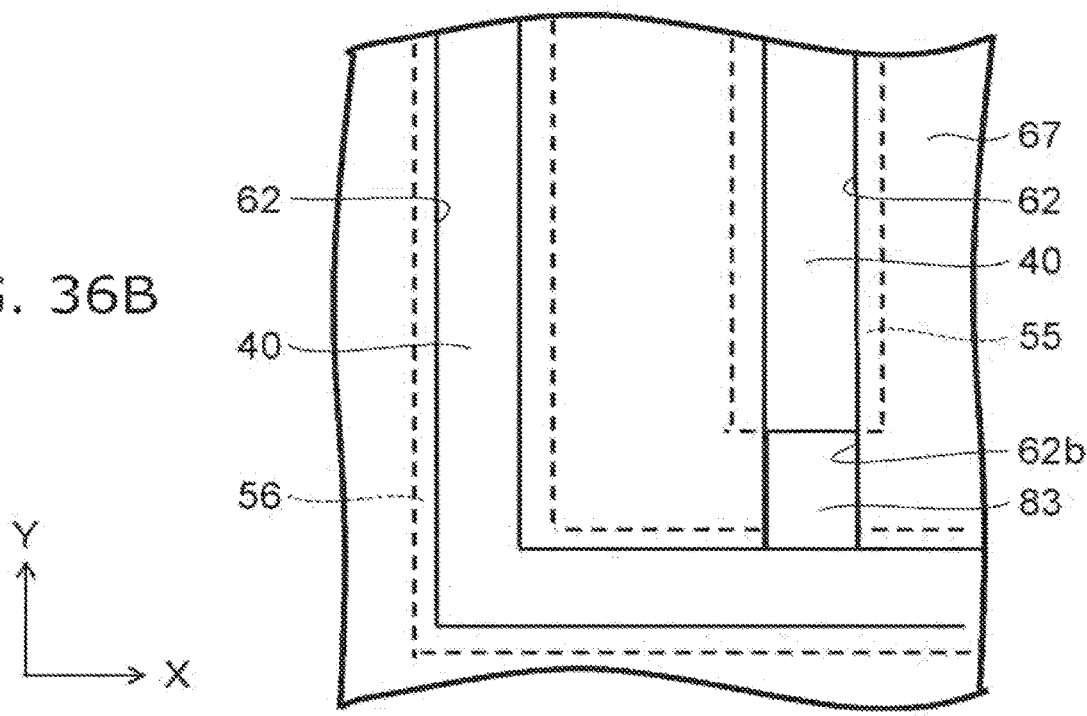

FIGS. 36A and 36B are plan views illustrating the method for manufacturing the semiconductor memory device according to the specific example.

As shown in FIG. 36A, in the specific example, in the process shown in FIGS. 6A to 6C, when the sacrificial members 63 are embedded in the slits 62, an insulating material 83 having a high etching selection ratio with respect to the sacrificial members 63 is embedded in a portion 62b of the slit 62. For example, when the sacrificial members 63 are a silicon nitride, the insulating material 83 is a silicon oxide. Consequently, in the process shown in FIGS. 11A to 11C, when the sacrificial members 63 are removed, it is possible to leave the insulating material 83. As a result, impurities are not injected into a region directly under the portion 62b. The source interconnection member 40 is not formed in the portion 62b. According to the specific example, the semiconductor memory device 9 according to the ninth embodiment can be manufactured. Manufacturing methods other than those in the specific example are the same as those in the first embodiment.

According to the embodiments described above, it is possible to realize a semiconductor memory device that has satisfactory characteristics and is easily manufactured and a method for manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A non-volatile memory device comprising: a substrate; an insulation film provided above the substrate; a first conductive layer provided above the insulation film; an upper interconnect structure including a first interconnection; electrodes provided between the first conductive layer and the upper interconnect structure, the electrodes being arranged in a first direction perpendicular to the first conductive layer to constitute a stacked body and functioning control gates for memory cells; at least one semiconductor body extending through the electrodes in the first direction and having a circular shape in a cross section orthogonal to the first direction, one end of the semiconductor body being electrically connected to the first conductive layer, and the other end of the semiconductor body being electrically connected to the first interconnection; and a conductive body extending through the electrodes in the first direction and in a second direction orthogonal to the first direction between the first conductive layer and the upper interconnect structure, the conductive body including a metal portion and being electrically connected to the first conductive layer, an outer diameter of the circular shape semiconductor body being smaller than a width of the metal portion of the conductive body at a same level in the first direction, the width being along a third direction orthogonal to the first direction and the second direction.

2. The device according to claim 1,
wherein the metal portion contains tungsten.

3. The device according to claim 1,
wherein the metal portion is positioned at a same level in the first direction as the stacked body of the electrodes.

4. The device according to claim 1,
wherein each of the electrodes extends in the second direction.

5. The device according to claim 4,
wherein the first interconnection extends in the third direction.

6. The device according to claim 1,
wherein each of the electrodes is a polycrystalline silicon film or a metal film.

7. The device according to claim 1,
wherein the first conductive layer functions a source layer.

8. The device according to claim 1,
wherein the first conductive layer includes a polycrystalline silicon film.

9. The device according to claim 1,
wherein the upper interconnect structure further includes a second interconnection and the conductive body electrically connects the first conductive layer and the second interconnection.

10. The device according to claim 1,
wherein the conductive body divides the stacked body of the electrodes into plural portions in the third direction.

11. The device according to claim 1, further comprising:
a metal plug provided between the other end of the semiconductor body and the first interconnection.

12. A non-volatile memory device comprising:
a substrate;
an insulation film provided above the substrate;
a first conductive layer provided above the insulation film;
an upper interconnect structure including a first interconnection;
electrodes provided between the first conductive layer and the upper interconnect structure, the electrodes being arranged in a first direction perpendicular to the first conductive layer to constitute a stacked body and functioning control gates for memory cells;
at least one semiconductor body extending through the electrodes in the first direction, one end of the semiconductor body being electrically connected to the first conductive layer, and the other end of the semiconductor body being electrically connected to the first interconnection; and
a conductive body electrically connected to the first conductive layer, the conductive body extending in the first direction between the first conductive layer and the upper interconnect structure and including a metal portion embedded in a slit extending in a second direction orthogonal to the first direction, the slit dividing the stacked body into plural portions in a third direction orthogonal to the first direction and the second direction.

13. The device according to claim 12, wherein the metal portion contains tungsten.

14. The device according to claim 12, wherein the metal portion is positioned at a same level in the first direction as the stacked body of the electrodes.

15. The device according to claim 12, wherein each of the electrodes extends in the second direction.

16. The device according to claim 15, wherein the first interconnection extends in the third direction.

17. The device according to claim 12, wherein each of the electrodes is a polycrystalline silicon film or a metal film.

18. The device according to claim 12, wherein the first conductive layer functions a source layer.

19. The device according to claim 12, wherein the first conductive layer includes a polycrystalline silicon film.

20. The device according to claim 12, wherein the semiconductor body has a circular shape in a cross section orthogonal to the first direction and an outer diameter of the circular shape semiconductor body is smaller than a width of the metal portion of the conductive body at a same level in the first direction, the width being along the third direction.

* * * * *